United States Patent
Kim et al.

(10) Patent No.: US 9,525,142 B2
(45) Date of Patent: Dec. 20, 2016

(54) COMPOUND AND ORGANIC LIGHT-EMITTING DEVICE COMPRISING THE SAME

(71) Applicants: SAMSUNG DISPLAY CO., LTD., Yongin, Gyeonggi-Do (KR); PUSAN NATIONAL UNIVERSITY INDUSTRY-UNIVERSITY COOPERATION FOUNDATION, Busan (KR)

(72) Inventors: Jae-Hong Kim, Yongin (KR); Myeong-Suk Kim, Yongin (KR); Soung-Wook Kim, Yongin (KR); Hong-Suk Suh, Geumjeong-gu (KR); Jun-Kuk Kim, Gimhae-si (KR); Sam-Il Kho, Yongin (KR)

(73) Assignees: PUSAN NATIONAL UNIVERSITY INDUSTRY-UNIVERSITY COOPERATION FOUNDATION, Busan (KR); SAMSUNG DISPLAY CO., LTD., Yongin (KR)

( * ) Notice: Subject to any disclaimer, the term of this patent is extended or adjusted under 35 U.S.C. 154(b) by 618 days.

(21) Appl. No.: 14/019,501

(22) Filed: Sep. 5, 2013

(65) Prior Publication Data
US 2014/0326959 A1 Nov. 6, 2014

(30) Foreign Application Priority Data
May 3, 2013 (KR) .......................... 10-2013-0050099

(51) Int. Cl.
*H01L 51/50* (2006.01)
*H01L 51/00* (2006.01)

(52) U.S. Cl.
CPC ....... *H01L 51/0061* (2013.01); *H01L 51/0072* (2013.01); *H01L 51/5012* (2013.01); *H01L 51/5016* (2013.01)

(58) Field of Classification Search
CPC .... H01L 51/50; H01L 51/0061; H01L 51/006; H01L 51/5012; H01L 51/5056; H01L 51/5072; H01L 51/5088; H01L 51/5092; H01L 51/5296
USPC ........... 252/301.16, 301.27; 257/40; 544/341
See application file for complete search history.

(56) References Cited

U.S. PATENT DOCUMENTS

| | | | | |
|---|---|---|---|---|
| 2,123,246 | A * | 7/1938 | Koeberle | C09B 5/16 44/312 |
| 9,337,358 | B2 * | 5/2016 | Byrne | C08G 61/123 |
| 9,365,679 | B2 * | 6/2016 | Zhou | C09K 11/06 |
| 9,376,529 | B2 * | 6/2016 | Brown | C07D 285/14 |
| 2007/0020485 | A1 | 1/2007 | Kita et al. | |
| 2012/0097925 | A1 | 4/2012 | Kim et al. | |
| 2014/0034879 | A1 * | 2/2014 | Pflumm | C07D 471/22 252/500 |
| 2014/0084220 | A1 * | 3/2014 | Inagaki | H01L 51/0036 252/511 |
| 2015/0295186 | A1 * | 10/2015 | Parham | C07D 471/06 257/40 |
| 2015/0295199 | A1 * | 10/2015 | Yamamoto | H01L 51/5036 257/40 |
| 2015/0340613 | A1 * | 11/2015 | Parham | C07D 209/86 252/500 |
| 2016/0194439 | A1 * | 7/2016 | Qin | C08G 61/126 252/501.1 |

FOREIGN PATENT DOCUMENTS

| | | |
|---|---|---|
| JP | 02-134644 | 5/1990 |
| KR | 10-2012-0043622 | 5/2012 |

* cited by examiner

*Primary Examiner* — Douglas McGinty
(74) *Attorney, Agent, or Firm* — Lewis Roca Rothgerber Christie LLP

(57) ABSTRACT

Provided are a compound of Formula 1 and an organic light-emitting device including the compound.

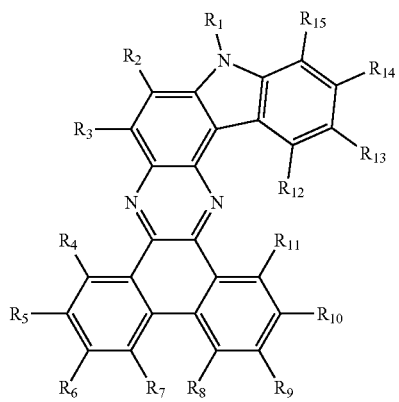

Formula 1

Descriptions of substituents of the Formula 1 are referred to in the detailed description.

20 Claims, 1 Drawing Sheet

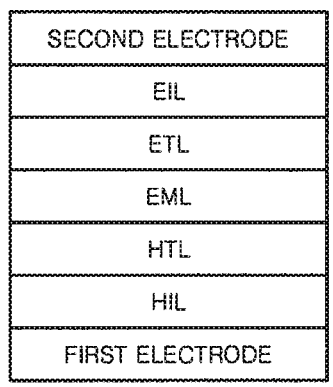

COMPOUND AND ORGANIC LIGHT-EMITTING DEVICE COMPRISING THE SAME

CROSS-REFERENCE TO RELATED APPLICATION

This application claims priority to and the benefit of Korean Patent Application No. 10-2013-0050099, filed on May 3, 2013, in the Korean Intellectual Property Office, the entire content of which is incorporated herein by reference.

BACKGROUND

1. Field

The present invention relates to a compound and an organic light-emitting device including the compound.

2. Description of the Related Art

Organic light-emitting devices (OLEDs), which are self-emitting devices, have advantages such as wide viewing angles, excellent contrast (e.g high contrast), quick response, high brightness, and excellent driving voltage characteristics (e.g. low driving voltage), and an ability to provide multi-colored images.

An exemplary OLED has a structure including a substrate, and an anode, a hole transport layer (HTL), an emission layer (EML), an electron transport layer (ETL), and a cathode which are sequentially stacked on the substrate. Herein, the HTL, the EML, and the ETL are organic thin films formed of organic compounds.

An operating principle of an OLED having the above-described structure is as follows.

When a voltage is applied between the anode and the cathode, electron holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more embodiments of the present invention are directed towards compounds that may be used as green and red color light-emitting materials capable of shifting wavelengths as long wavelengths, which also may be used as hole transport materials, electron transport materials, or doping materials, and organic light-emitting devices having good electrical properties including the compounds.

According to an embodiment of the present invention, a compound represented by Formula 1 is provided:

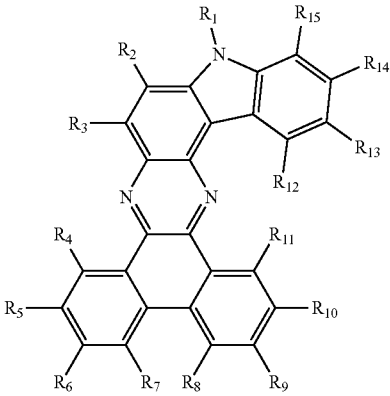

<Formula 1> in Formula 1, $R_1$ to $R_{15}$ are each independently selected from a hydrogen atom, a deuterium atom, a substituted or unsubstituted C1-C60 alkyl group, a substituted or unsubstituted C2-C60 alkenyl group, a substituted or unsubstituted C2-C60 alkynyl group, a substituted or unsubstituted C3-C60 cycloalkyl group, a substituted or unsubstituted C1-C60 alkoxy group, a substituted or unsubstituted C6-C60 aryloxy group, a substituted or unsubstituted C6-C60 arylthio group, a substituted or unsubstituted C6-C60 aryl group, an amino group substituted with a C1-C60 heteroaryl group, a substituted or unsubstituted C1-C60 heteroaryl group, a substituted or unsubstituted C6-C60 condensed polycyclic group, a halogen atom, a cyano group, a nitro group, a hydroxy group, and a carboxy group.

According to another embodiment of the present invention, an organic light-emitting device is provided. The organic light-emitting device may include a first electrode; a second electrode; and an organic layer between the first electrode and the second electrode, the organic layer including at least one compound selected from a group represented by Formula 1.

According to another embodiment of the present invention, a flat display device is provided. The flat display device may include the organic light-emitting device, the first electrode of the organic light-emitting device being electrically connected to a source electrode or a drain electrode of a thin film transistor.

BRIEF DESCRIPTION OF THE DRAWINGS

The accompanying drawings, together with the specification, illustrate embodiments of the present invention, and, together with the description, serve to explain the principles of the present invention.

The drawing is a schematic view of a structure of an organic light-emitting device according to an embodiment of the present invention.

DETAILED DESCRIPTION

In the following detailed description, only certain embodiments of the present invention are shown and described, by way of illustration. As those skilled in the art would recognize, the invention may be embodied in many different forms and should not be construed as being limited to the embodiments set forth herein.

As used herein, the term "and/or" includes any and all combinations of one or more of the associated listed items.

Expressions such as "at least one of," when preceding a list of elements, modify the entire list of elements and do not modify the individual elements of the list. Further, the use of "may" when describing embodiments of the present invention refers to one or more embodiments of the present invention.

Also, in the context of the present application, when a first element is referred to as being "on" a second element, it can be directly on the second element or be indirectly on the second element with one or more intervening elements interposed therebetween.

A compound according to an embodiment of the present invention is represented by Formula 1:

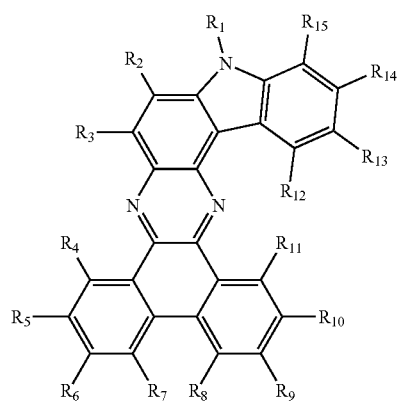

Formula 1 in Formula 1, $R_1$ to $R_{15}$ are each independently selected from a hydrogen atom, a deuterium atom, a substituted or unsubstituted C1-C60 alkyl group, a substituted or unsubstituted C2-C60 alkenyl group, a substituted or unsubstituted C2-C60 alkynyl group, a substituted or unsubstituted C3-C60 cycloalkyl group, a substituted or unsubstituted C1-C60 alkoxy group, a substituted or unsubstituted C6-C60 aryloxy group, a substituted or unsubstituted C6-C60 arylthio group, a substituted or unsubstituted C6-C60 aryl group, an amino group substituted with a C1-C60 heteroaryl group, a substituted or unsubstituted C1-C60 heteroaryl group, a substituted or unsubstituted C6-C60 condensed polycyclic group, a halogen atom, a cyano group, a nitro group, a hydroxy group, and a carboxy group.

An emission layer of an organic light-emitting device formed, according to some embodiments, as a single layer or as a plurality of layers between a positive electrode and a negative electrode, may display red, green, or blue color according to an organic compound included in the emission layer. In some embodiments, a compound having a structure, in which a carbazole is connected to green or red light-emitting material, is used. However, in the case of the carbazole derivatives, wavelengths may be difficult to shift as long wavelengths.

The compound according to an embodiment of the present invention may be used as green and/or red light-emitting materials capable of shifting wavelengths as long wavelengths. The compound may also be used as hole transport layer material, electron transport layer material, or a doping material.

The compound according to an embodiment of the present invention may have good hole injection and hole transport capabilities from a metal electrode or an organic layer, and good electron injection and electron transport capabilities from the metal electrode or the organic layer and thus, the compound may be used in an organic light-emitting device as a hole transport layer material, an electron transport layer material, or a doping material.

Substituents of the compound of Formula 1 above will be described in greater detail.

According to an embodiment of the present invention, in Formula 1, $R_1$ may be represented by any one of Formulae 2a to 2c:

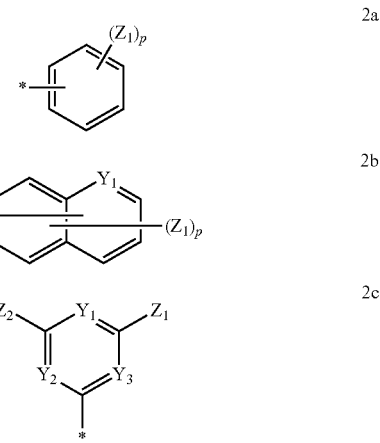

in Formulae 2a to 2c:

$Y_1$, $Y_2$, and $Y_3$ are each independently selected from CH, $CR_{21}$, and N;

$R_{21}$, $Z_1$, and $Z_2$ are each independently selected from a hydrogen atom, a deuterium atom, a substituted or unsubstituted C1-C20 alkyl group, a substituted or unsubstituted C6-C20 aryl group, a substituted or unsubstituted C2-C20 heteroaryl group, a substituted or unsubstituted C6-C20 condensed polycyclic group, and an amine group substituted with at least one selected from a C2-C20 heteroaryl group, a halogen group, a cyano group, a nitro group, a hydroxy group, and a carboxy group;

p is an integer from 1 to 6; and

* represents a binding site.

According to another embodiment of the present invention, in Formula 1, $R_6$ and $R_9$ may be each independently a compound represented by Formula 3a:

3a in Formula 3a, $Z_1$ and $Z_2$ are each independently selected from a substituted or unsubstituted C6-C20 aryl group, a substituted or unsubstituted C2-C20 heteroaryl group, and a substituted or unsubstituted C6-C20 condensed polycyclic group.

According to another embodiment of the present invention, in Formula 1, $R_{13}$ and $R_{14}$ may be each independently selected from a group represented by Formulae 4a to 4c:

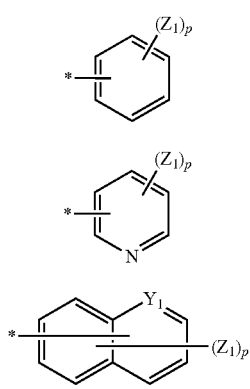

in Formulae 4a to 4c:

$Y_1$ is CH or N;

$Z_1$ is selected from a hydrogen atom, a deuterium atom, a substituted or unsubstituted C1-C20 alkyl group, a substituted or unsubstituted C6-C20 aryl group, a substituted or unsubstituted C2-C20 heteroaryl group, or a substituted or unsubstituted C6-C20 condensed polycyclic group;

p is an integer from 1 to 6; and

* represents a binding site.

According to another embodiment of the present invention, in Formula 1, $R_2$ to $R_5$, $R_7$, $R_8$, $R_{10}$ to $R_{12}$, and $R_{15}$ may be each independently a hydrogen atom or a deuterium atom.

Hereinafter, representative substituents of the substituents used herein are described as follows (carbon numbers limiting the substituents are non-limiting and do not limit the properties of the substituents).

Non-limiting examples of the unsubstituted C1-C60 alkyl group as used herein include linear or branched C1-C60 alkyl groups, such as methyl, ethyl, propyl, isobutyl, sec-butyl, pentyl, iso-amyl, hexyl, heptyl, octyl, nonanyl, dodecyl or the like. Non-limiting examples of the substituted C1-C60 alkyl group, include the unsubstituted C1-C60 alkyl group described above in which at least one hydrogen atom is substituted with a deuterium atom, a halogen atom, a hydroxy group, a nitro group, a cyano group, an amino group, an amidino group, hydrazine, hydrazone, a carboxyl group or salts thereof, a sulfonic acid group or salts thereof, a phosphoric acid group or salts thereof, a C1-C10 alkyl group, a C1-C10 alkoxy group, a C2-C10 alkenyl group, a C2-C10 alkynyl group, a C6-C16 aryl group, or a C4-C16 heteroaryl group.

As used herein, the unsubstituted C2-C60 alkenyl group may refer to a hydrocarbon chain having at least one carbon-carbon double bond at one or more positions along a carbon chain of the unsubstituted C2-C60 alkyl group. For example, the unsubstituted C2-C60 alkenyl group may include a terminal alkene and/or an internal alkene. Non-limiting examples of the alkenyl group are ethenyl, propenyl, butenyl, and the like. The substituted C2-C60 alkenyl group may refer to the unsubstituted C2-C60 alkenyl group in which at least one hydrogen atom is substituted with one of those substituents described above in conjunction with the substituted C1-C60 alkyl group.

The unsubstituted C2-C60 alkynyl group may refer to a C2-C60 alkyl group having at least one carbon-carbon triple bond at one or more positions along a carbon chain of the unsubstituted C2-C60 alkynyl group. For example, the unsubstituted C2-C60 alkynyl group may include a terminal alkyne and/or an internal alkyne. Non-limiting examples of the unsubstituted C2-C60 alkynyl group are acetylene, propylene, phenyl acetylene, isopropyl acetylene, t-butyl acetylene, diphenyl acetylene and the like. The substituted C2-C60 alkynyl group may refer to the unsubstituted C2-C60 alkynyl group in which at least one hydrogen atom is substituted with one of those substituents described above in conjunction with the substituted C1-C60 alkyl group.

The unsubstituted C3-C60 cycloalkyl group may represent a ring form of a C3-C60 alkyl group. The substituted C3-C60 cycloalkyl group may refer to the unsubstituted C3-C60 cycloalkyl group in which at least one hydrogen atom is substituted with one of those substituents described above in conjunction with the substituted C1-C60 alkyl group.

The unsubstituted C1-C60 alkoxy group may refer to a group having a structure of —OA (where, A is the unsubstituted C1-C60 alkyl group as described above). Non-limiting examples of the alkoxy group are methoxy, ethoxy, propoxy, isopropyloxy, butoxy, pentoxy, and the like. The substituted C1-C60 alkoxy group may refer to the unsubstituted C1-C60 alkoxy group in which at least one hydrogen atom is substituted with one of those substituents described above in conjunction with the substituted C1-C60 alkyl group.

The unsubstituted C6-C60 aryl group may represent a carbocyclic aromatic system having at least one ring. When the unsubstituted C6-C60 aryl group has two or more rings, the two or more rings may be fused or connected to each other via a single bond. The term "aryl" as used herein may refer to aromatic systems such as phenyl, naphthyl, and anthracenyl. The substituted C6-C60 aryl group may refer to the unsubstituted C6-C60 aryl group in which at least one hydrogen atom is substituted with one of those substituents described above in conjunction with the substituted C1-C60 alkyl group.

Non-limiting examples of the substituted or unsubstituted C6-C60 aryl group include a phenyl group, a C1-C10 alkyl phenyl group (for example, an ethyl phenyl group), a halophenyl group (for example, an o-, m-, or p-fluorophenyl group and a dichlorophenyl group), a cyanophenyl group, a dicyanophenyl group, a trifluoromethoxy phenyl group, a biphenyl group, a halobiphenyl group, a cyanobiphenyl group, a C1-C10 alkyl biphenyl group, a C1-C10 alkoxy biphenyl group, an o-, m-, or p-tolyl group, an o-, m-, or p-cumenyl group, a mesityl group, a phenoxy phenyl group, an (α,α-dimethyl benzene) phenyl group, an (N,N'-dimethyl) amino phenyl group, an (N,N'-diphenyl) amino phenyl group, a pentalenyl group, an indenyl group, a naphthyl group, a halonaphthyl group (for example, a fluoronaphthyl group), a C1-C10 alkyl naphthyl group (for example, a methyl naphthyl group), a C1-C10 alkoxy naphthyl group (for example, a methoxy naphthyl group), a cyanonaphthyl group, an anthracenyl group, an azulenyl group, a heptalenyl group, an acenaphthylenyl group, a phenalenyl group, a fluorenyl group, an anthraquinolyl group, a methyl anthryl group, a phenanthryl group, a triphenylene group, a pyrenyl group, a chrysenyl group, an ethyl-chrysenyl group, a picenyl group, a perylenyl group, a chloropherylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, an ovalenyl group, or the like.

The unsubstituted C1-C60 heteroaryl group may include one or more heteroatoms selected from among N, O, P, and S. When the unsubstituted C1-C60 heteroaryl group has two or more rings, the two or more rings may be fused or connected to each other via a single bond. Non-limiting examples of the unsubstituted C1-C60 heteroaryl group include a pyrazolyl group, an imidazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a dibenzothiophene group, and the like. The substituted C1-C60 heteroaryl group may refer to the unsubstituted C1-C60 heteroaryl group in which at least one hydrogen atom is substituted with one of those substituents described above in conjunction with the substituted C1-C60 alkyl group.

The unsubstituted C6-C60 aryloxy group may refer to a group represented by —$OA_1$, where $A_1$ is the C6-C60 aryl group. Non-limiting examples of the unsubstituted C6-C60 aryloxy group include a phenoxy group and the like. The substituted C6-C60 aryloxy group may refer to the unsubstituted C6-C60 aryloxy group in which at least one hydrogen atom is substituted with one of those substituents described above in conjunction with the substituted C1-C60 alkyl group.

The unsubstituted C6-C60 arylthio group may refer to a group represented by —$SA_1$, where $A_1$ is the C6-C60 aryl group. Non-limiting examples of the arylthio group include a benzenethio group, a naphthyl thio group, and the like. The substituted C6-C60 arylthio group may refer to the unsubstituted C6-C60 arylthio group in which at least one hydrogen atom is substituted with one of those substituents described above in conjunction with the substituted C1-C60 alkyl group.

The unsubstituted C6-C60 condensed polycyclic group may refer to i) substituents including two or more rings in which at least one aromatic ring and at least one non-aromatic ring are fused to each other or ii) substituents including unsaturated groups in the ring but incapable of forming a conjugated structure. Thus, the unsubstituted C6-C60 condensed polycyclic group is distinct from the aryl group or the heteroaryl group as it has a non-aromatic component. The substituted C6-C60 condensed polycyclic group may refer to the unsubstituted C6-C60 condensed polycyclic group in which at least one hydrogen atom is substituted with one of those substituents described above in conjunction with the substituted C1-C60 alkyl group.

The condensed polycyclic group, as described above, may include N, O, or S in at least one of the rings, with carbon atoms as the remaining ring atoms. At least one hydrogen atom of the condensed polycyclic group including N, O, or S may be substituted with one of those substituents described above in conjunction with the substituted C1-C60 alkyl group.

The following compounds 1 to 52 may be examples of compounds represented by Formula 1, but the compounds are not limited thereto.

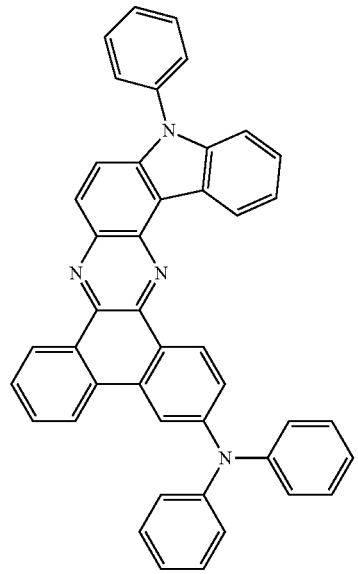

1

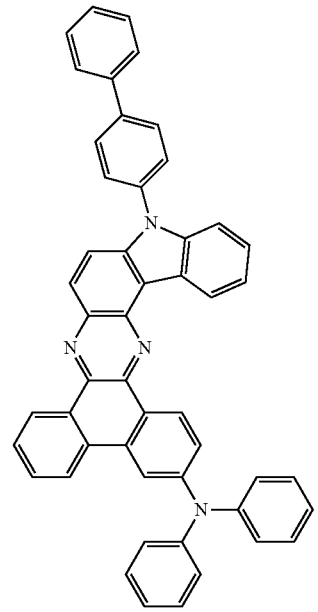

2

3
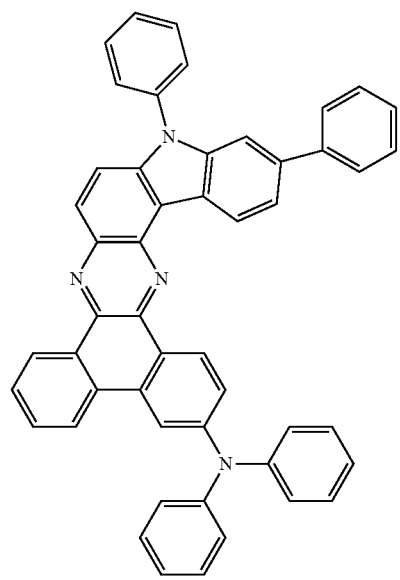
5
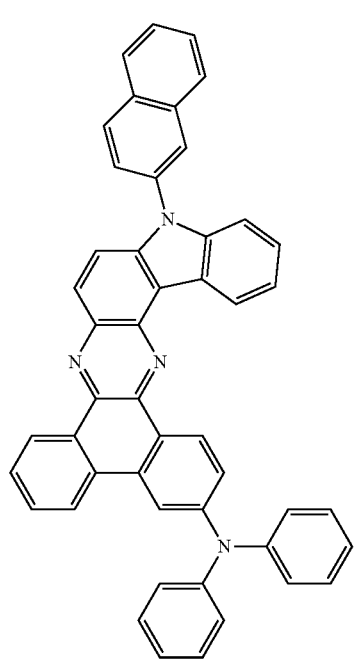
4
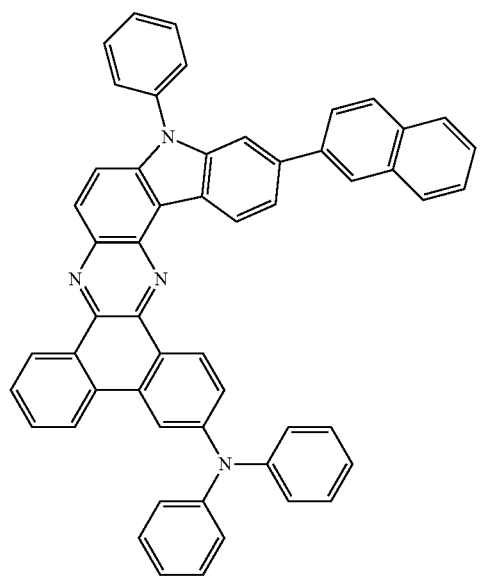
6
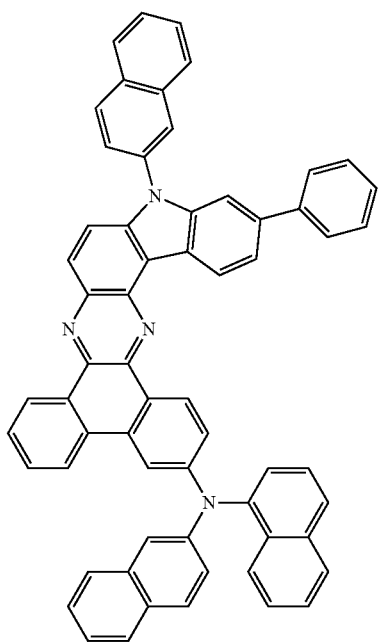

7
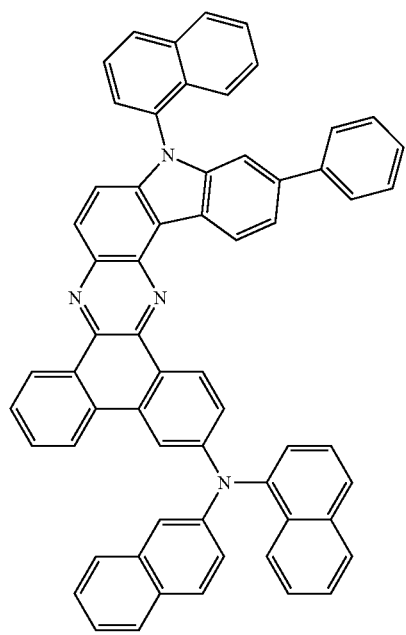
8
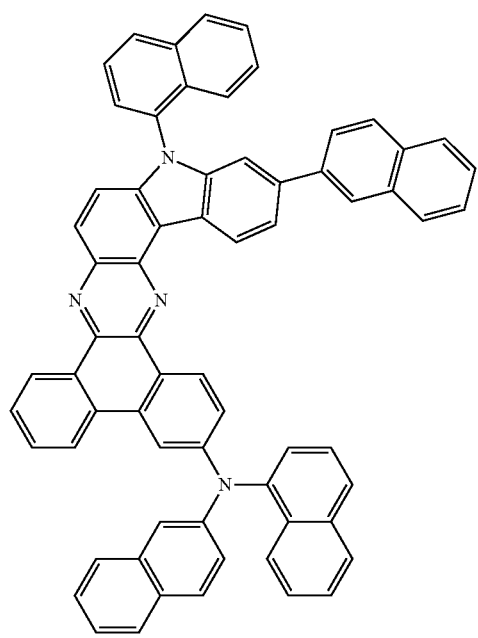
9
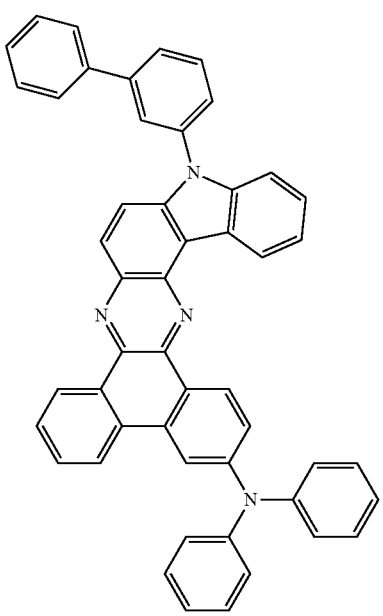
10
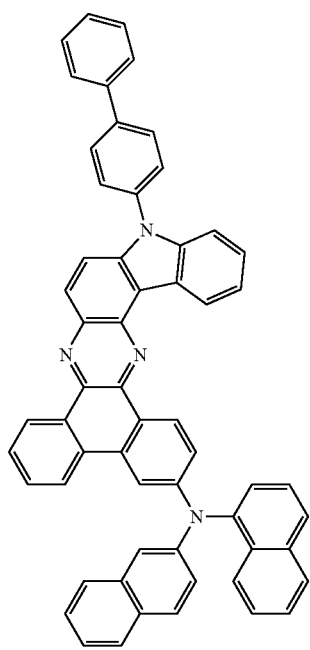

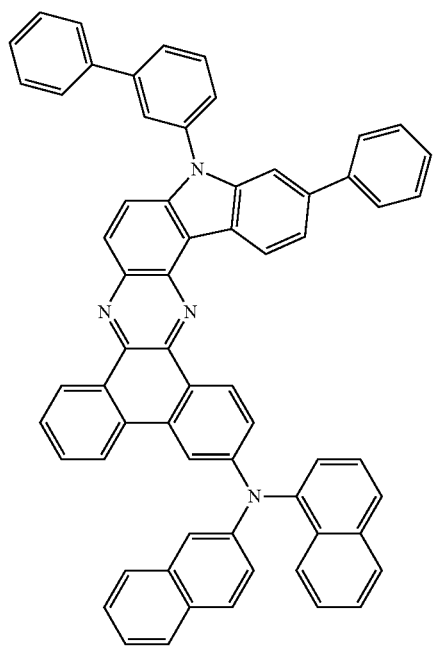
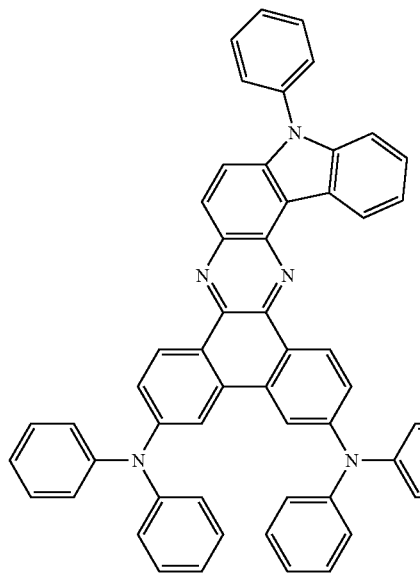
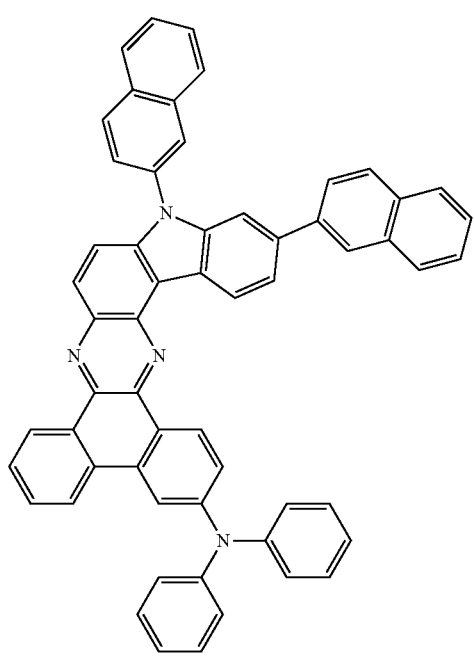
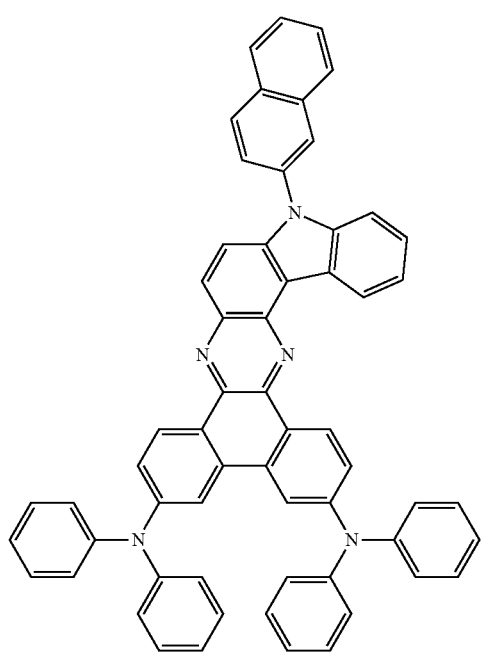

15
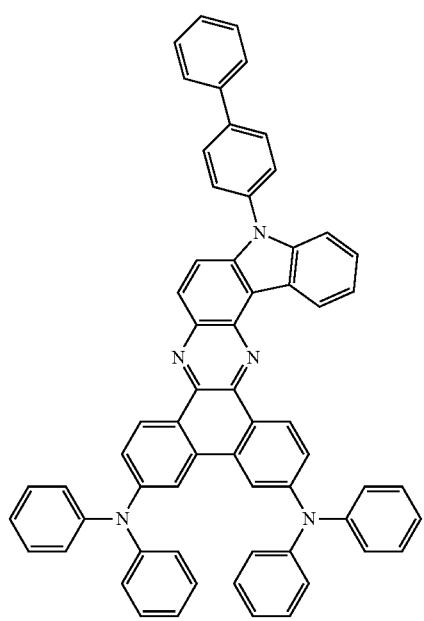
16
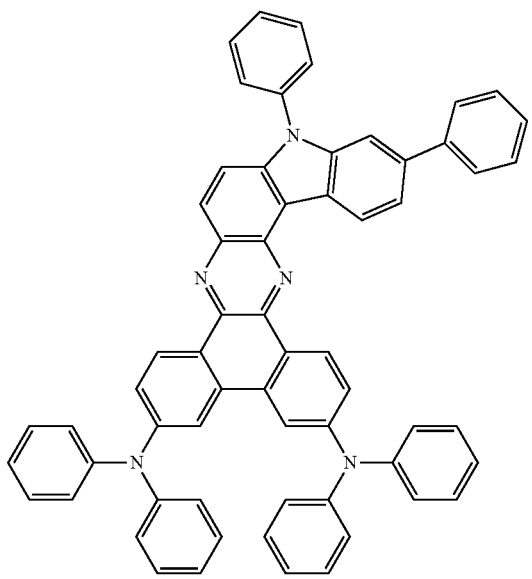
17
18
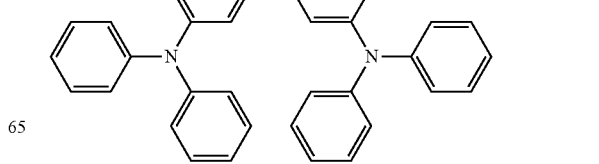

19
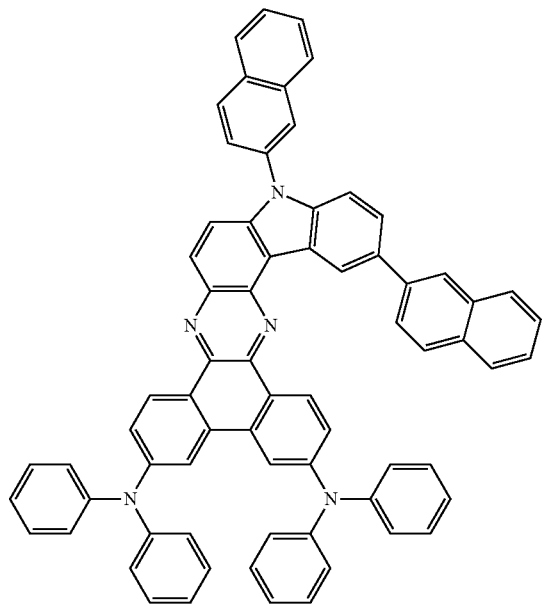
20
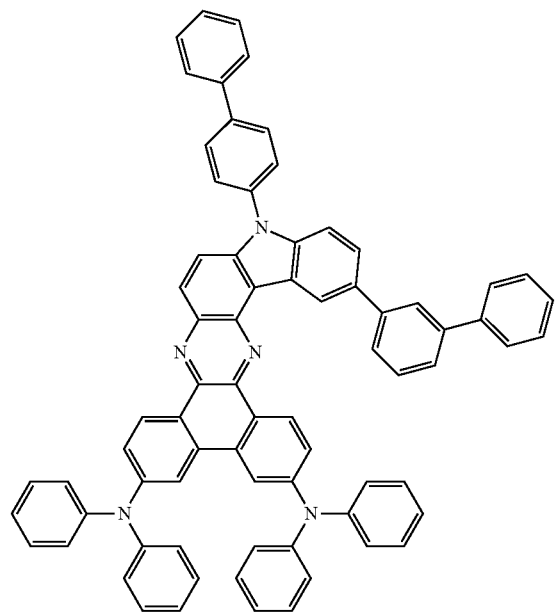
21
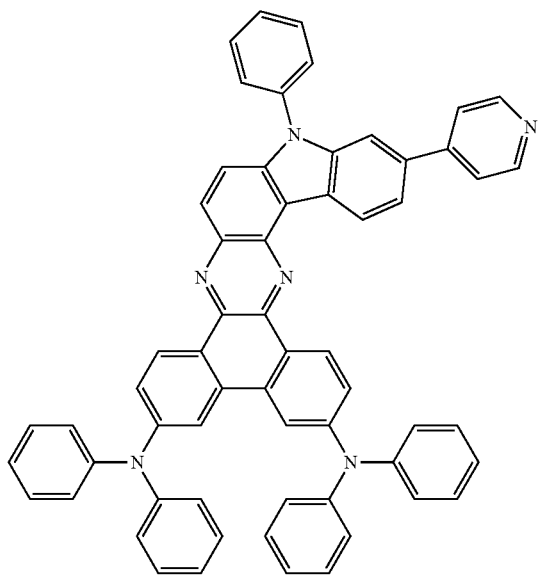
22
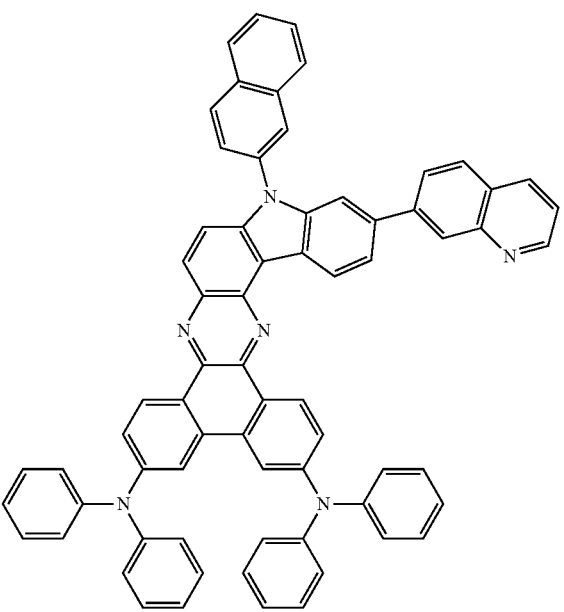

23
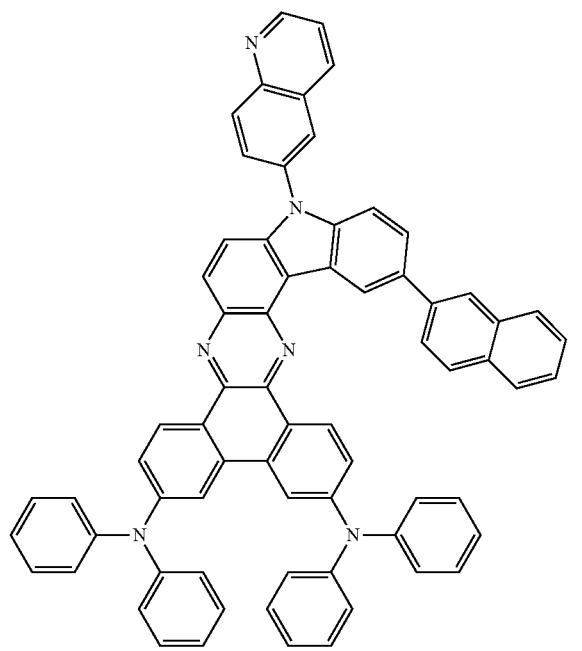
24
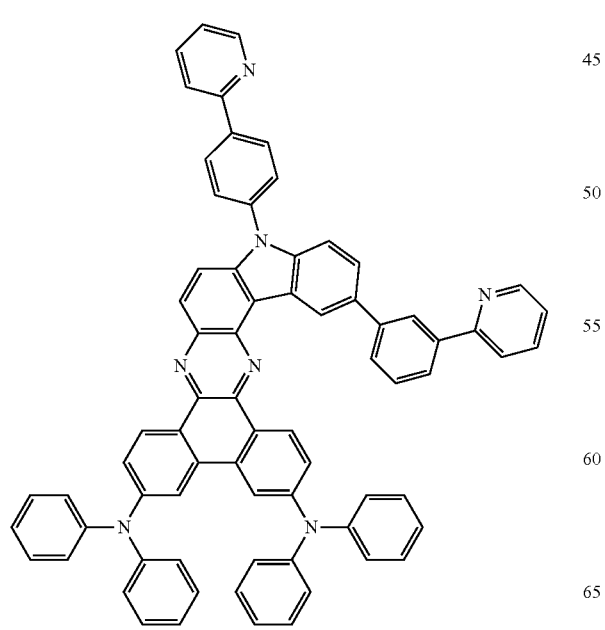
25
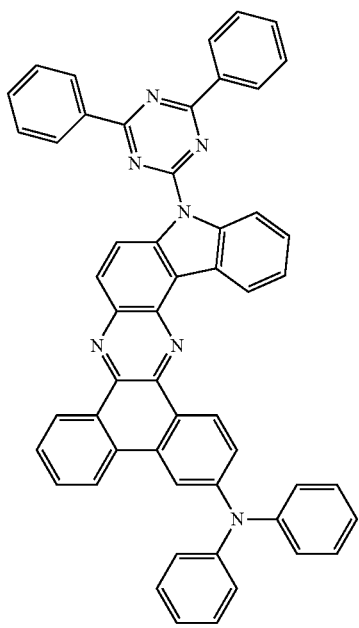
26
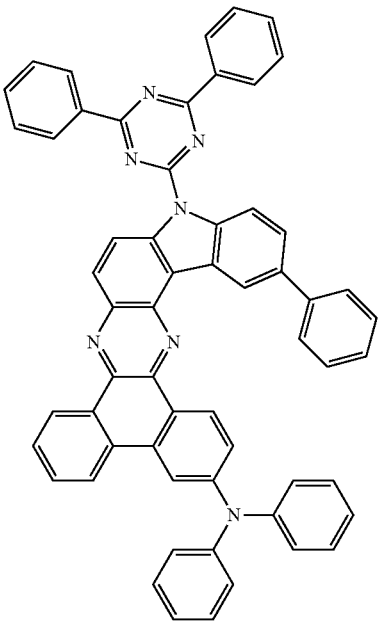

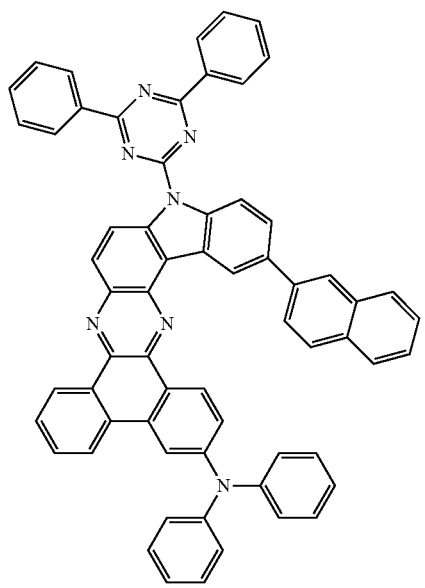
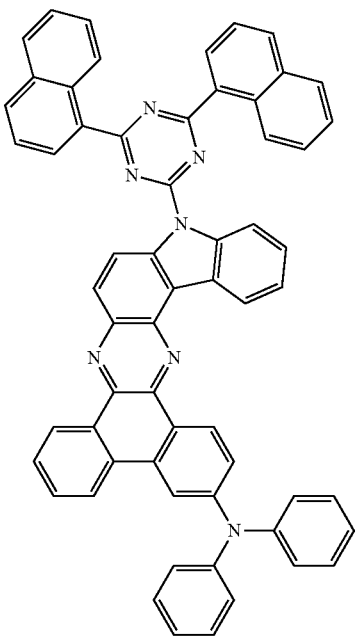

31
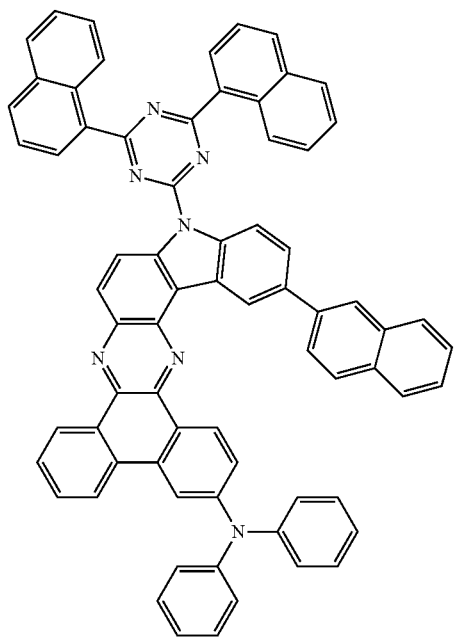
32
33
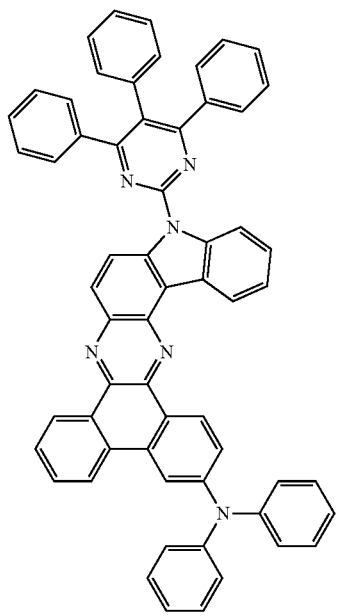
34

35
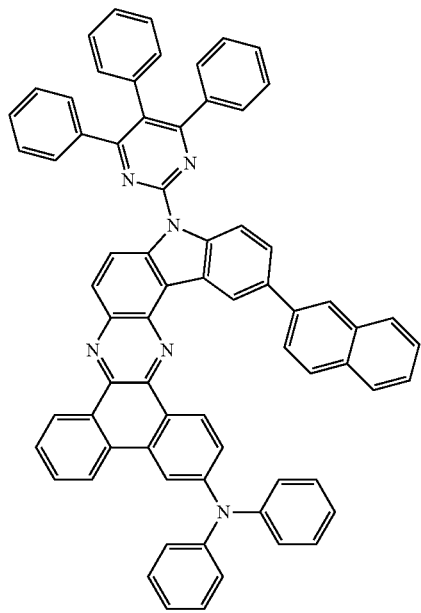
36
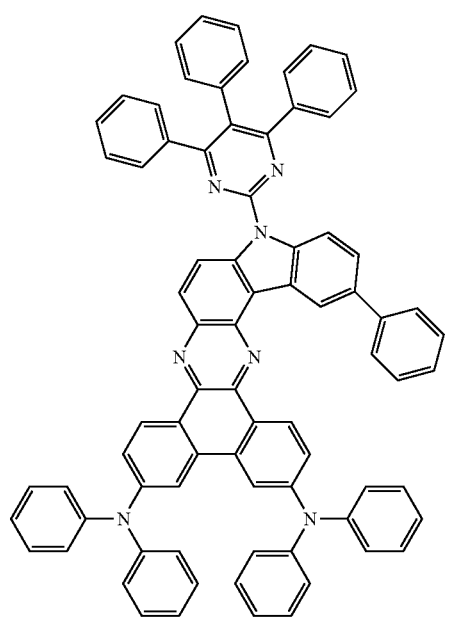
37
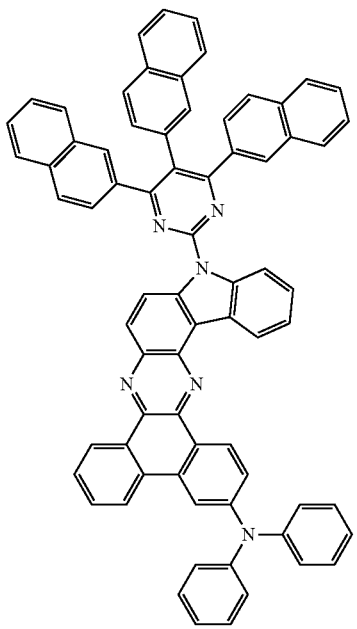
38
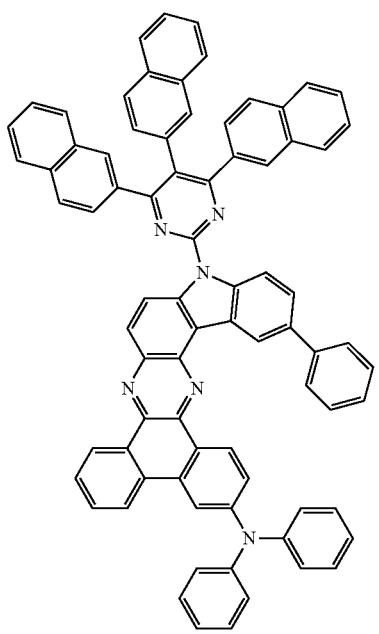

39
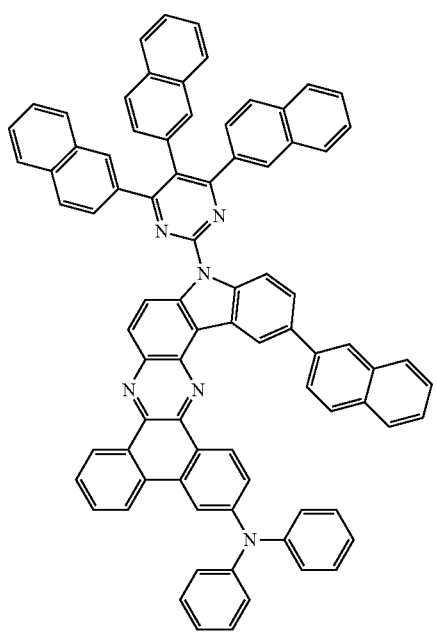
40
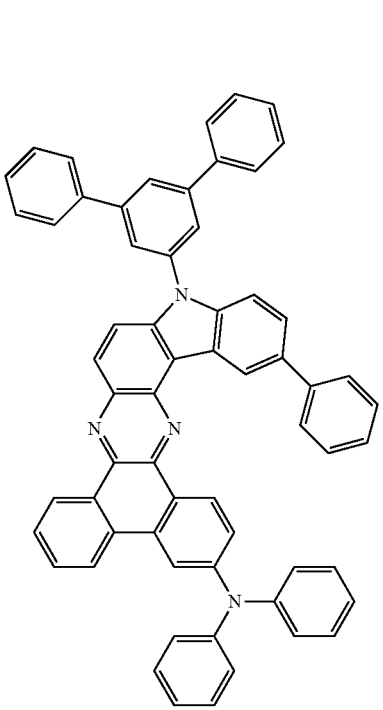
41
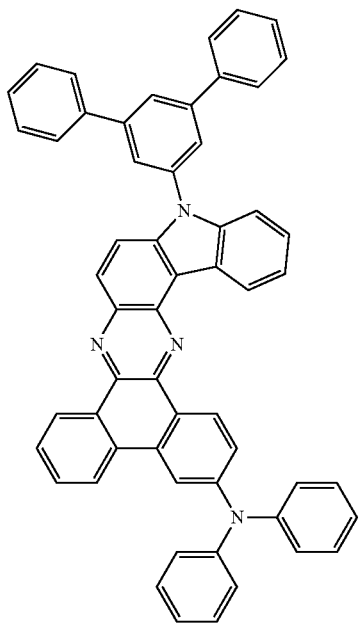
42

43
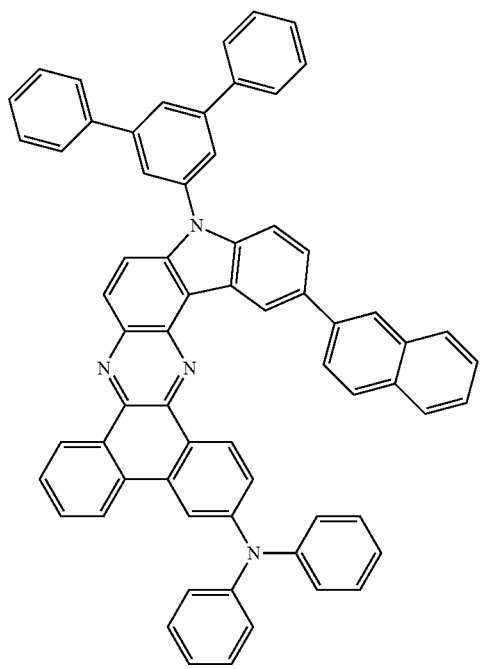
45
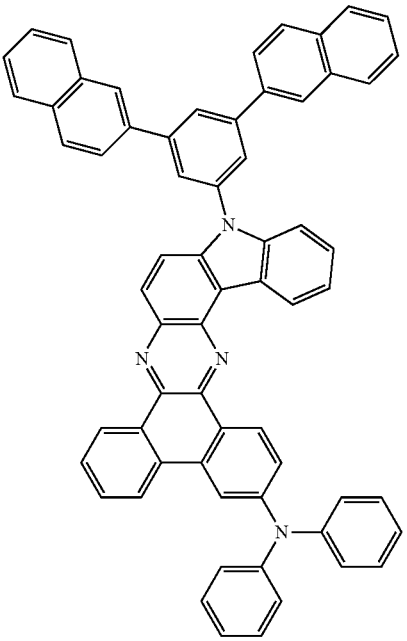
44
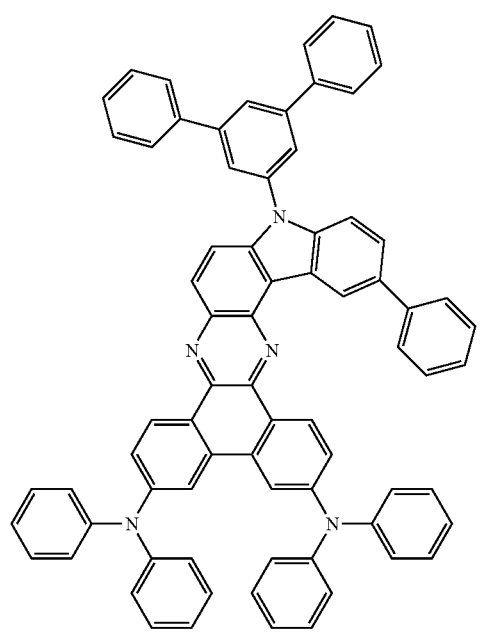
46
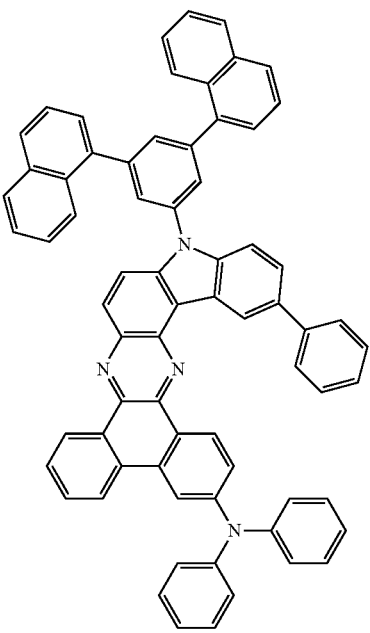

47
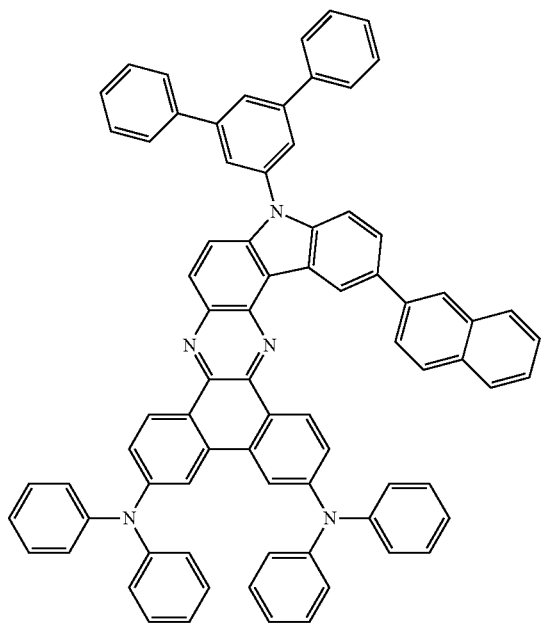
48
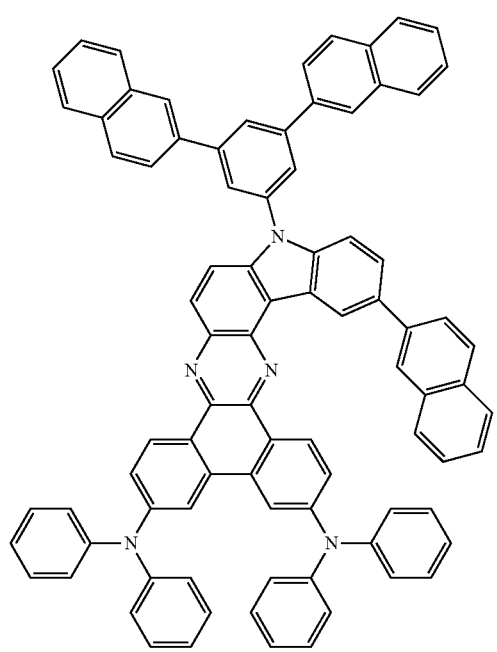
49
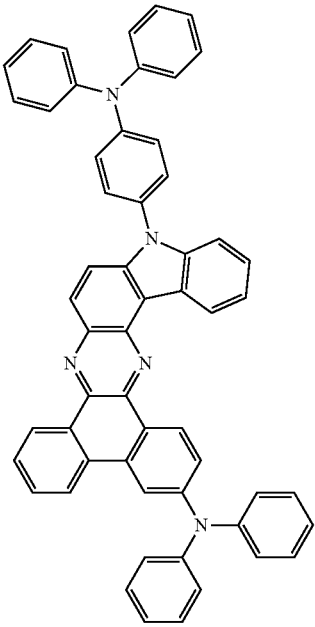
50
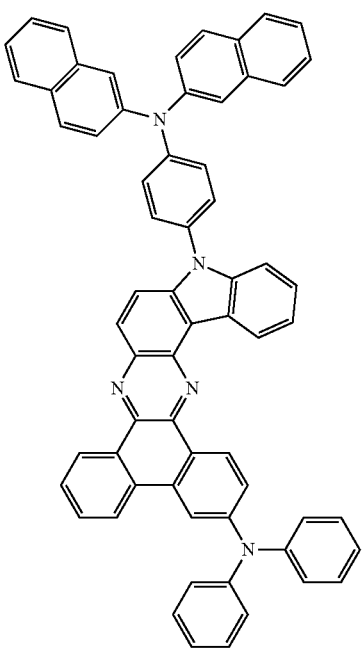

-continued

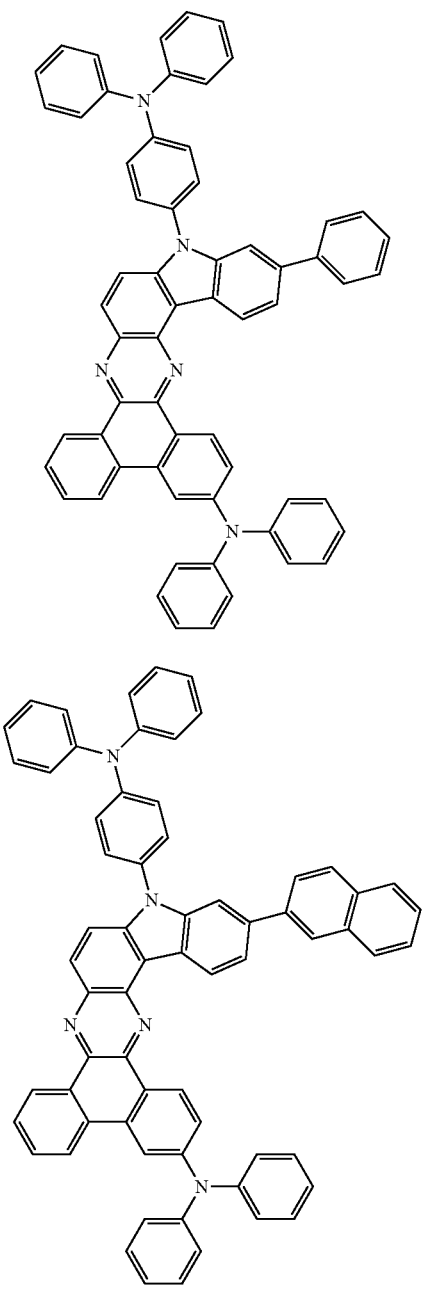

51

52

An organic light-emitting device according to an embodiment of the present invention includes a first electrode; a second electrode; an organic layer between the first electrode and the second electrode, the organic layer including a compound represented by Formula 1.

The organic layer may include at least one layer selected from a hole injection layer, a hole transport layer, a functional layer having both hole injection and hole transport capabilities (hereinafter, a "H-functional layer"), a buffer layer, an electron blocking layer, an emission layer, a hole blocking layer, an electron transport layer, an electron injection layer, and a functional layer having both electron injection and electron transport capabilities (hereinafter, an "E-functional layer").

In one embodiment, the organic layer may be the emission layer, the electron injection layer, the electron transport layer, and/or the E-functional layer.

According to an embodiment of the present invention, the organic light-emitting device includes i) an electron injection layer and an electron transport layer, or an E-functional layer, and ii) a hole injection layer and a hole transport layer, or a H-functional layer. The electron injection layer, the electron transport layer, and/or the E-functional layer may include a compound having both electron injection and/or electron transport capabilities, according to an embodiment of the present invention. In some embodiments, the organic light-emitting device includes an emission layer including at least one compound according to an embodiment of the present invention, an anthracene-based compound, an arylamine-based compound, and a styryl-based compound.

According to another embodiment of the present invention, the organic light-emitting device includes an electron injection layer, an electron transport layer, an emission layer, a hole injection layer, a hole transport layer, or a H-functional layer, wherein any one layer of a red layer, a green layer, a blue layer, and a white layer of the emission layer may include a phosphorescent compound, and the hole injection layer, the hole transport layer, or the H-functional layer may include charge generating materials. The charge generating material, according to some embodiments, is a p-dopant and the p-dopant may be a quinone derivative, a metal oxide, or a cyano group containing compound.

According to another embodiment of the present invention, the organic layer includes an electron transport layer, the electron transport layer including a compound according to an embodiment of the present invention and a metal complex. The metal complex may be a Li complex.

As used herein, the term "organic layer" may refer to a single layer and/or a plurality of layers positioned between the first electrode and the second electrode.

The drawing is a schematic view of a structure of an organic light-emitting device according to an embodiment of the present invention. Hereinafter, a structure and a method of manufacturing an organic light-emitting device according to an embodiment of the present invention will be described with reference to the drawing as follows.

The substrate (not shown) may be any substrate suitable for use in organic light-emitting devices. In some embodiments, the substrate may be a glass substrate or a transparent plastic substrate with strong mechanical strength, thermal stability, transparency, surface smoothness, ease of handling, and water resistance.

The first electrode may be formed by depositing or sputtering a first electrode-forming material onto a surface of the substrate. When the first electrode is an anode, a material having a high work function may be used as the first electrode-forming material to facilitate hole injection. The first electrode may be a reflective electrode or a transmission electrode. Transparent and conductive materials such as Indium Tin Oxide (ITO), Indium Zinc Oxide (IZO), $SnO_2$, and ZnO may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single layer or a plurality of layers including at least two layers. For example, the first electrode may have a three-layered structure of ITO/Ag/ITO, but is not limited thereto.

The organic layer may be located on the first electrode.

The organic layer may include at least one of a hole injection layer (HIL), a hole transport layer (HTL), a H-functional layer, a buffer layer (not shown), an emission layer (EML), an electron transport layer (ETL), and an electron injection layer (EIL).

The HIL may be formed on the first electrode by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature from about 100° C. to about 500° C., a pressure from about $10^{-8}$ torr to about $10^{-3}$ torr, and a deposition rate from about 0.01 Å/sec to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range from about 2000 rpm to about 5000 rpm, and a temperature at which heat treatment is performed to remove a solvent after coating may be in the range from about 80° C. to about 200° C. However, the coating conditions are not limited thereto.

The HIL may be formed of any material suitable for use in organic light-emitting devices. Non-limiting examples of the material that may be used to form the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris(3-methylphenylphenylamino)triphenylamine (m-MTDATA), N,N'-di(1-naphthyl group-N,N'-diphenylbenzidine (NPB), TDATA, 2-TNATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline)/poly(4-styrenesulfonate (PANI/PSS):

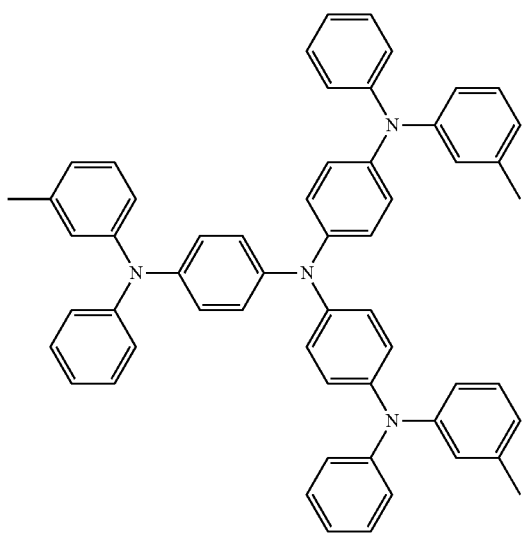

m-MTDATA

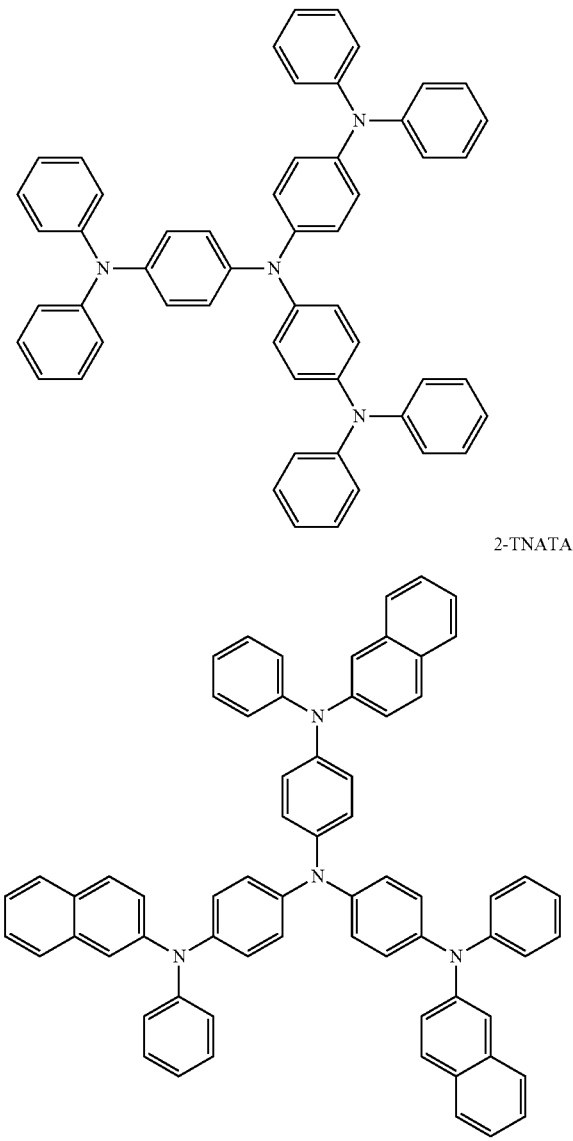

TDATA

2-TNATA

The thickness of the HIL may be from about 100 Å to about 10000 Å, and in some embodiments, may be from about 100 Å to about 1000 Å. When the thickness of the HIL is within these ranges, the HIL may have good hole injecting ability without a substantial increase in driving voltage.

The HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

Non-limiting examples of suitable HTL forming materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl-N, N'-diphenylbenzidine) (NPB).

TPD

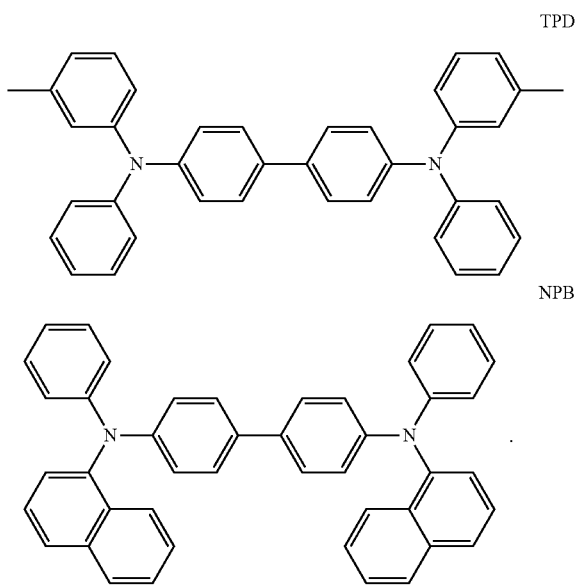

NPB

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10000 Å, and in some embodiments, may be from about 100 Å to about 1000 Å. When the thickness of the H-functional layer is within these ranges, the H-functional layer may have good hole injection and transport capabilities without a substantial increase in driving voltage.

At least one layer of the HIL, the HTL, and the H-functional layer may include at least one of compounds selected from a group represented by Formula 300 and Formula 350:

Formula 300

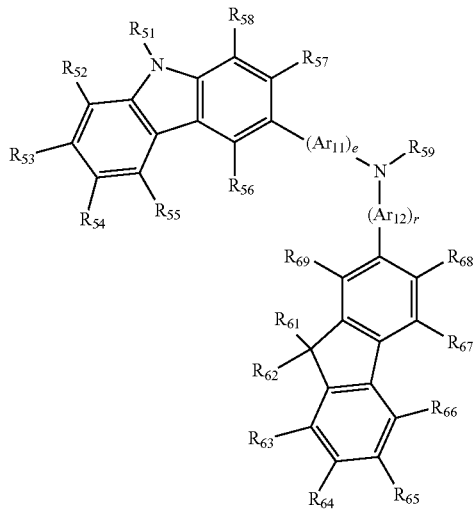

Formula 350

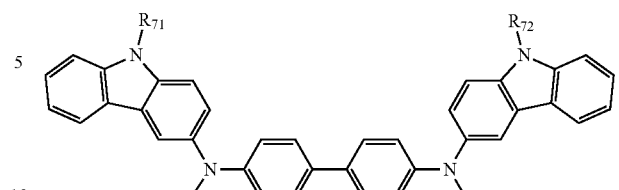

In Formulae 300 and 350, $Ar_{11}$, $Ar_{12}$, $Ar_{21}$, and $Ar_{22}$ are each independently a substituted or unsubstituted C5-C60 arylene group.

In Formula 300, e and f are each independently an integer from 0 to 5, for example 0, 1 or 2. In some embodiments, e may be 1 and f may be 0, but embodiments of the invention are not limited thereto.

In Formulae 300 and 350, $R_{51}$ to $R_{58}$, $R_{61}$ to $R_{69}$, $R_{71}$, and $R_{72}$ may be each independently selected from a hydrogen atom, a deuterium atom, a halogen atom, a hydroxyl group, a cyano group, a nitro group, an amino group, an amidino group, hydrazine, hydrazone, a carboxyl group or salts thereof, a sulfonic acid group or salts thereof, a phosphoric acid or salts thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C60 cycloalkyl group, a substituted or unsubstituted C5-C60 aryl group, a substituted or unsubstituted C5-C60 aryloxy group, or a substituted or unsubstituted C5-C60 arylthio group. In some embodiments, $R_{51}$ to $R_{58}$, $R_{61}$ to $R_{69}$, $R_{71}$, and $R_{72}$ are each independently selected from:

a hydrogen atom; a deuterium atom; a halogen atom; a hydroxyl group; a cyano group; a nitro group; an amino group; an amidino group; hydrazine; hydrazone; a carboxyl group or salts thereof; a sulfonic acid group or salts thereof; a phosphoric acid or salts thereof; a C1-C10 alkyl group (for example, a methyl group, an ethyl group, a propyl group, a butyl group, a pentyl group, a hexyl group, or the like); a C1-C10 alkoxy group (for example, a methoxy group, an ethoxy group, a propoxy group, a butoxy group, a pentoxy group, or the like);

a C1-C10 alkyl group and a C1-C10 alkoxy group, each substituted with at least one selected from a deuterium atom, a halogen atom, a hydroxyl group, a cyano group, a nitro group, an amino group, an amidino group, hydrazine, hydrazone, a carboxyl group or salts thereof, a sulfonic acid group or salts thereof, and a phosphoric acid or salts thereof;

a phenyl group; a naphthyl group; an anthryl group; a fluorenyl group; a pyrenyl group;

a phenyl group, a naphthyl group, an anthryl group, a fluorenyl group and a pyrenyl group, each substituted with at least one selected from a deuterium atom, a halogen atom, a hydroxyl group, a cyano group, a nitro group, an amino group, an amidino group, hydrazine, hydrazone, a carboxyl group or salts thereof, a sulfonic acid group or salts thereof, a phosphoric acid or salts thereof, a C1-C10 alkyl group, and a C1-C10 alkoxy group.

In Formula 300, $R_{59}$ may be selected from:
a phenyl group, a naphthyl group, an anthryl group, a biphenyl group, a pyridyl group, and
a phenyl group, a naphthyl group, an anthryl group, a biphenyl group, and a pyridyl group, each substituted with at least one selected from a deuterium atom, a halogen atom, a hydroxyl group, a cyano group, a nitro group, an amino group, an amidino group, hydrazine, hydrazone, a carboxyl group or salts thereof, a sulfonic acid group or salts thereof, a phosphoric acid or salts thereof, a substituted or unsubstituted C1-C20 alkyl group, and a substituted or unsubstituted C1-C20 alkoxy group.

According to an embodiment of the present invention, the compound represented by Formula 300 may be represented by Formula 300A, but embodiments of the invention are not limited thereto:

Formula 300A

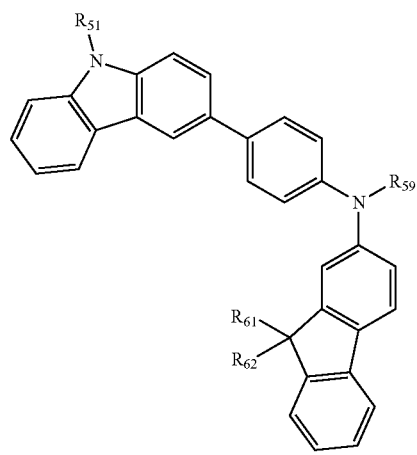

in Formula 300A, detailed descriptions of $R_{51}$, $R_{61}$, $R_{62}$ and $R_{59}$ are as described above.

In some embodiments, at least one layer of the hole injection layer, the hole transport layer, and the H-functional layer may include at least one of Compounds 301 to 320, but embodiments of the invention are not limited thereto:

301

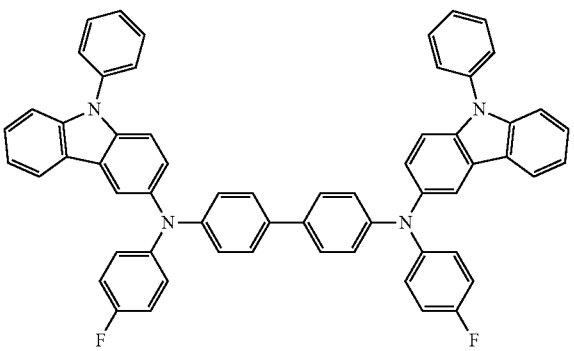

302

303

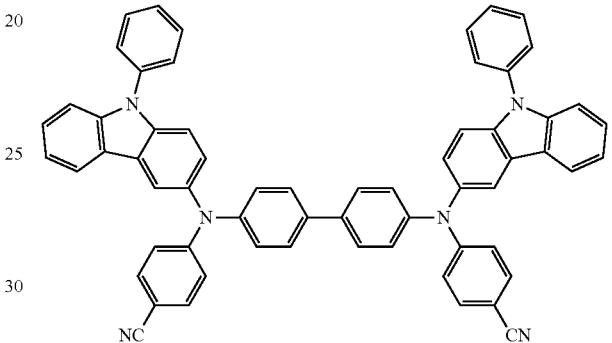

304

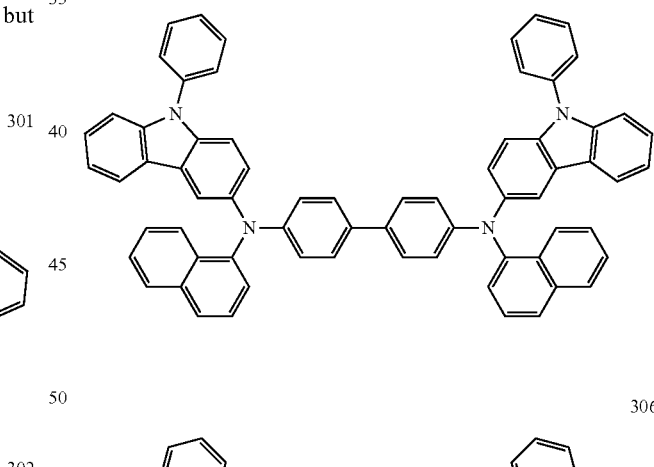

305

306

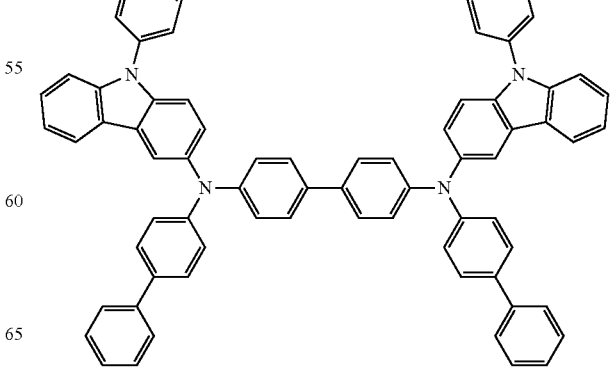

307
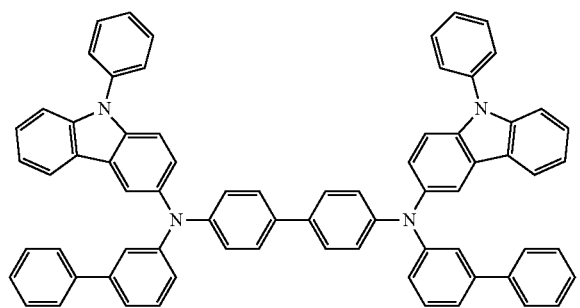
310
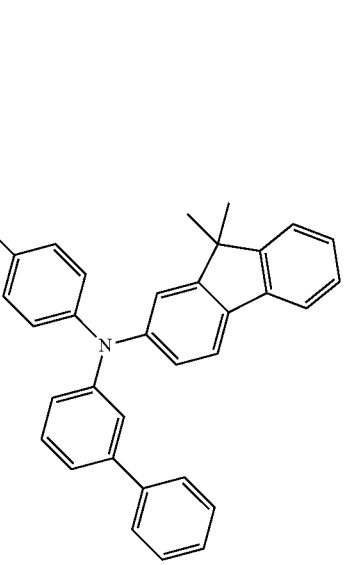
308
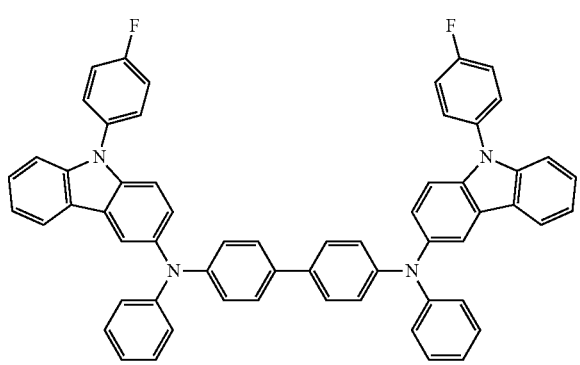
309
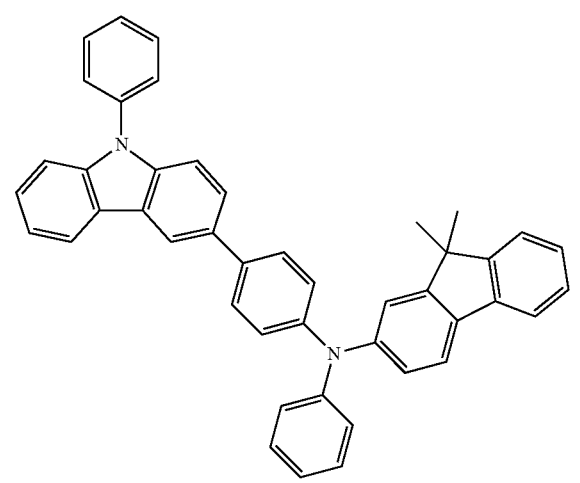
311
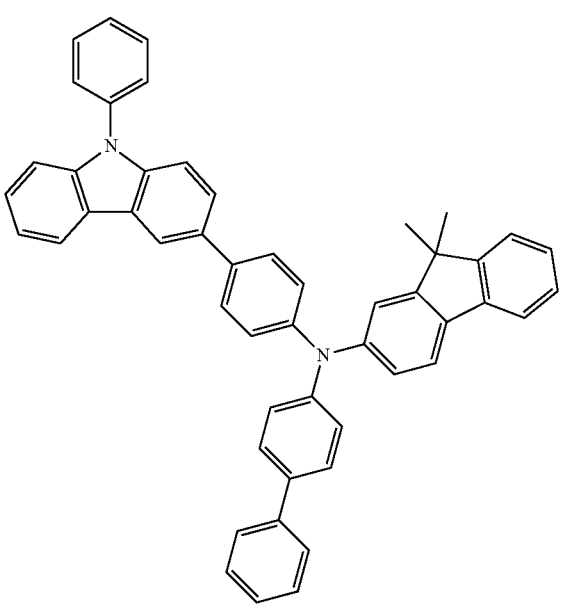

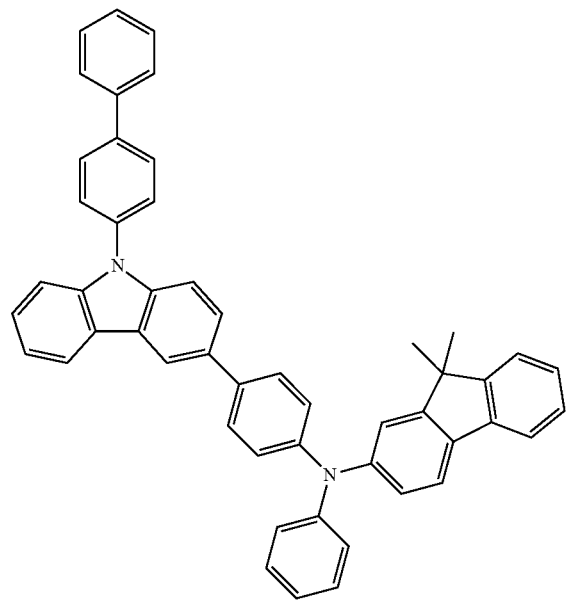
312
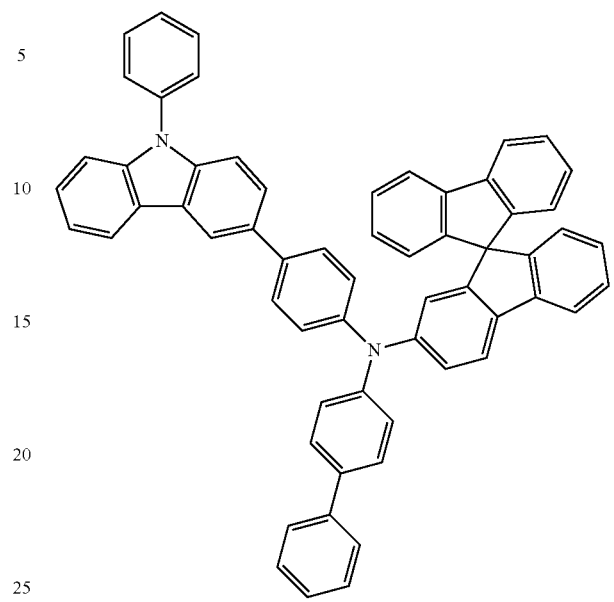
314
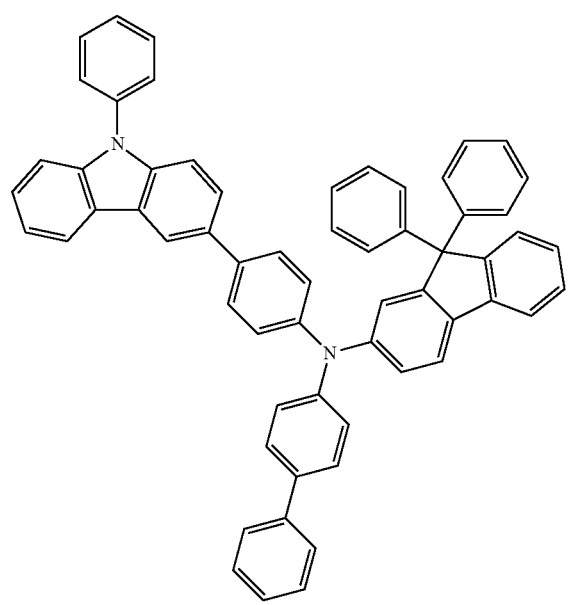
313
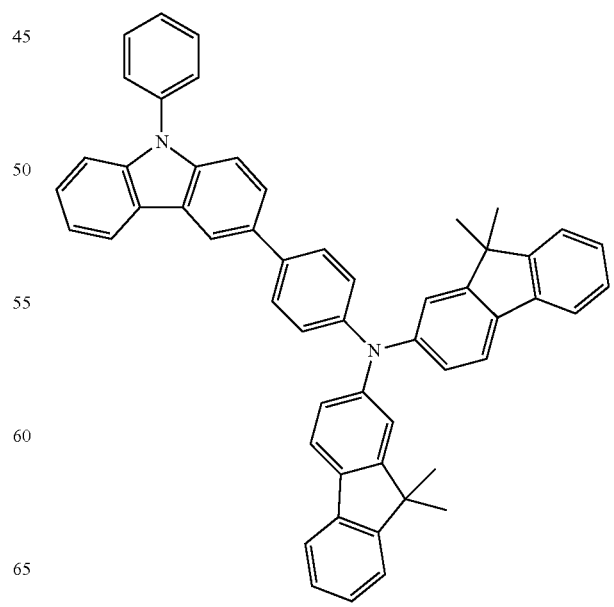
315

316

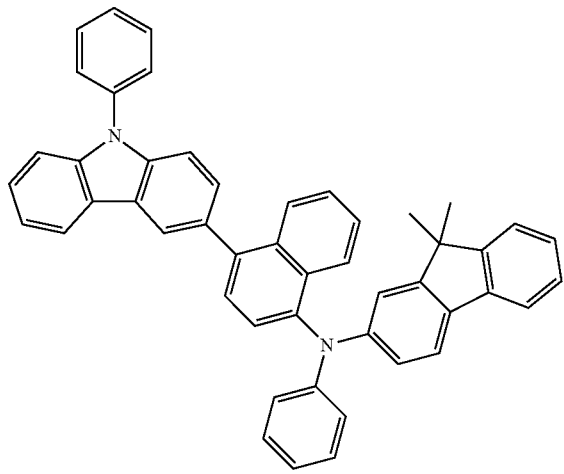

317

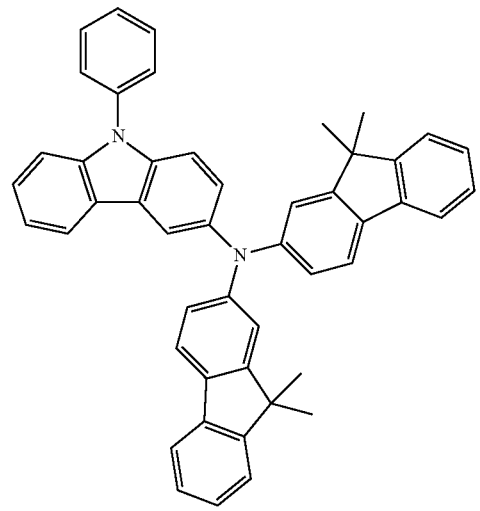

318

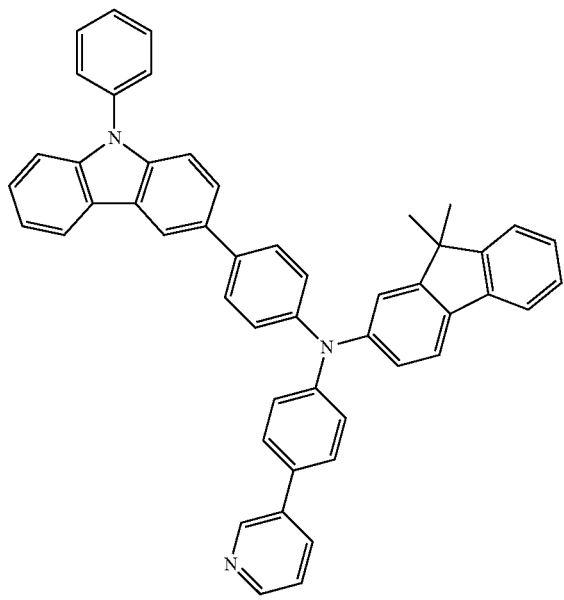

319

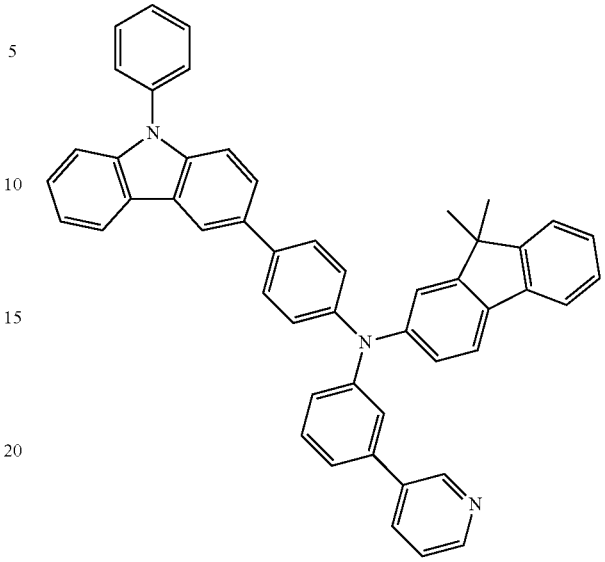

320

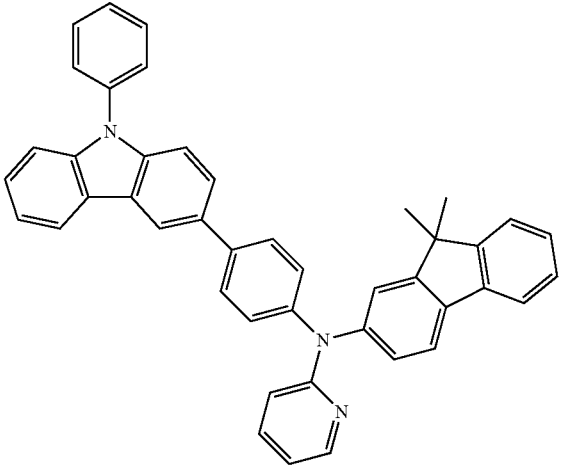

In some embodiments, at least one of the HL, the HTL, and the H-functional layer may further include a charge generating material for improved layer conductivity, in addition to the hole injecting material, the hole transport material, and/or the material having both hole injection and hole transport capabilities as described above.

The charge generating material may be, for example, a p-dopant. In one embodiment, the p-dopant is at least one selected from quinone derivatives, metal oxides, and cyano-containing compounds, but embodiments of the invention are not limited thereto. Non-limiting examples of the charge generating material are quinone derivatives such as tetra-cyanoquinonedimethane (TCNQ), 2,3,5,6-tetrafluoro-tetra-cyano-1,4-benzoquinonedimethane (F4-TCNQ), and the like; metal oxides such as tungsten oxide, molybdenum oxide; and cyano-containing compounds such as Compound 200.

<Compound 200>

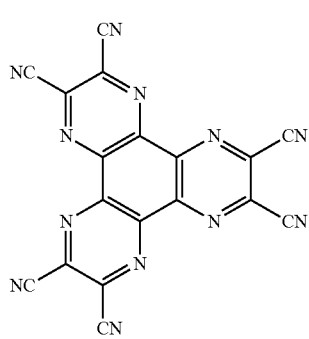

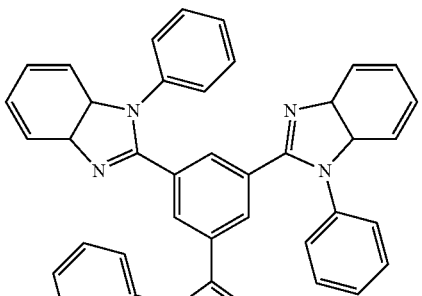

TPBI

<F4-TCNQ>

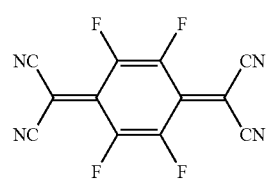

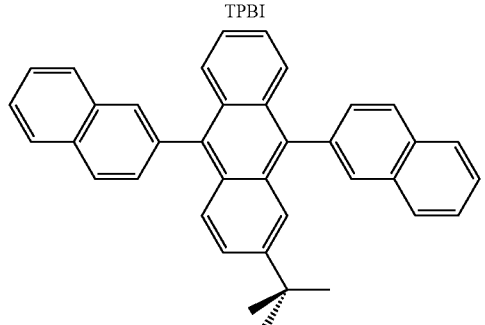

TBADN

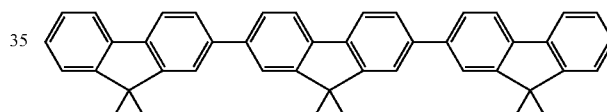

E3

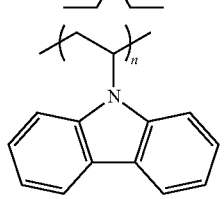

PVK

When the HIL, the HTL, and/or the H-functional layer further includes a charge generating material, the charge generating material may be homogeneously dispersed or inhomogeneously distributed in the H-functional layer.

A buffer layer may be positioned between at least one of the HIL, the HTL, and the H-functional layer, and the EML. The buffer layer may compensate for an optical resonance distance of light according to a wavelength of the light emitted from the EML, and thus may increase efficiency. The buffer layer may include any hole injection material or hole transport material suitable for use in organic light-emitting devices. In some other embodiments, the buffer layer may include the same material as one of the materials included in the HIL, the HTL, and/or the H-functional layer.

In one embodiment, an EML may be formed on the HTL, the H-functional layer, or the buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary according to the material that is used to form the EML.

The emission layer may further include a host, and a dopant.

Non-limiting examples of the host include the compound according to an embodiment of the present invention, Alq$_3$, 4,4'-N,N'-dicarbazole-biphenyl (CBP), poly(n-vinyl carbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyryl arylene (DSA), dmCBP (see Formula below), and Compounds 501 to 509, but the host is not limited thereto.

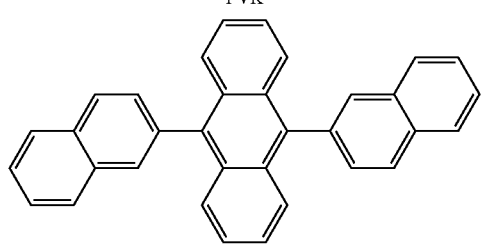

ADN

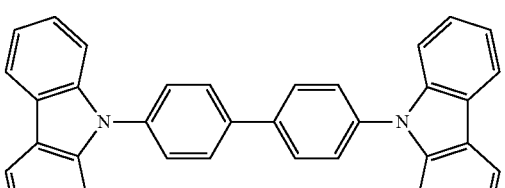

CBP

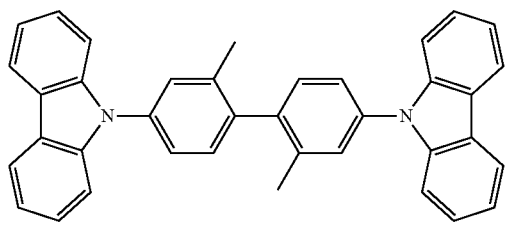
dmCBP
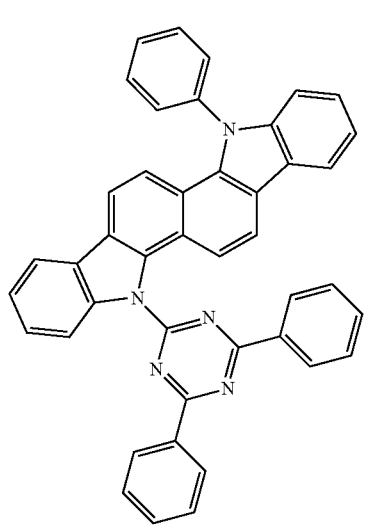
504
501
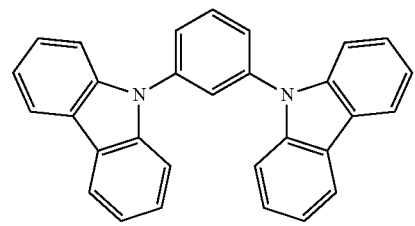
502
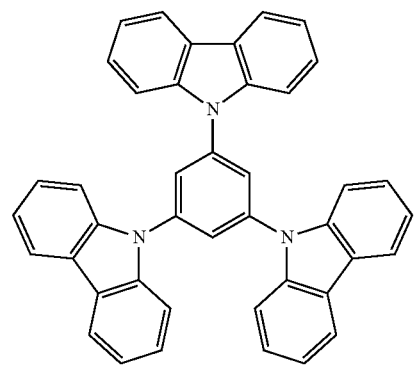
505
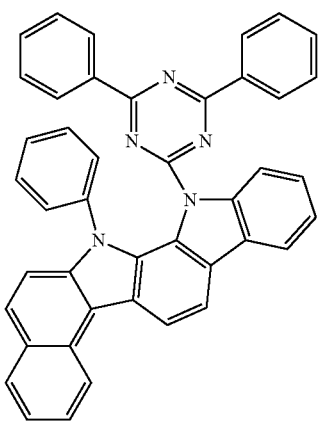
503
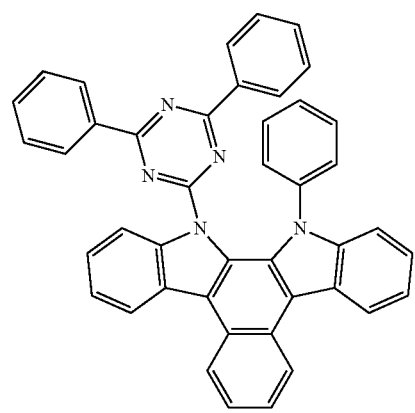
506
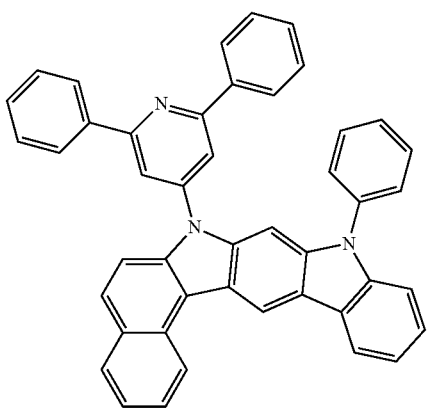

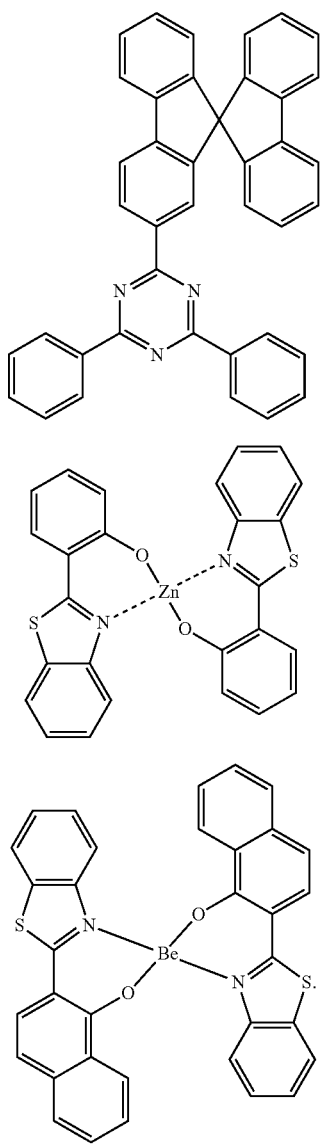

In some embodiments, the host may be an anthracene-based compound represented by Formula 400:

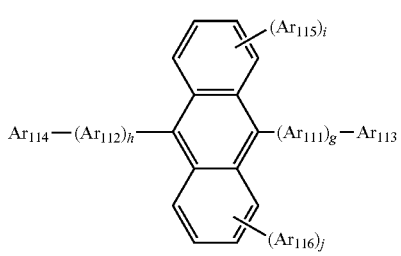

Formula 400 in Formula 400, $Ar_{111}$ and $Ar_{112}$ are each independently a substituted or unsubstituted C5-C60 arylene group; $Ar_{113}$ to $Ar_{116}$ are each independently a substituted or unsubstituted C1-C10 alkyl group or a substituted or unsubstituted C5-C60 aryl group; and g, h, i, and j may be each independently an integer from 0 to 4.

In Formula 400, $Ar_{111}$ and $Ar_{112}$ are each independently selected from a phenylene group, a naphthylene group, a phenanthrenyl group, a fluorenyl group and a pyrenylene group; and a phenylene group, a naphthylene group, a phenanthrenyl group, a fluorenyl group, and a pyrenylene group, each substituted with at least one selected from a phenyl group, a naphthyl group and an anthryl group, but embodiments of the invention are not limited thereto.

In one embodiment, in Formula 400, g, h, i, and j are each independently an integer from 0 to 2.

In some embodiments, in Formula 400, $Ar_{113}$ to $Ar_{116}$ are each independently a C1-C10 alkyl group substituted with at least one selected from:

a phenyl group, a naphthyl group and an anthryl group;

a phenyl group; a naphthyl group; an anthryl group; a pyrenyl group; a phenanthrenyl group; a fluorenyl group;

a phenyl group, a naphthyl group, an anthryl group, a pyrenyl group, a phenanthrenyl group and a fluorenyl group, each substituted with at least one selected from a deuterium atom, a halogen atom, a hydroxyl group, a cyano group, a nitro group, an amino group, an amidino group, hydrazine, hydrazone, a carboxyl group or salts thereof, a sulfonic acid group or salts thereof, a phosphoric acid or salts thereof, a C1-C60 alkyl group, a C2-C60 alkenyl group, a C2-C60 alkynyl group, a C1-C60 alkoxy group, a phenyl group, a naphthyl group, an anthryl group, a pyrenyl group, a phenanthrenyl group, and a fluorenyl group; and

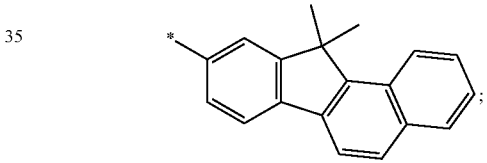

but, embodiments of the invention are not limited thereto.

In some embodiments, the anthracene-based compound represented by Formula 400 may be one of compounds below, but embodiments of the invention are not limited thereto:

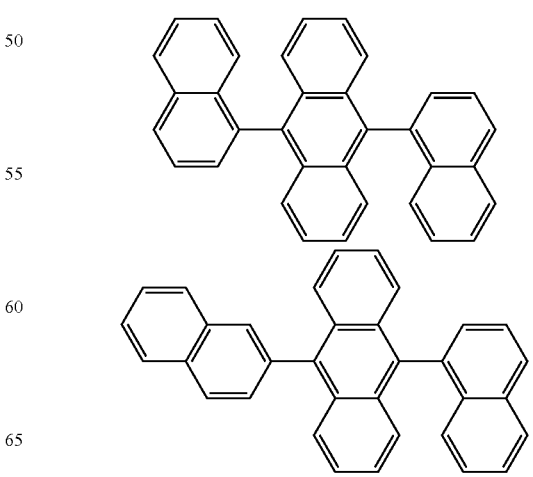

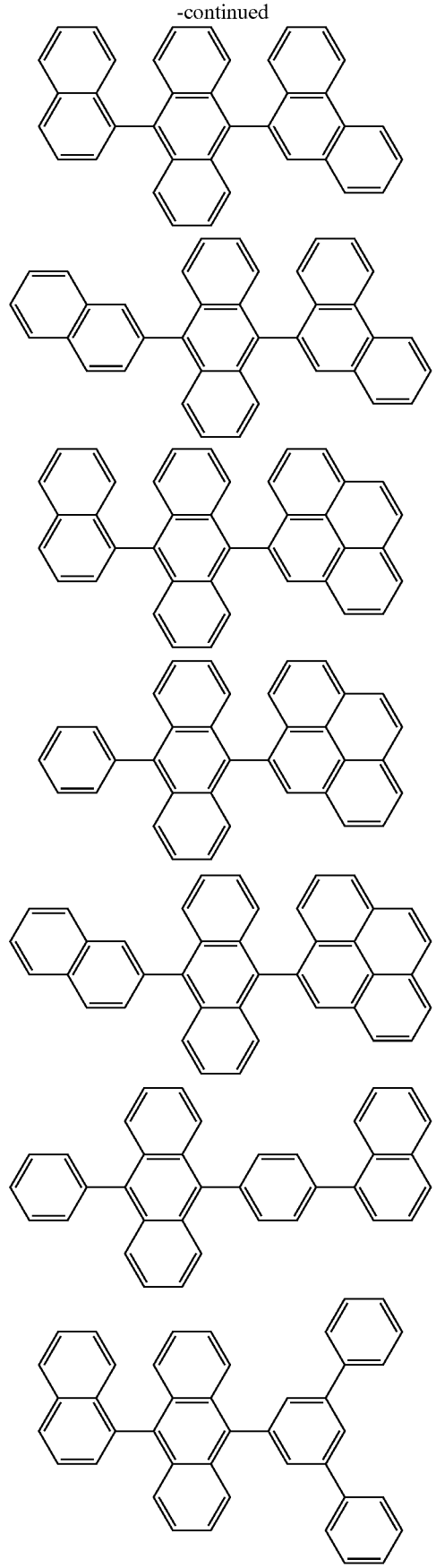
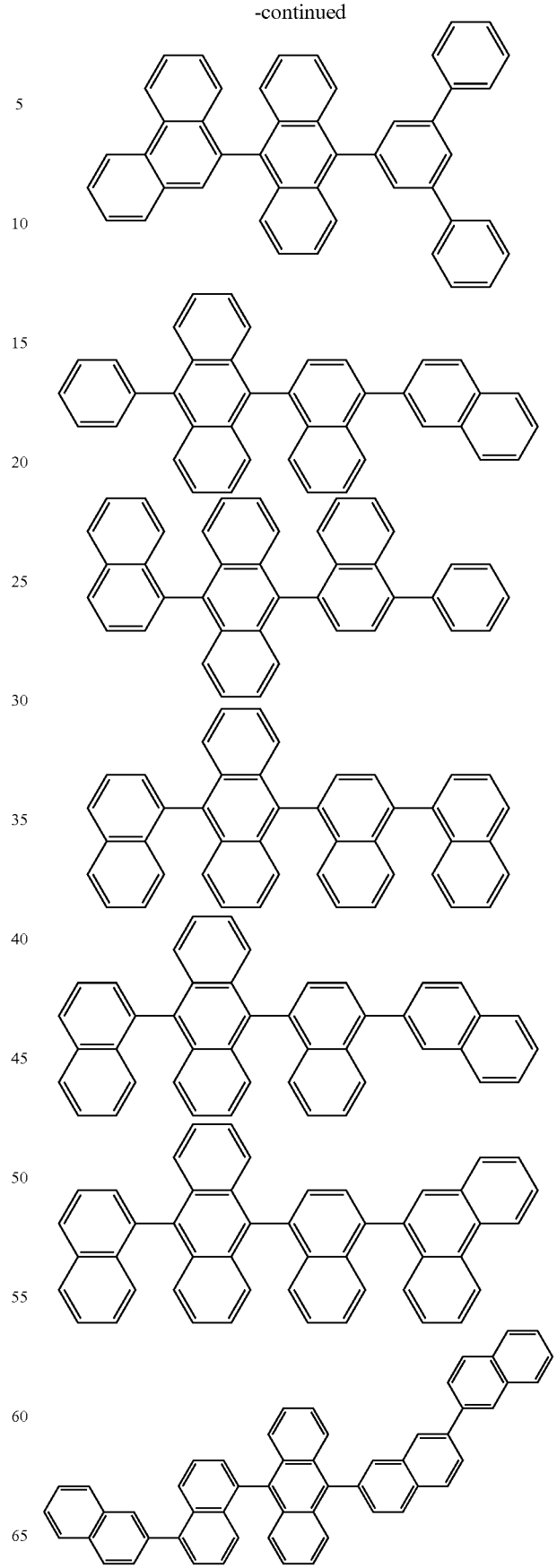

-continued
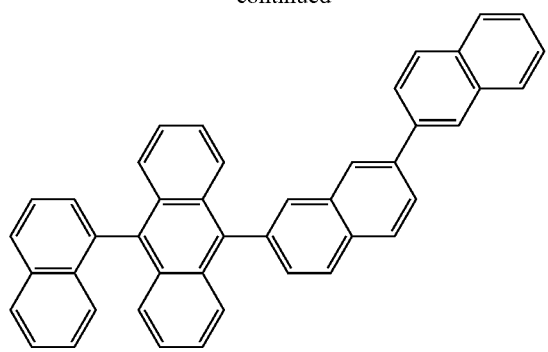
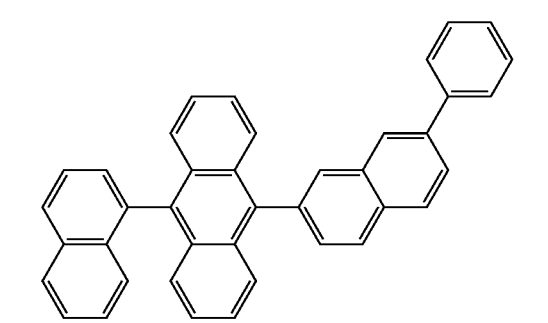
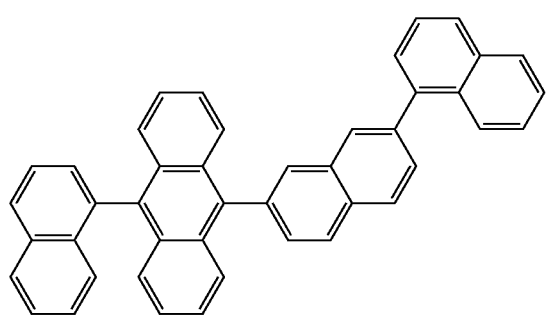
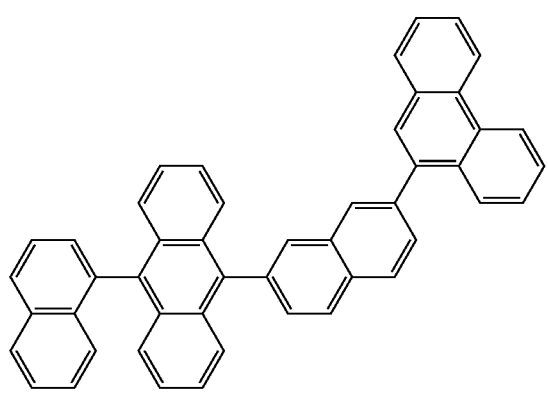
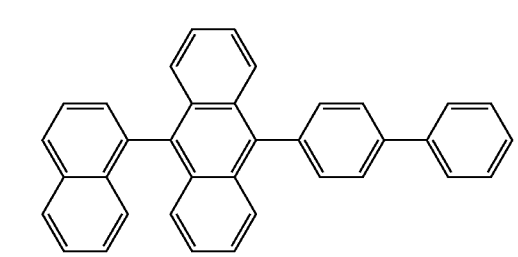
-continued
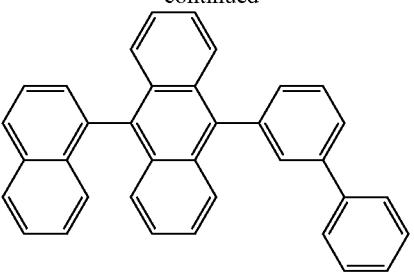
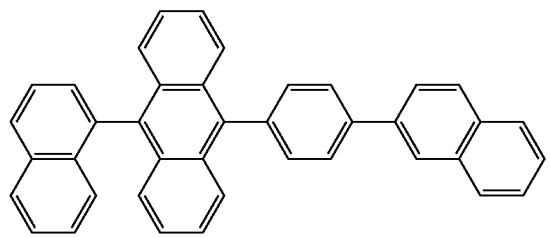
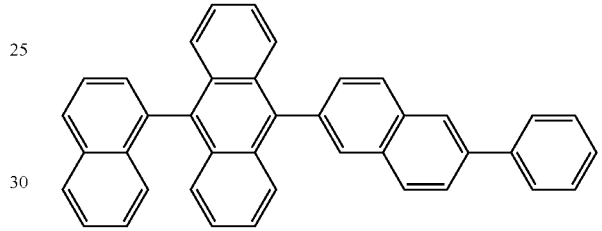
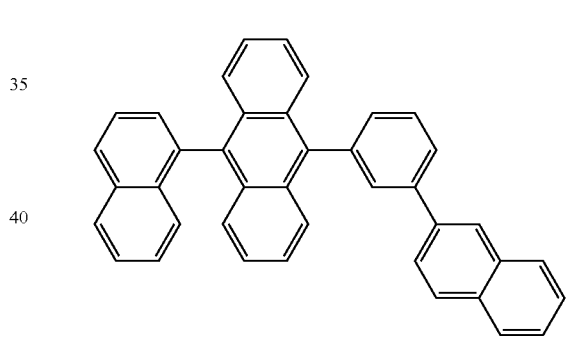
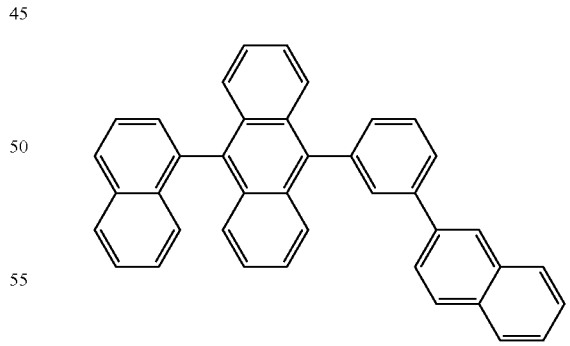
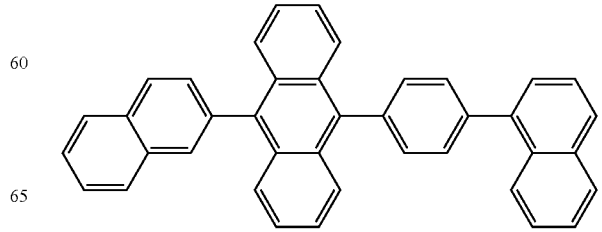

57
-continued
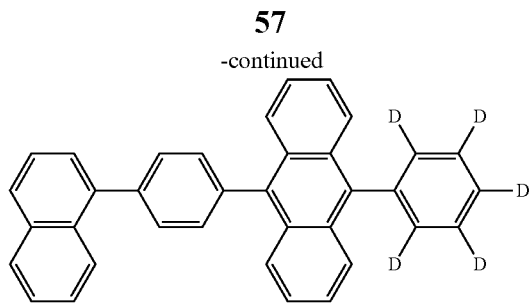
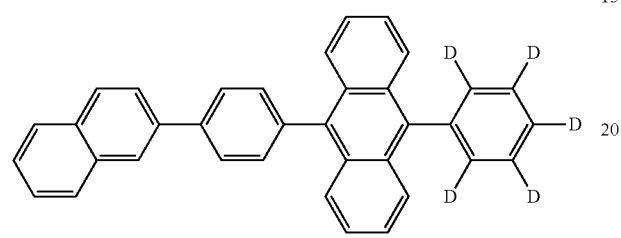
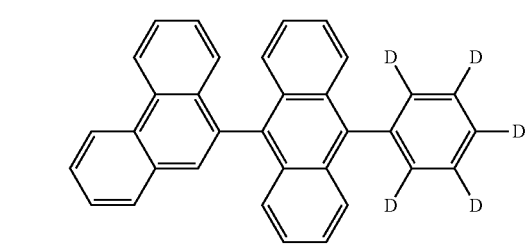
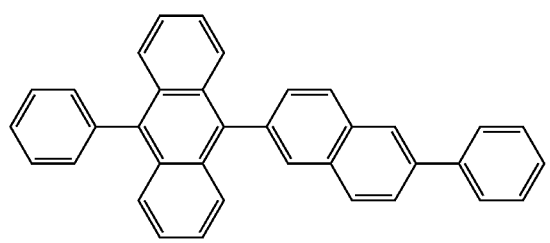
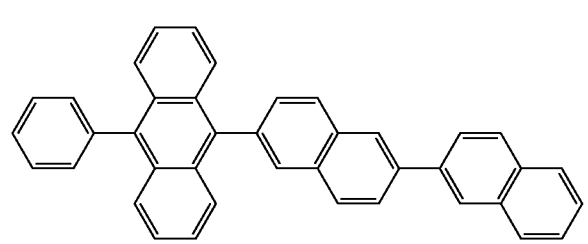
58
-continued
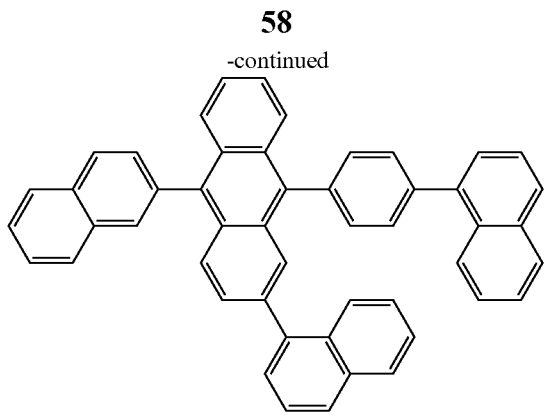
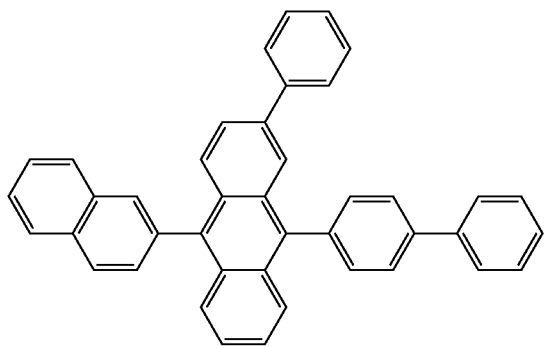

-continued

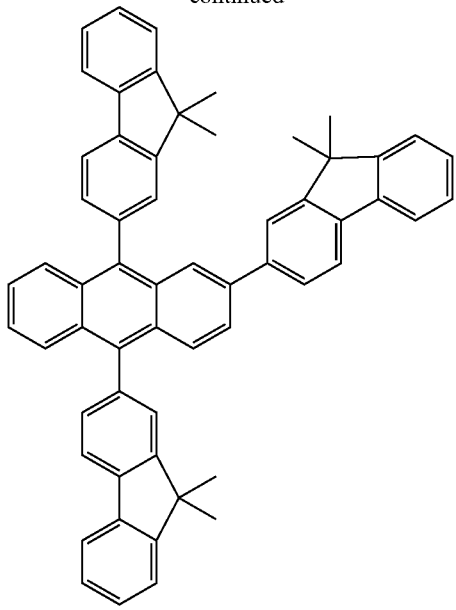

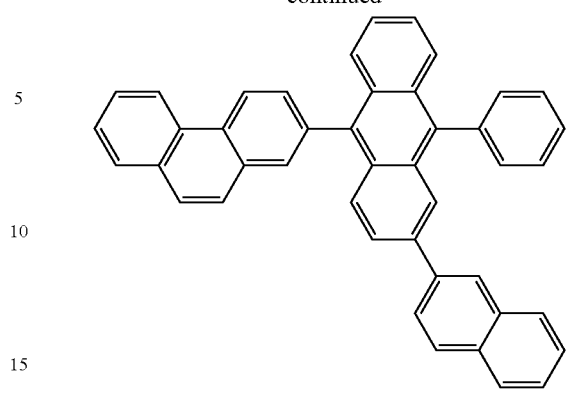

In some embodiments, the host is an anthracene-based compound represented by Formula 401:

Formual 401

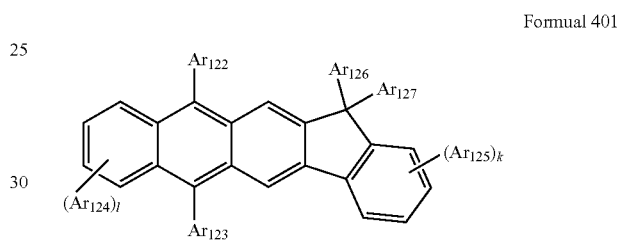

in Formula 401, detailed descriptions of $Ar_{122}$ to $Ar_{125}$ are the same as the description of $Ar_{113}$ of Formula 400.

In Formula 401, $Ar_{126}$ and $Ar_{127}$ may be each independently a C1-C10 alkyl group (for example, a methyl group, an ethyl group, or a propyl group).

In Formula 401, k and l are each independently an integer from 0 to 4. For example, the k and l may be 0, 1, or 2.

In some embodiments, the anthracene-based compound represented by the Formula 401 may be any one of the compounds below, but embodiments of the invention are not limited thereto:

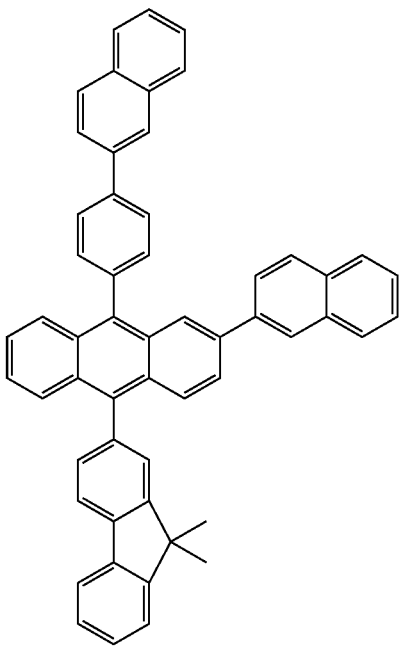

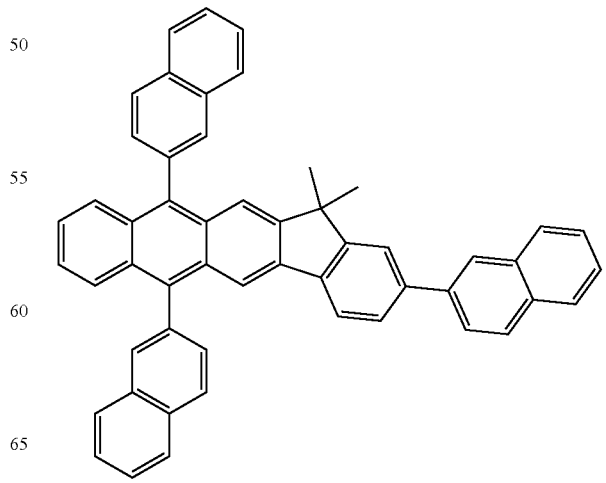

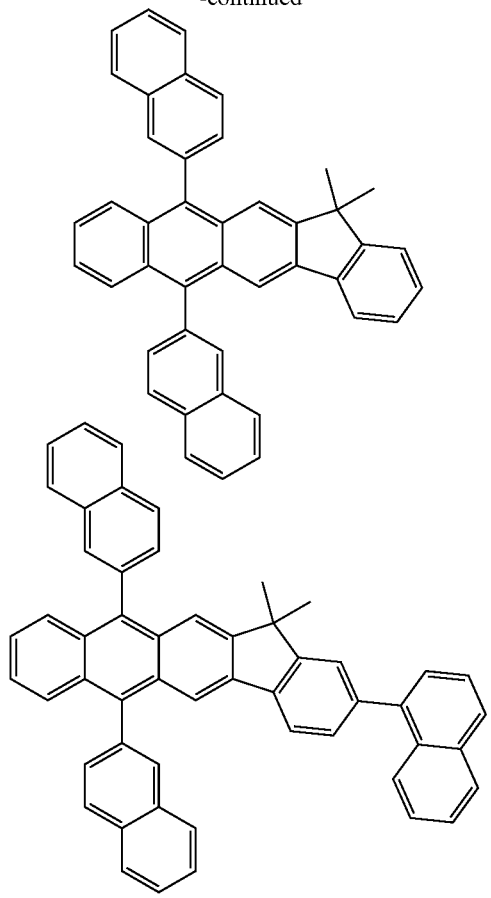
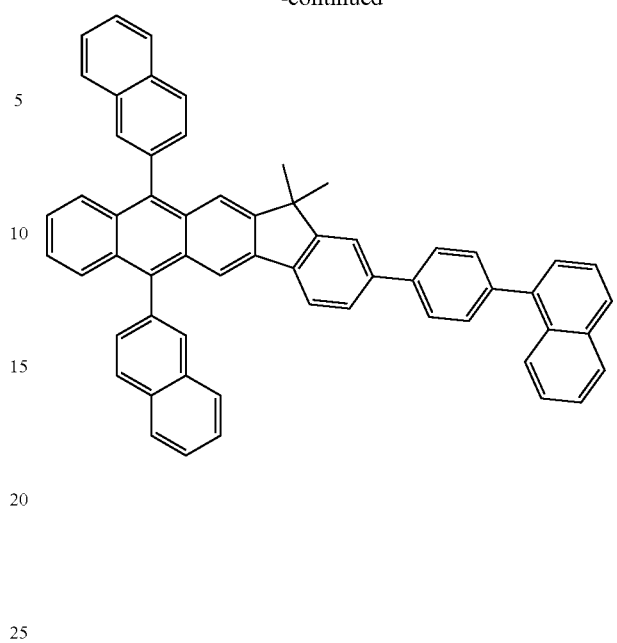
When the organic light-emitting device is a full color organic light-emitting device, the emission layer may be patterned into a red emission layer, a green emission layer, and a blue emission layer.
At least one of the red emission layer, the green emission layer, and the blue emission layer may include a dopant below (ppy=phenylpyridine).
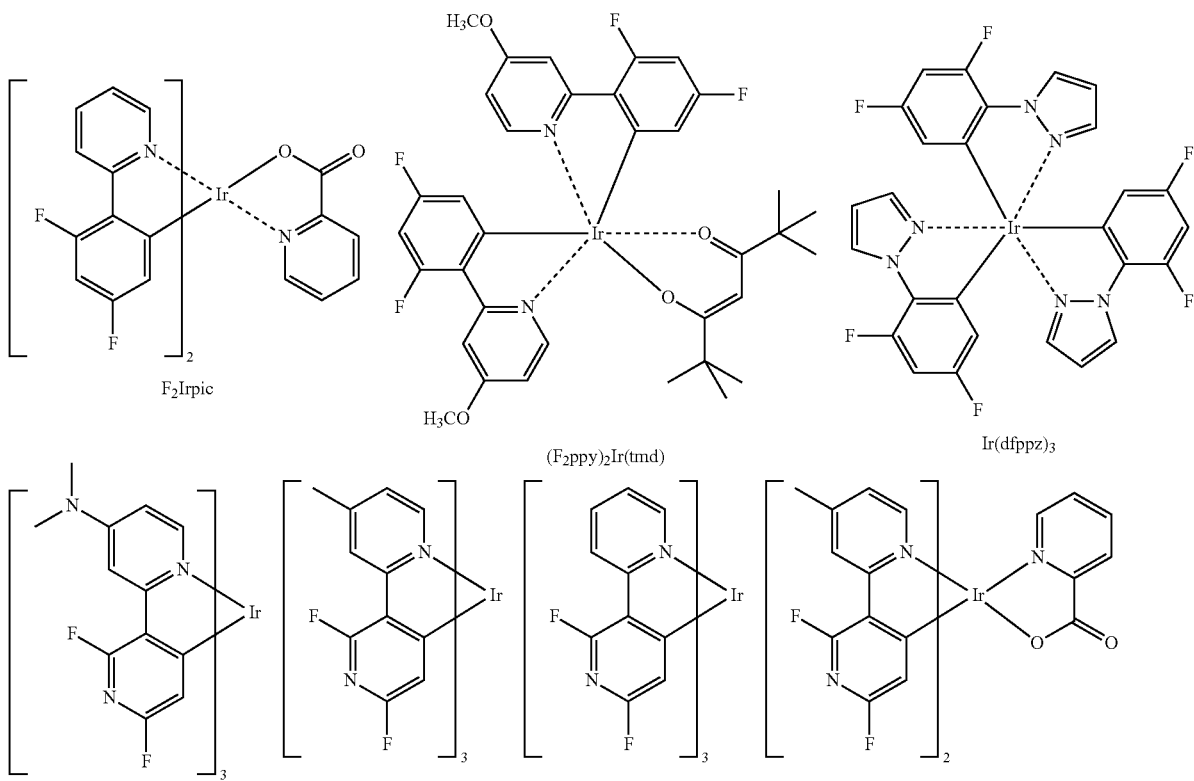

63
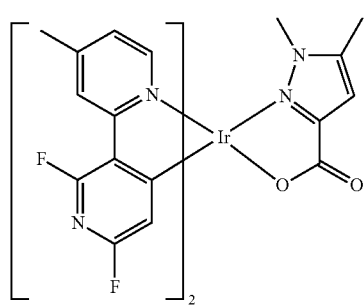
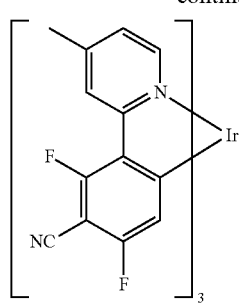
-continued
64
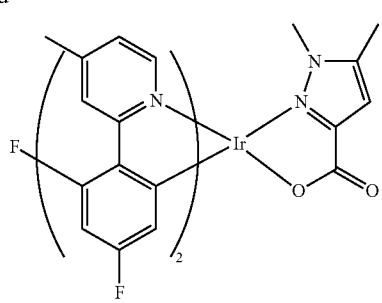
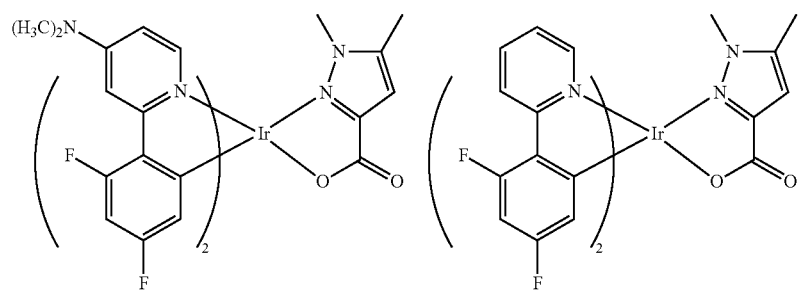
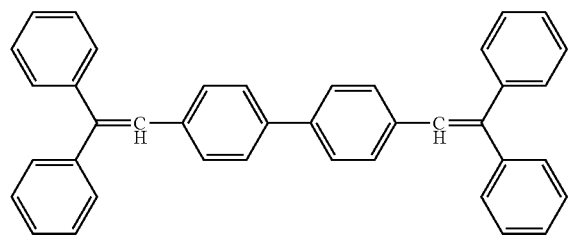
DPVBi
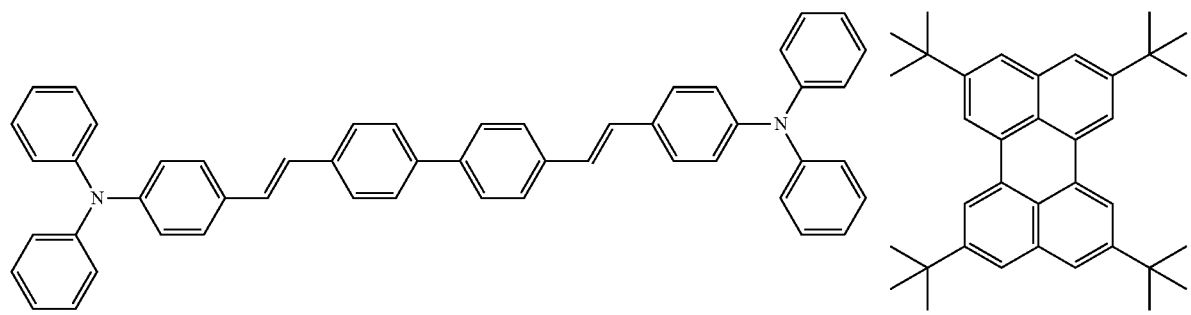
DPAVBi
TBPe Non-limiting examples of the red dopant are compounds represented by the following formulae.
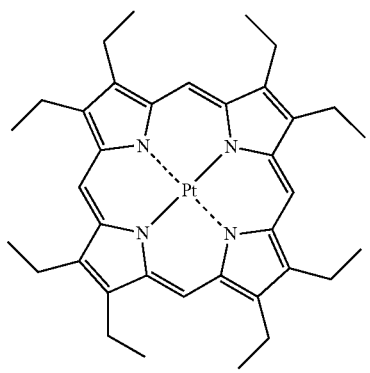
PtOEP
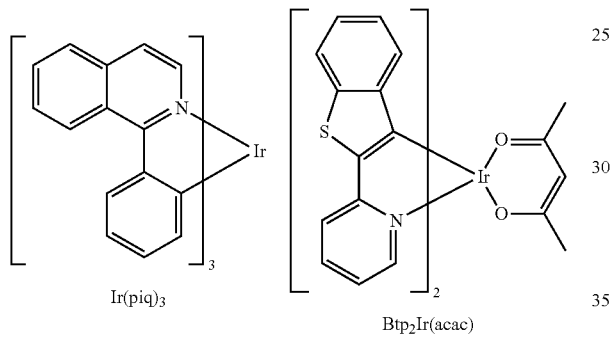
Ir(piq)₃  Btp₂Ir(acac)
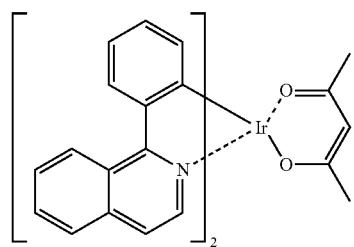
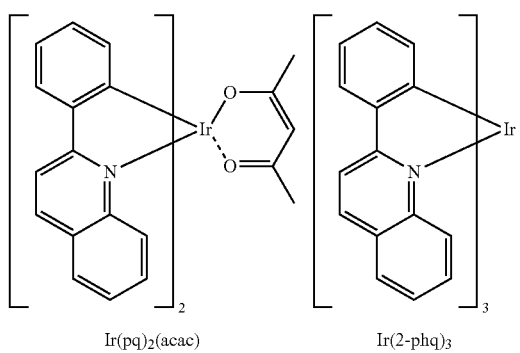
Ir(pq)₂(acac)  Ir(2-phq)₃
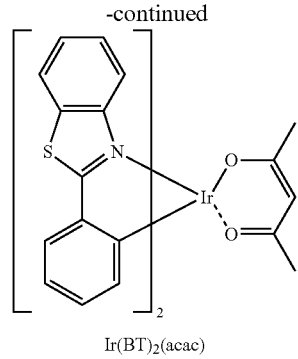
Ir(BT)₂(acac)
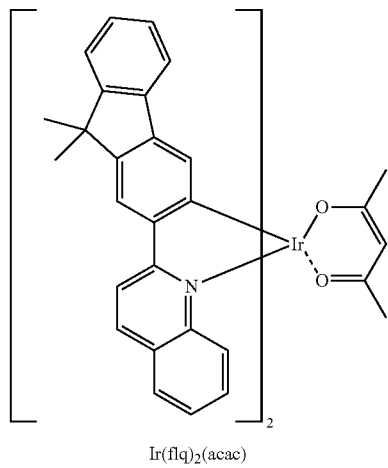
Ir(flq)₂(acac)
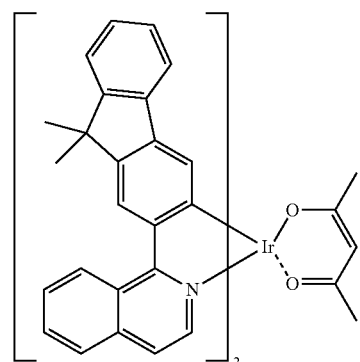
Ir(fliq)₂(acac)
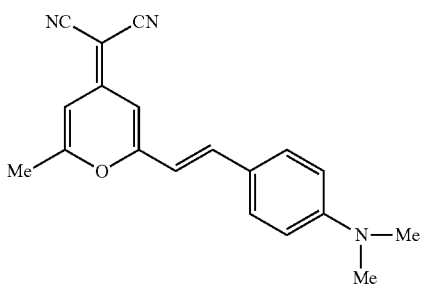
DCM

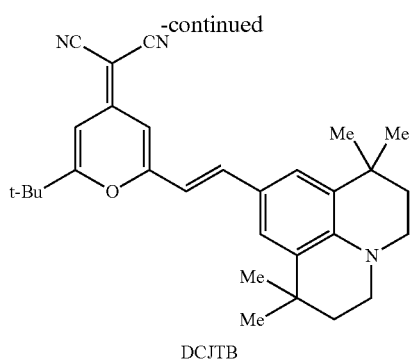
DCJTB
Non-limiting examples of the green dopant are compounds represented by the following formulae.
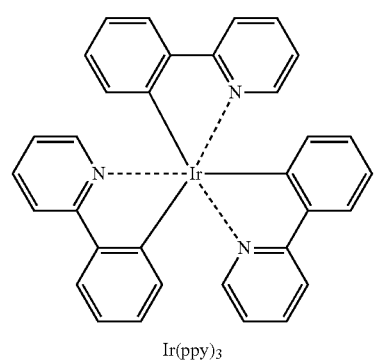
Ir(ppy)₃
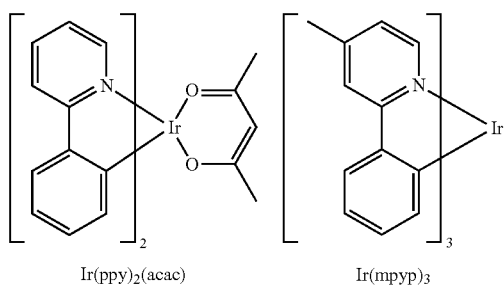
Ir(ppy)₂(acac)    Ir(mpyp)₃
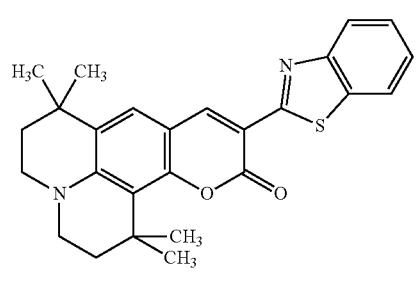
C545T
In some embodiments, a dopant included in the EML is a Pd-complex or a Pt-complex. Non-limiting examples of the dopant that may be included in the EML include Compounds D1 through D50:
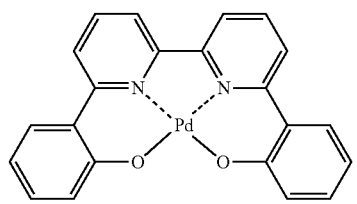
D1
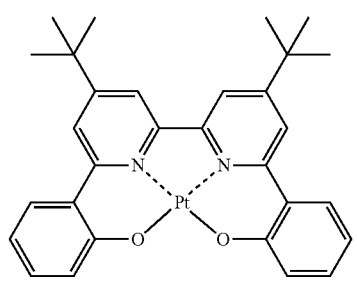
D2
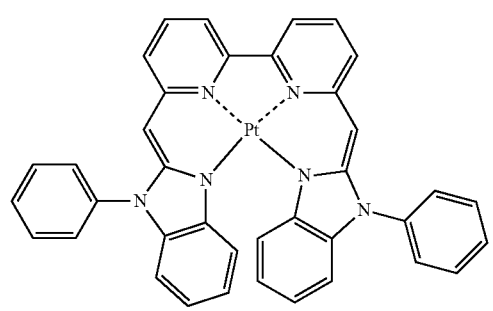
D3
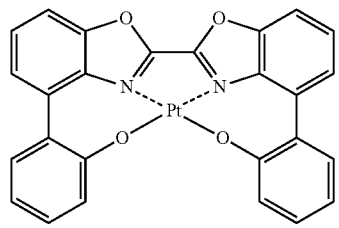
D4
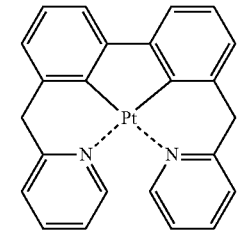
D5
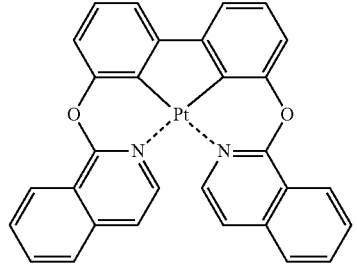
D6

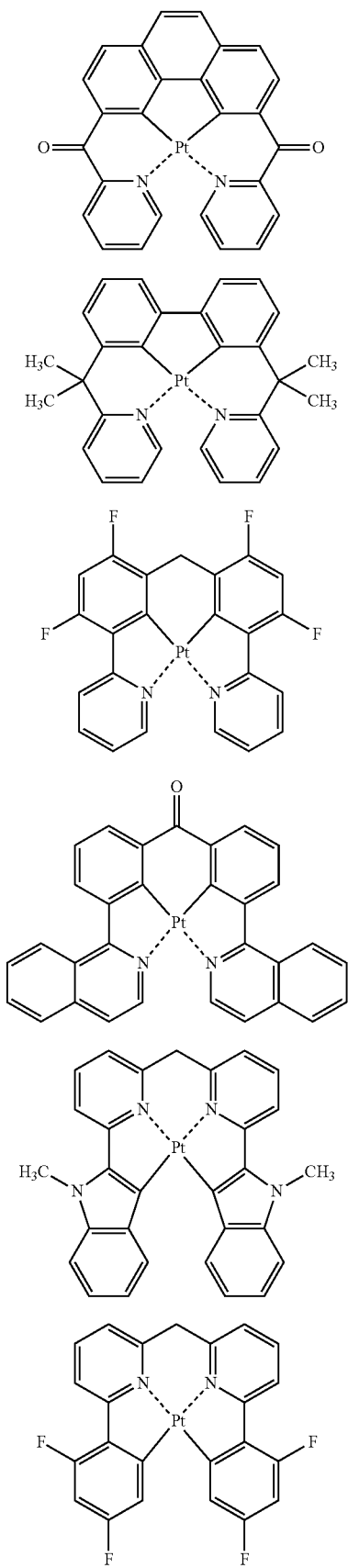
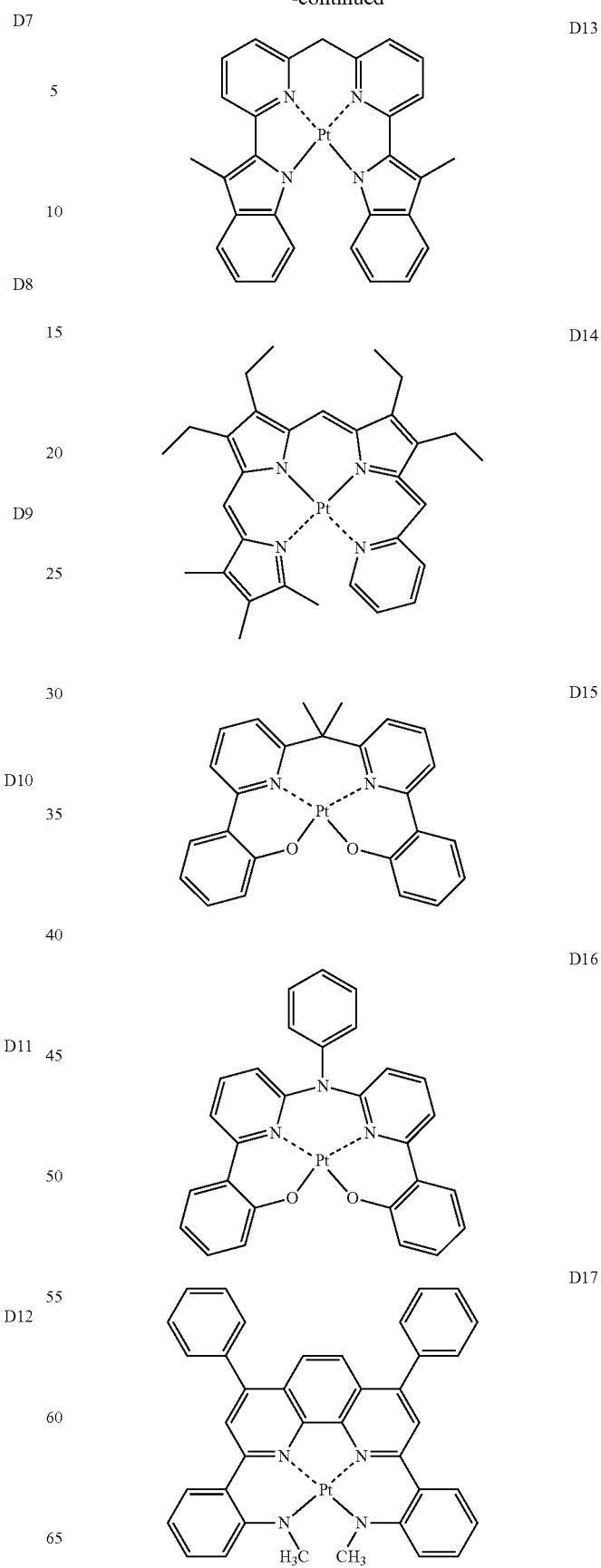

D18
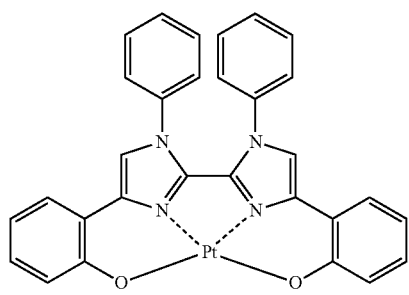
D19
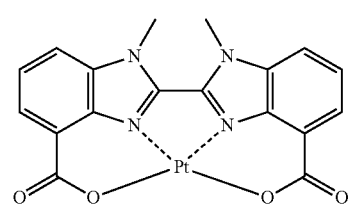
D20
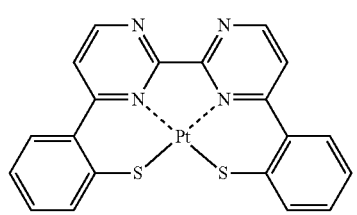
D21
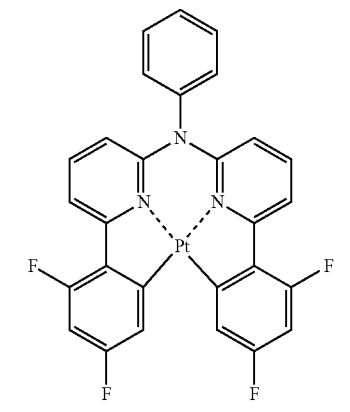
D22
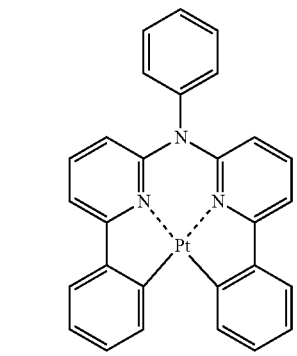
D23
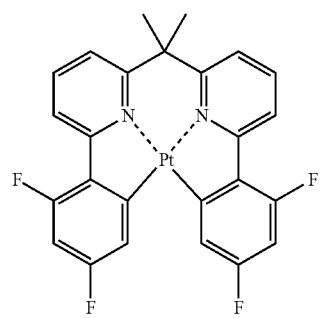
D24
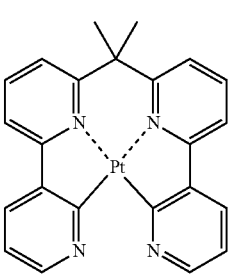
D25
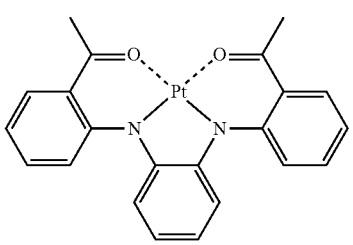
D26
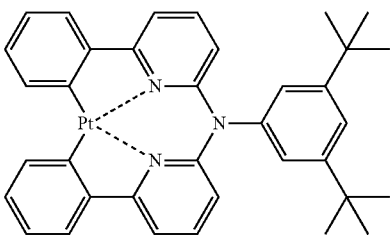
D27
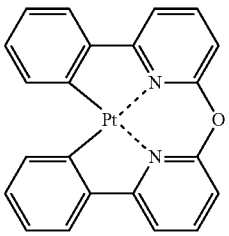
D28
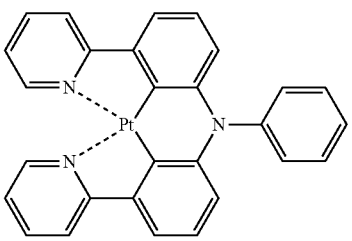

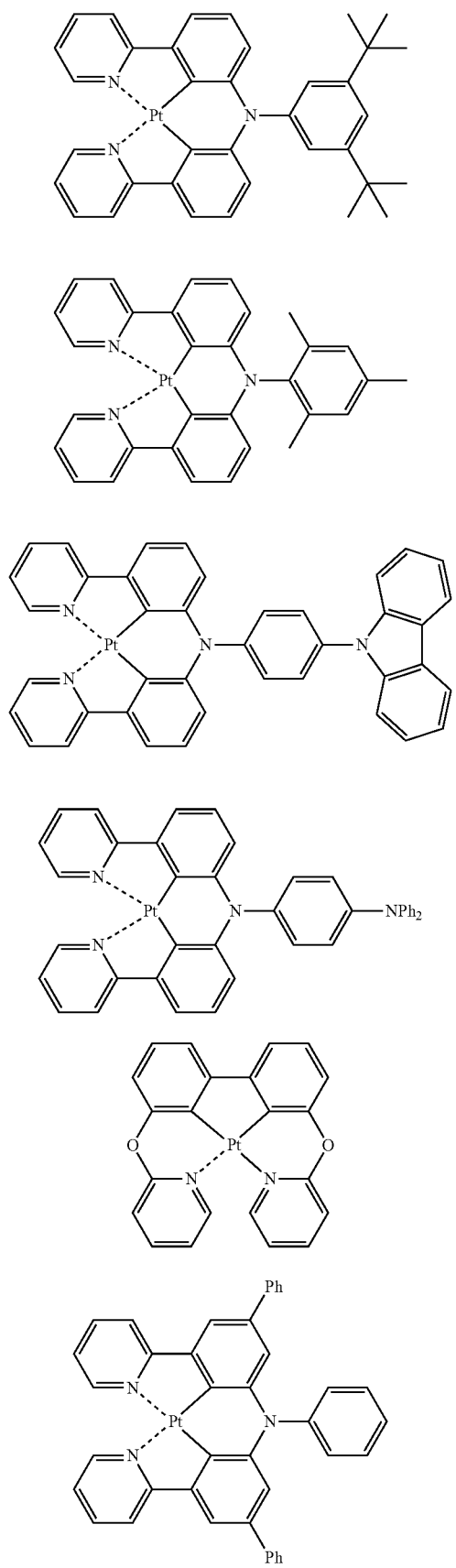
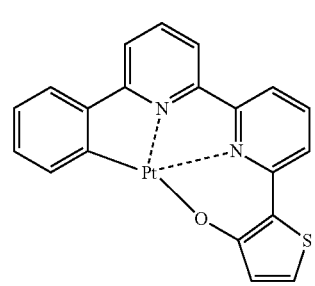
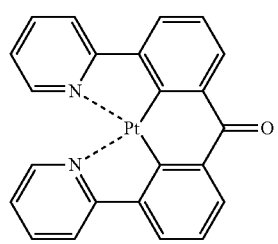
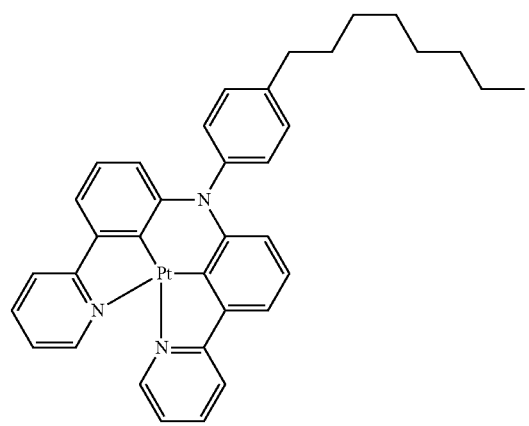
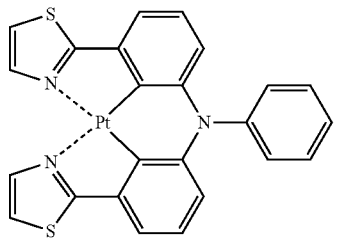
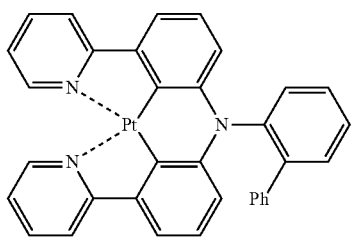

-continued
D40
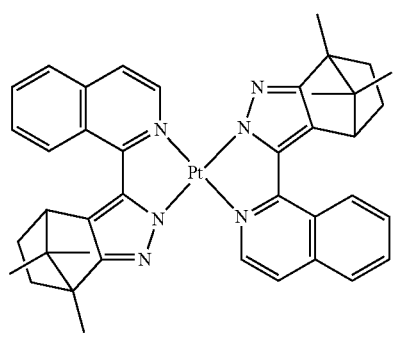
D41
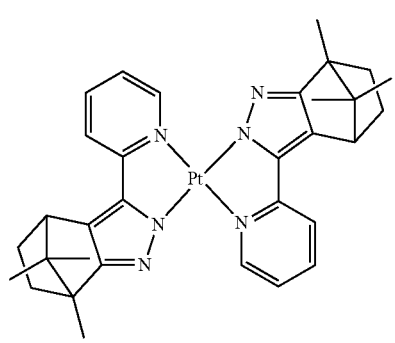
D42
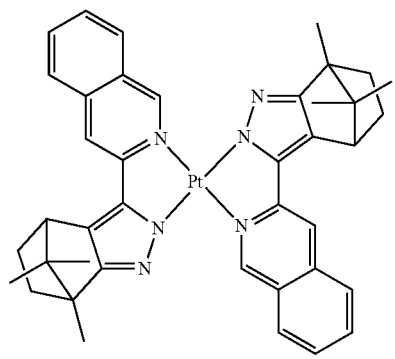
D43
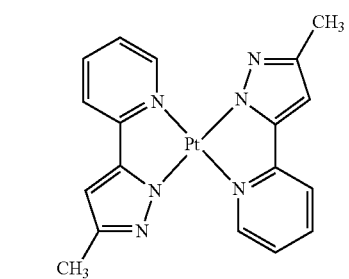
D44
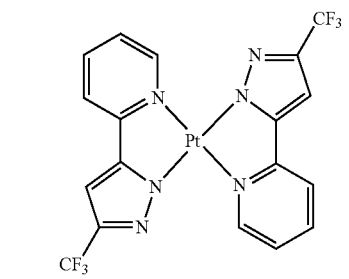
-continued
D45
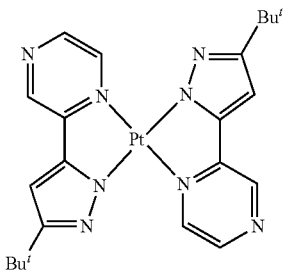
D46
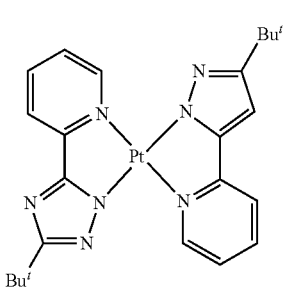
D47
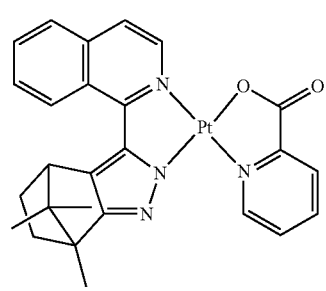
D48
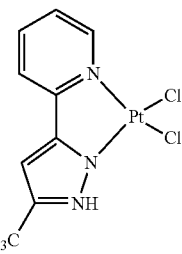
D49
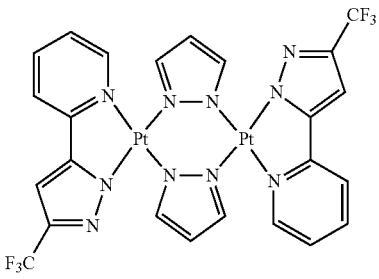

-continued

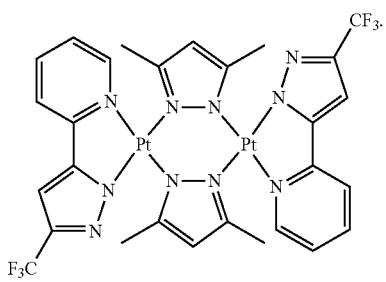

D50

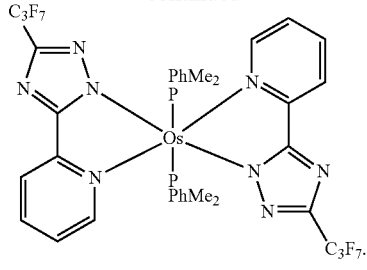

Os(hptz)₂(PPhMe₂)₂

Additional non-limiting examples of the dopant that may be used in the EML are Os complexes represented by the following formulae:

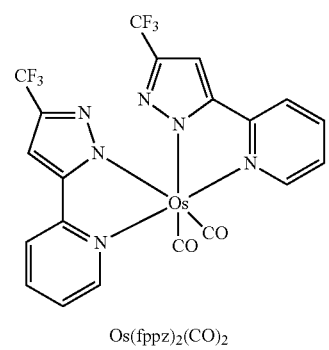

Os(fppz)₂(CO)₂

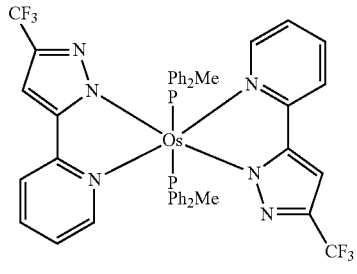

Os(fppz)₂(PPh₂Me)₂

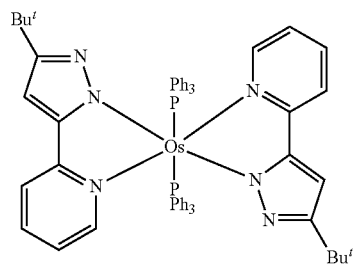

Os(bppz)₂(PPh₃)₂

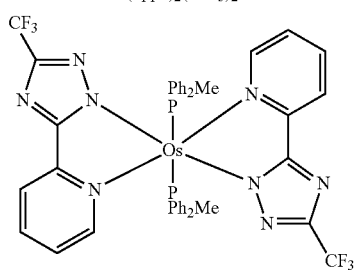

Os(fptz)₂(PPh₂Me)₂

When the EML includes both a host and a dopant, the amount of the dopant may be from about 0.01 to about 15 parts by weight based on 100 parts by weight of the host. However, the amount of the dopant is not limited to this range.

The thickness of the EML may be from about 100 Å to about 1000 Å, and in some embodiments, may be from about 200 Å to about 600 Å. When the thickness of the EML is within these ranges, the EML may have good light emitting ability without a substantial increase in driving voltage.

An ETL may be formed on the EML by any of a variety of methods, for example, vacuum deposition, spin coating, or casting. When the ETL is formed using vacuum deposition or spin coating, the deposition and coating conditions may be similar to those for the formation of the HIL, though the deposition and coating conditions may vary according to a material that is used to form the ETL. The material for the ETL may be the compound according to an embodiment of the present invention or any material capable of stably transporting electrons injected from an electron injecting electrode (cathode). Non-limiting examples of materials for forming the ETL are quinoline derivatives such as tris(8-quinolinorate)aluminum (Alq3), TAZ, BAlq, beryllium bis (benzoquinolin-10-olate (Bebq2), 9,10-di(naphthalene-2-yl) anthracene (ADN), Compound 201, and Compound 202, but embodiments of the invention are not limited thereto.

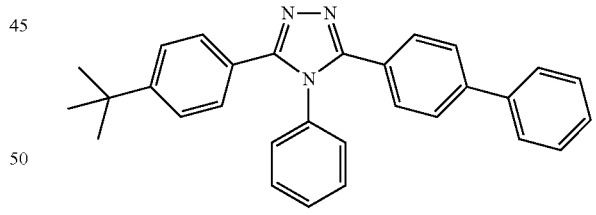

TAZ

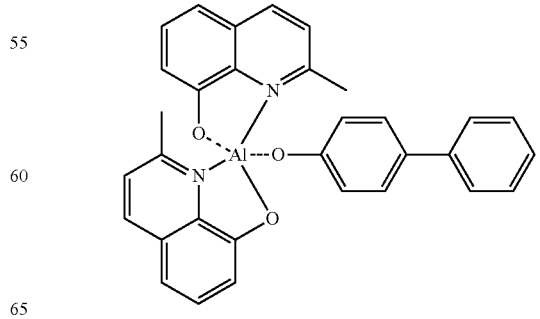

BAlq

<Compound 201>

<Compound 202>

BCP

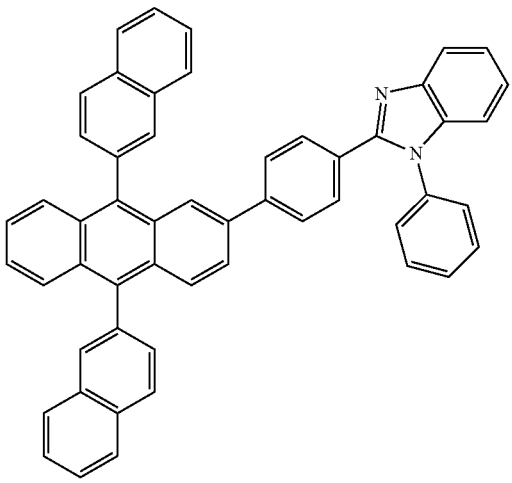

Compound 203

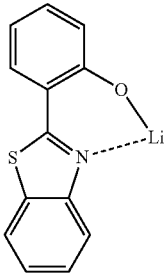

A thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments, the ETL may further include a metal-containing material in addition to the electron-transporting organic compound.

The metal-containing compound may include a lithium (Li) complex. Non-limiting examples of the Li complex are lithium quinolate (LiQ) and Compound 203:

An EIL, which in some embodiments facilitates injection of electrons from the cathode, may be formed on the ETL. Any suitable electron-injecting material may be used to form the EIL.

Non-limiting examples of the material for forming the EIL are LiF, NaCl, CsF, $Li_2O$, and BaO. The deposition and coating conditions for forming the EIL may be similar to those for the formation of the HIL, though the deposition and coating conditions may vary according to the compound that is used to form the EIL.

A thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode may be positioned on the organic layer. The second electrode may be a cathode that, in some embodiments, is an electron injection electrode. A material for forming the second electrode may be a metal, an alloy an electro-conductive compound, which have a low work function, or a mixture thereof. The second electrode may be formed of lithium (Li), magnesium (Mg), aluminum (Al group, aluminum lithium (Al—Li), calcium (Ca), magnesium-indium (Mg—In), magnesium-silver (Mg—Ag), or the like, and may be formed as a thin film type transmission electrode. In some embodiments, to manufacture a top-emission light-emitting device, the transmission electrode may be formed of indium tin oxide (ITO) or indium zinc oxide (IZO).

Although the organic light-emitting device of the drawing is described above, embodiments of the present invention are not limited thereto.

In embodiments where a phosphorescent dopant is used in the EML, a hole blocking layer (HBL) may be formed between the ETL and the EML, or the E-functional layer and the EML by using vacuum deposition, spin coating, casting, Langmuir-Blodgett (LB) deposition, or the like, in order to prevent diffusion of triplet excitons or holes into an ETL. When the HBL is formed using vacuum deposition or spin coating, the conditions for deposition and coating may be similar to those for the formation of the HIL, although the conditions for deposition and coating may vary according to the material that is used to form the HBL. Any hole blocking material suitable for use in organic light-emitting devices may be used. Non-limiting examples of the hole blocking material include oxadiazole derivatives, triazole derivatives, phenanthroline derivatives, or the like. In some embodiments, BCP shown below may be used as a hole blocking material.

81

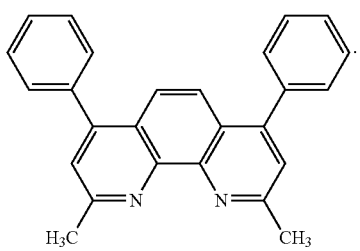

BCP

A thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

An organic light-emitting device according to the present invention may be included in various forms of flat display devices such as passive matrix organic light-emitting display devices and active matrix organic light-emitting display devices. When the organic light-emitting device is included in an active matrix organic light-emitting display device, a first electrode provided on a side of a substrate may be electrically connected to a source electrode or a drain electrode of a thin film transistor, as a pixel electrode. Also, the organic light-emitting device may be included in a flat display device capable of displaying screens on both sides.

An organic layer of an organic light-emitting device according to an embodiment of the present invention may be formed by a deposition method using a compound according to an embodiment of the present invention, or by a wet method that involves coating a compound according to an embodiment of the present invention, prepared as a solution.

Hereinafter, an organic light-emitting device according to an embodiment of the present invention will be described in greater detail through Synthesis Examples and Examples; however, embodiments of the present invention are not limited to the Synthesis Examples and Examples.

EXAMPLE

Synthesis Example 1

Synthesis of Compound 1

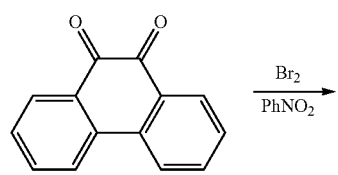

82

-continued

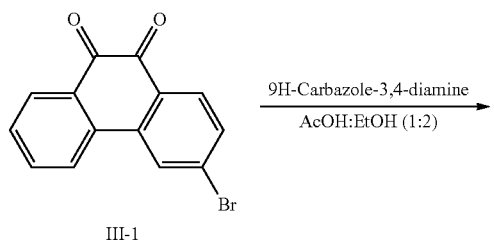

III-1

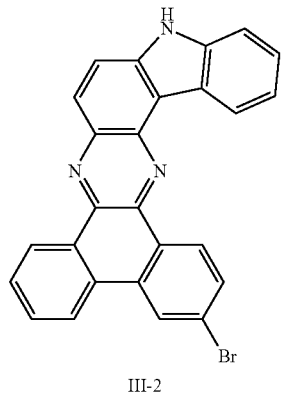

III-2

III-2 + 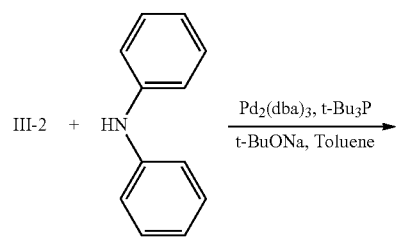 →

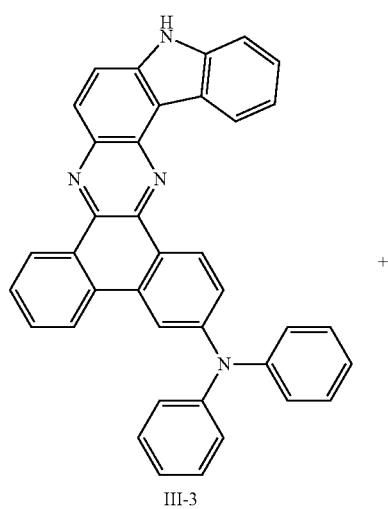

III-3

+

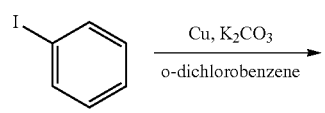

-continued

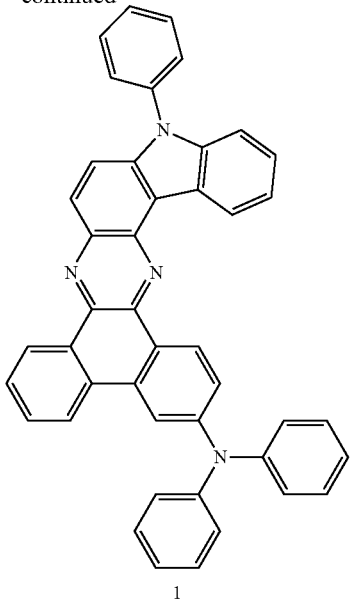

1

Synthesis of Intermediate III-1

10 g (48.02 mmol) of phenanthrene-9,10-dione was dissolved in 80 ml of nitrobenzene and agitated at a temperature of 80° C. to prepare a mixture. 2.46 ml (48.02 mmol) of bromine was diluted in 20 ml of nitrobenzene and then slowly added to the mixture, which was refluxed and agitated for 3 hours at a temperature of 100° C. A saturated $NaHSO_3$ aqueous solution was added to the mixture to precipitate a solid, the solid was filtered and washed sequentially with distilled water and n-hexane, and the solid was vacuum dried to obtain 12.8 g (yield 93%) of Intermediate III-1 (3-bromophenanthrene-9,10-dione).

Synthesis of Intermediate III-2

5 g (17.41 mmol) of Intermediate III-1 and 3.43 g (17.41 mmol) of 9H-Carbazole-1,2-diamine were dissolved in 80 ml of ethanol and 40 ml of acetic acid to prepare a mixture, which was refluxed at a temperature of 80° C. for 30 minutes to prepare a solid. The solid was filtered and sequentially washed with distilled water, ethanol, and n-hexane, and then vacuum dried to obtain 7.21 g (92%) of a yellow solid of Intermediate III-2 (16-bromo-8H-dibenzo[a,c]indolo[3,2-h] phenazine).

Synthesis of Intermediate III-3

102.1 mg (0.11 mmol) of $Pd_2(dba)_3$ and 45.1 mg (0.22 mmol) of $t-Bu_3P$ were dissolved in 50 ml of o-xylene and agitated at room temperature for 10 minutes to prepare a mixture. 5 g (11.15 mmol) of Intermediate III-2, 3.77 g (22.30 mmol) of diphenylamine, and 643.1 mg (6.69 mmol) of t-BuONa were added to the mixture and then refluxed and agitated for 48 hours at a temperature of 160° C. to prepare a reaction product. Then, 20 ml of cold distilled water was added to the reaction product and the reaction product was extracted with ethyl acetate to prepare an extracted product. The extracted product was dried with magnesium sulfate and filtered, and a solvent was removed from the extracted product. Thereafter, the extracted product was purified by column chromatography to obtain 4.43 g (yield 74%) of Intermediate III-3 (N,N-diphenyl-8H-dibenzo[a,c]indolo[3,2-h]-phenazin-16-amine).

Synthesis of Compound 1

5 g (9.32 mmol) of Intermediate III-3, 2.09 g (10.25 mmol) of iodobenzene, 1.78 g (27.95 mmol) of copper powder, and 4.12 g (29.81 mmol) of $K_2CO_3$ were dissolved in 60 ml of o-dichlorobenzene, then agitated and mixed at a temperature of 140° C. for 12 hours to prepare a mixture. Then, 20 ml of distilled water was added to the mixture and the mixture was extracted with ethyl acetate to prepare an extracted product. The extracted product was dried with magnesium sulfate and a solvent was removed from the extracted product. Thereafter, the extracted product was purified by column chromatography to obtain 3.41 g (yield 60%) of Compound 1 (N,N,8-triphenyl-8H-dibenzo[a,c]indolo[3,2-h]phenazin-16-amine).

Synthesis Example 2

Synthesis of Compound 5

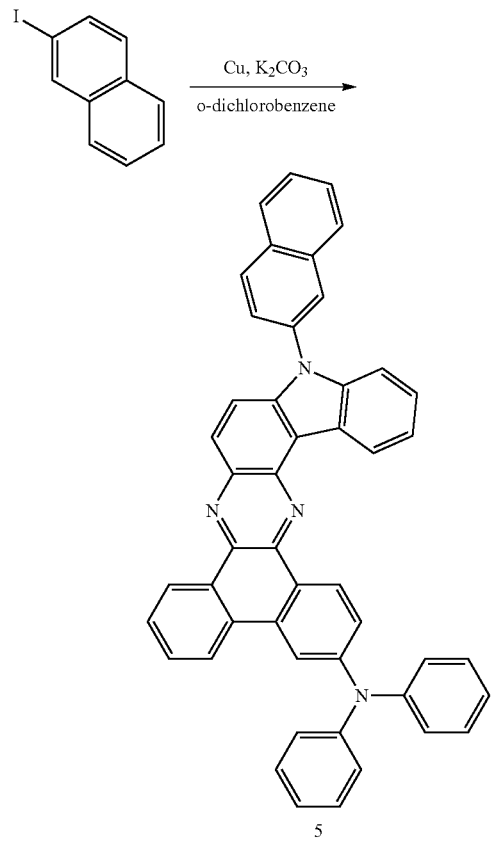

5

Synthesis of Compound 5

5 g (9.32 mmol) of Intermediate III-3, 2.60 g (10.25 mmol) of 2-iodonaphthalene, 1.78 g (27.95 mmol) of copper powder, and 4.12 g (29.81 mmol) of $K_2CO_3$ were dissolved in 60 ml of o-dichlorobenzene to prepare a mixture, and the mixture was refluxed and agitated at a temperature of 140°

C. for 12 hours. Then, 20 ml of distilled water was added to the mixture and then extracted with ethyl acetate to prepare an extracted product. The extracted product was dried with magnesium sulfate and filtered, and a solvent was evaporated from the extracted product. Thereafter, the extracted product was purified by column chromatography to obtain 3.22 g (yield 56%) of Compound 5 (8-(naphthalen-2-yl)-N,N-diphenyl-8H-dibenzo[a,c]indolo[3,2-h]phenazin-16-amine).

Synthesis Example 3

Synthesis of Compound 13

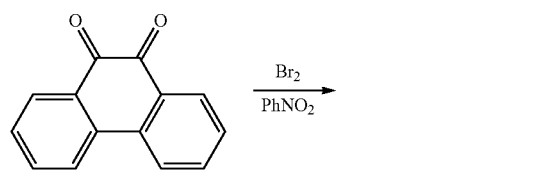

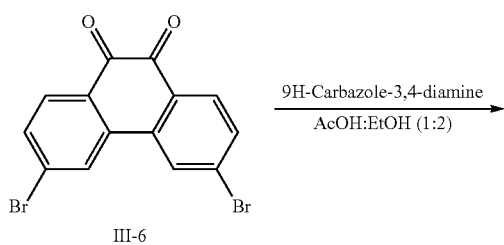

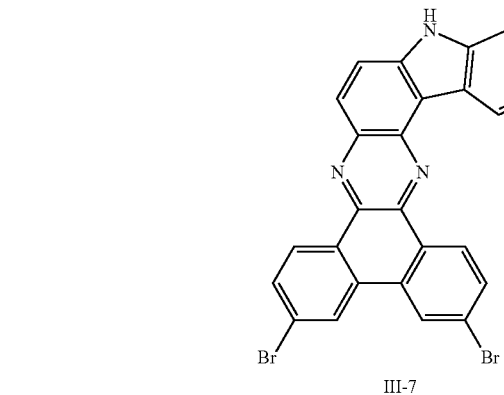

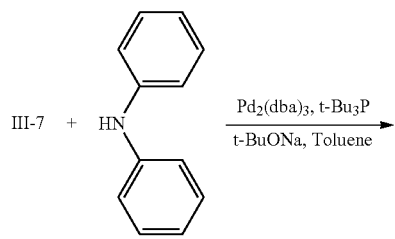

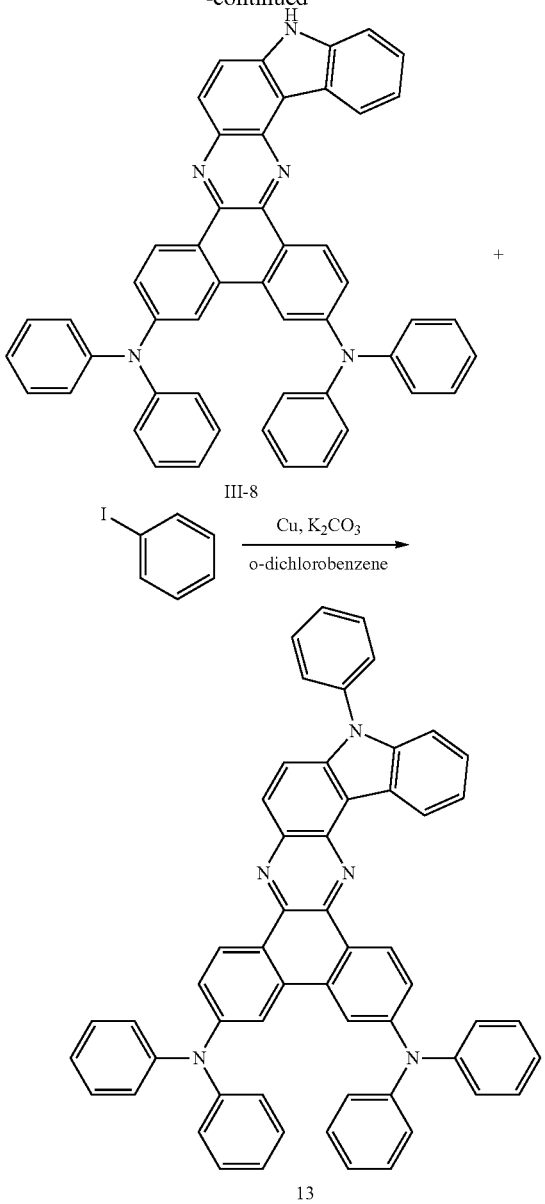

Synthesis of Intermediate III-6

10 g (48.02 mmol) of phenanthrene-9,10-dione was dissolved in 80 ml of nitrobenzene and then agitated at a temperature of 80° C. to prepare a mixture. 4.92 ml (96.06 mmol) of bromine was diluted in 20 ml of nitrobenzene and was slowly added to the mixture and then refluxed and agitated at a temperature of 100° C. for 3 hours. A saturated NaHSO₃ aqueous solution was added to the mixture to precipitate a solid and the solid was then sequentially washed with distilled water and n-hexane to prepare a washed product. The washed product was then vacuum dried to obtain 16.8 g (yield 96%) of Intermediate III-6 (3,6-dibromophenanthrene-9,10-dione).

Synthesis of Intermediate III-7

5 g (13.66 mmol) of Intermediate III-6 and 2.69 g (13.66 mmol) of 9H-Carbazole-1,2-diamine were dissolved in 80 ml of ethanol and 40 ml of acetic acid to prepare a mixture and then the mixture was refluxed and agitated at a temperature of 80° C. for 30 minutes to prepare a solid. The solid was then filtered and sequentially washed with distilled water, ethanol, and n-hexane and vacuum dried to obtain 6.52 g (91%) of yellow solid of Intermediate III-7 (2,16-dibromo-8H-dibenzo[a,c]indolo[3,2-h]phenazine).

Synthesis of Intermediate III-8

86.8 mg (0.09 mmol) of Pd$_2$(dba)$_3$ and 38.37 mg (0.19 mmol) of t-Bu$_3$P were dissolved in 50 ml of o-xylene and then agitated at room temperature for 10 minutes to prepare a mixture. 5 g (9.48 mmol) of Intermediate III-7, 3.21 g (18.97 mmol) of diphenylamine, and 546.84 mg (5.69 mmol) of t-BuONa were added to the mixture and then refluxed and agitated at a temperature of 160° C. for 48 hours. Thereafter, 20 ml of cold distilled water was added to the mixture and extracted with ethyl acetate. The extract was dried with magnesium sulfate and filtered, and the solvent was evaporated from the extract. The evaporated product was then purified by column chromatography to obtain 4.98 g (yield 75%) of Intermediate III-8 (N2,N2,N16,N16-tetraphenyl-8H-dibenzo[a,c]indolo[3,2-h]phenazine-2,16-diamine).

Synthesis of Compound 13

5 g (7.10 mmol) of Intermediate III-8, 1.59 g (7.81 mmol) of iodobenzene, 1.35 g (21.31 mmol) of copper powder, and 3.14 g (22.73 mmol) K$_2$CO$_3$ were added to 60 ml of o-dichlorobenzene to prepare a mixture and then the mixture was refluxed and agitated at a temperature of 140° C. for 12 hours. Thereafter, 20 ml of distilled water was added to the mixture and then extracted with ethyl acetate to prepare an extracted product. The extracted product was dried with magnesium sulfate and filtered, and a solvent was evaporated from the extracted product to prepare an evaporated product. The evaporated product was purified by column chromatography to obtain 3.22 g (yield 58%) of Compound 13 (N2,N2,N16,N16,8-pentaphenyl-8H-dibenzo[a,c]indolo[3,2-h]phenazine-2,16-diamine).

Synthesis Example 4

Synthesis of Compound 14

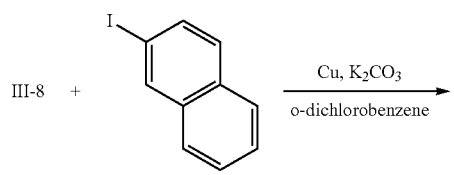

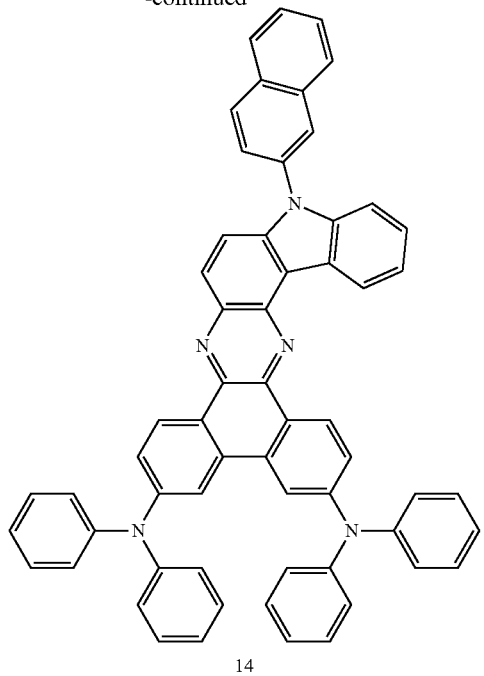

14

Synthesis of Compound 14

5 g (7.10 mmol) of Intermediate III-8, 1.99 g (7.81 mmol) of 2-iodonaphthalene, 1.35 g (21.31 mmol) of copper powder, and 3.14 g (22.73 mmol) of K$_2$CO$_3$ were dissolved in 60 ml of o-dichlorobenzene and then refluxed and agitated at a temperature of 140° C. for 12 hours to prepare a mixture. Thereafter, 20 ml of distilled water was added to the mixture and then extracted with ethyl acetate to prepare an extracted product. The extracted product was dried with magnesium sulfate and filtered, and a solvent was evaporated from the extracted product to prepare an evaporated product. Thereafter, the evaporated product was purified by column chromatography to obtain 3.32 g (yield 56%) of Compound 14 (8-(naphthalen-2-yl)-N2, N2,N16,N16-tetraphenyl-8H-dibenzo[a,c]indolo[3,2-h]phenazine-2,16-diamine).

One of ordinary skill in the art may synthesize compounds other than the compounds described above by referring to synthesis pathways described above and using suitable raw materials.

Example 1

As an anode, a Corning 15 Ω/cm$^2$ (1200 Å) ITO glass substrate was cut into a size of 50 mm×50 mm×0.7 mm and the ITO glass substrate was ultrasonically washed using isopropyl alcohol and distilled water for 5 minutes, followed by irradiation of UV and exposure to ozone for cleaning for about 30 minutes. The ITO glass substrate was then loaded onto a vacuum deposition device. 4,4',4''-tris(N-(2-naphthyl)-N-phenyl-amino)-triphenylamine (2-TNATA) was vacuum deposited on the substrate to form a hole injection layer in a thickness of 600 Å, and 4,4'-bis[N-(1-naphthyl)-N-phenyl amino]biphenyl (NPB) was vacuum deposited thereto to form a hole transport layer in a thickness of 300 Å. Compound 1 of the present invention and [bis-(1-phenylisoquinolyl)iridium(III)acetylacetonate] (herein after, (piq)2Ir(acac)) were simultaneously deposited on the hole transport layer in a weight ratio of 87:13 to form an emission layer in a thickness of 300 Å. Thereafter, tris-(8-hydroxyquinoline)aluminum ($Alq_3$) was vacuum deposited on the emission layer as an electron transport layer in a thickness of 300 Å, then, LIF, which is a halogenated alkali metal, was vacuum deposited on the electron transport layer as an electron injection layer in a thickness of 10 Å, and Al was vacuum deposited in a thickness of 3000 Å (negative electrode) to form a LiF/Al electrode to manufacture an organic light-emitting device.

This device showed a red light emission at a driving voltage of 7.2 V and emission efficiency of 13.1 cd/A at brightness of 1,000 $cd/m^2$.

Example 2

An organic light-emitting device was manufactured in the same manner as in Example 1 except for using Compound 5 instead of Compound 1 when forming an emission layer.

The device showed a red light emission at a driving voltage of 7.2 V and emission efficiency of 13.1 cd/A at brightness of 1,000 $cd/m^2$.

Example 3

An organic light-emitting device was manufactured in the same manner as in Example 1 except for using Compound 9 instead of Compound 1 when forming an emission layer.

The device showed a red light emission at a driving voltage of 7.2 V and emission efficiency of 13.1 cd/A at brightness of 1,000 $cd/m^2$.

Example 4

An organic light-emitting device was manufactured in the same manner as in Example 1 except for using Compound 13 instead of Compound 1 when forming an emission layer.

The device showed a red light emission at a driving voltage of 7.2 V and emission efficiency of 13.1 cd/A at brightness of 1,000 $cd/m^2$.

Example 5

An organic light-emitting device was manufactured in the same manner as in Example 1 except for using Compound 3 instead of Compound 1 and using tris[2-phenylpyridinato-C2,N]iridium(III) (hereinafter, Ir(ppy)3) instead of $(piq)_2Ir$ (acac) when forming an emission layer.

The device showed a green light emission at a driving voltage of 5.1 V and emission efficiency of 24.6 cd/A at brightness of 1,000 $cd/m^2$.

Example 6

An organic light-emitting device was manufactured in the same manner as in Example 5 except for using Compound 6 instead of Compound 3 when forming an emission layer.

The device showed a green light emission at a driving voltage of 5.3 V and emission efficiency of 24.2 cd/A at brightness of 1,000 $cd/m^2$.

Example 7

An organic light-emitting device was manufactured in the same manner as in Example 5 except for using Compound 12 instead of Compound 3 when forming an emission layer.

The device showed a green light emission at a driving voltage of 5.0 V and emission efficiency of 26.1 cd/A at brightness of 1,000 $cd/m^2$.

Example 8

An organic light-emitting device was manufactured in the same manner as in Example 5 except for using Compound 15 instead of Compound 3 when forming an emission layer.

The device showed a green light emission at a driving voltage of 5.2 V and emission efficiency of 25.2 cd/A at brightness of 1,000 $cd/m^2$.

Example 9

An organic light-emitting device was manufactured in the same manner as in Example 1, except for using 9,10-di-naphthalene-2-yl-anthracene (AND) instead of Compound 1, using 1,4-bis-(2,2-diphenylvinyl)biphenyl (DPVBi) instead of $(piq)_2Ir(acac)$, simultaneously depositing AND and DPVBi in a weight ratio of 98:2, and using Compound 19 instead of $Alq_3$.

The device showed a driving voltage of 6.5 V at a current density of 50 $mA/cm^2$, high brightness blue color light emission at emission brightness of 2434 $Cd/m^2$, emission efficiency of 4.7 cd/A, and a half-life of 224 hours at 100 $mA/cm^2$.

Example 10

An organic light-emitting device was manufactured in the same manner as in Example 9 except for using Compound 27 instead of Compound 19 when forming a electron transport layer.

The organic light-emitting device showed a driving voltage of 6.6 V at a current density of 50 $mA/cm^2$, a high brightness blue color light emission at emission brightness of 2585 Cd/m2, emission efficiency of 4.5 cd/A, and a half-life of 252 hours at 100 $mA/cm^2$.

Comparative Example 1

An organic light-emitting device was manufactured in the same manner as in Example 1, except for using Compound A instead of Compound 1 when forming an emission layer.

The organic light-emitting device showed a driving voltage of 7.6 V at brightness of 1,000 $cd/m^2$ and a red color emission at an emission efficiency of 10.8 cd/A.

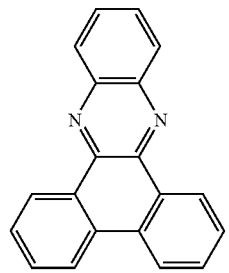

Compound A

Comparative Example 2

An organic light-emitting device was manufactured in the same manner as in Example 5 except for using Compound B instead of Compound 3 when forming an emission layer.

The organic light-emitting device showed a driving voltage of 7.8 V at brightness of 1,000 cd/m² and green light emission at an emission efficiency of 15.8 cd/A.

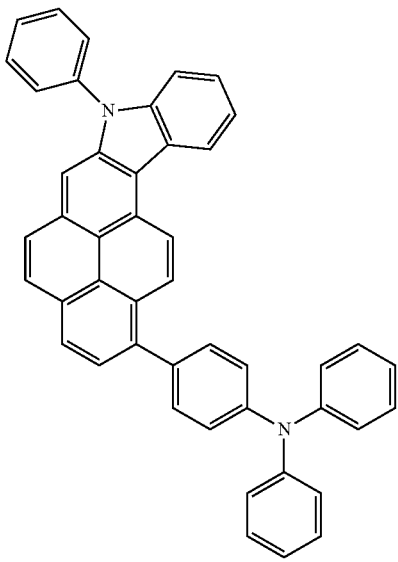

Compound B

Comparative Example 3

An organic light-emitting device was manufactured in the same manner as in Example 9 except for using Compound A instead of Compound 19 when forming an electron transport layer.

The organic light-emitting device showed an operating voltage of 7.9 V at a current density of 50 mA/cm², a blue light emission at emission brightness of 1620 Cd/m², emission efficiency of 3.2 cd/A, and half-life of 121 hours at 100 mA/cm².

When compounds according to embodiments of the present invention were used in emission layers and electron transport layers of organic light-emitting devices, all of the organic light-emitting devices showed improved driving voltages compared to known compounds and showed excellent I-V-L properties in which efficiency was substantially improved.

The compounds represented by Formula 1 are not limited to green color and red color emission materials, and may be used as hole transport layer materials, electron transport layer materials and/or doping materials in organic light-emitting devices because the compounds may have good hole injection and hole transport capabilities from metal electrodes or organic layers and good electron injection and electron transport capabilities from metal electrodes or organic layers. By using the compounds according to embodiments of the present invention, an organic light-emitting device having high quantum efficiency may be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. A compound represented by Formula 1:

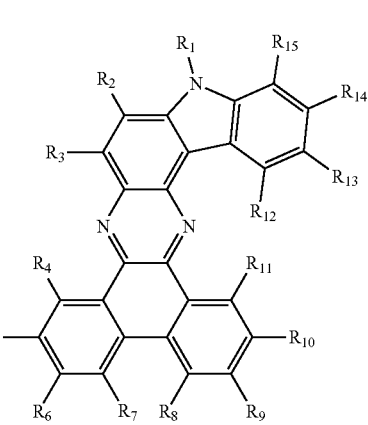

Formula 1 wherein Formula 1, $R_1$ to $R_{15}$ are each independently selected from a hydrogen atom, a deuterium atom, a substituted or unsubstituted C1-C60 alkyl group, a substituted or unsubstituted C2-C60 alkenyl group, a substituted or unsubstituted C2-C60 alkynyl group, a substituted or unsubstituted C3-C60 cycloalkyl group, a substituted or unsubstituted C1-C60 alkoxy group, a substituted or unsubstituted C6-C60 aryloxy group, a substituted or unsubstituted C6-C60 arylthio group, a substituted or unsubstituted C6-C60 aryl group, an amino group substituted with a C1-C60 heteroaryl group, a substituted or unsubstituted C1-C60 heteroaryl group, a substituted or unsubstituted C6-C60 condensed polycyclic group, a halogen atom, a cyano group, a nitro group, a hydroxy group, and a carboxy group.

2. The compound of claim 1, wherein $R_1$ is selected from the compounds represented by any one of Formulae 2a to 2c:

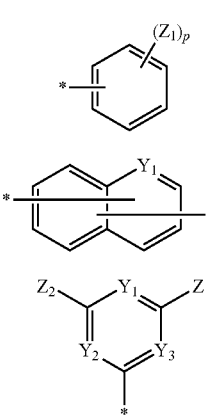

wherein in Formulae 2a to 2c,
$Y_1$, $Y_2$ and $Y_3$ are each independently selected from CH, $CR_{21}$, and N;
$R_{21}$, $Z_1$, and $Z_2$ are each independently selected from a hydrogen atom, a deuterium atom, a substituted or unsubstituted C1-C20 alkyl group, a substituted or unsubstituted C6-C20 aryl group, a substituted or unsubstituted C2-C20 heteroaryl group, a substituted or unsubstituted C6-C20 condensed polycyclic group, an amine group substituted with a C6-C20 aryl group or a C2-C20 heteroaryl group, a halogen group, a cyano group, a nitro group, a hydroxy group, and a carboxy group;

p is an integer from 1 to 6; and

* represents a binding site.

3. The compound of claim 1, wherein $R_6$ and $R_9$ are each independently a compound represented by Formula 3a:

3a wherein in Formula 3a, $Z_1$ and $Z_2$ are each independently selected from a substituted or unsubstituted C6-C20 aryl group, a substituted or unsubstituted C2-C20 heteroaryl group, and a substituted or unsubstituted C6-C20 condensed polycyclic group.

4. The compound of claim 1, wherein $R_{13}$ and $R_{14}$ are each independently selected from the compounds represented by any one of Formulae 4a to 4c:

4a

4b

4c wherein in Formulae 4a to 4c, $Y_1$ is CH or N;

$Z_1$ is selected from a hydrogen atom, a deuterium atom, a substituted or unsubstituted C1-C20 alkyl group, a substituted or unsubstituted C6-C20 aryl group, a substituted or unsubstituted C2-C20 heteroaryl group, and a substituted or unsubstituted C6-C20 condensed polycyclic group;

p is an integer from 1 to 6; and

* represents a binding site.

5. The compound of claim 1, wherein $R_2$ to $R_5$, $R_7$, $R_8$, $R_{10}$ to $R_{12}$, and $R_{15}$ are each independently a hydrogen atom or a deuterium atom.

6. The compound of claim 1, wherein the compound of Formula 1 is any one of following compounds:

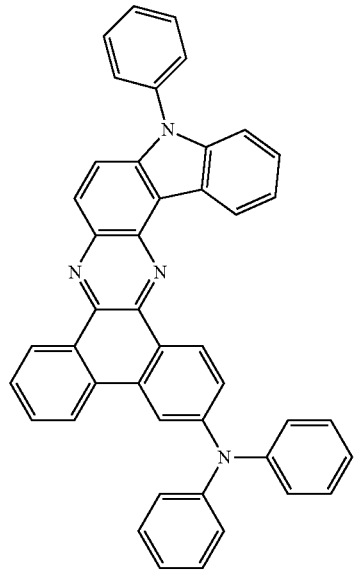

1

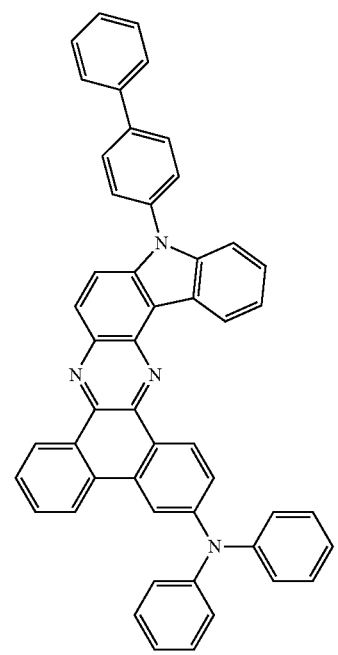

2

3
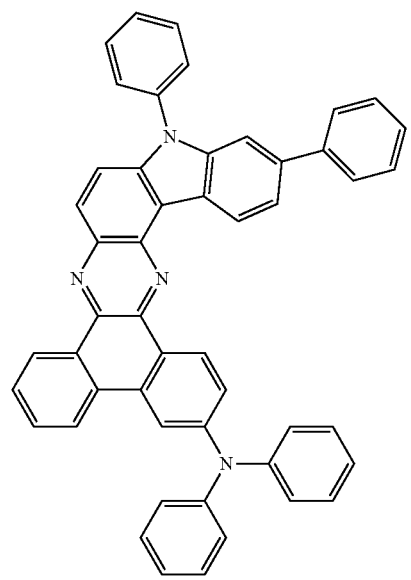
5
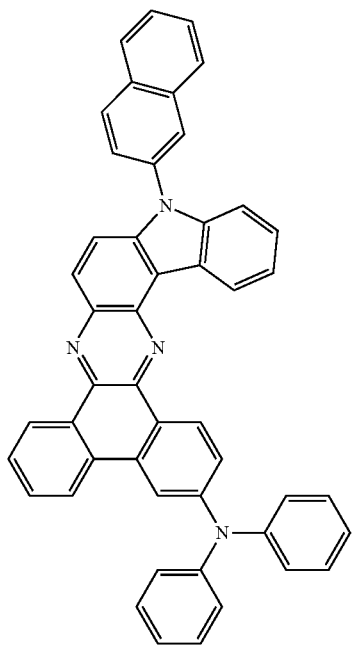
4
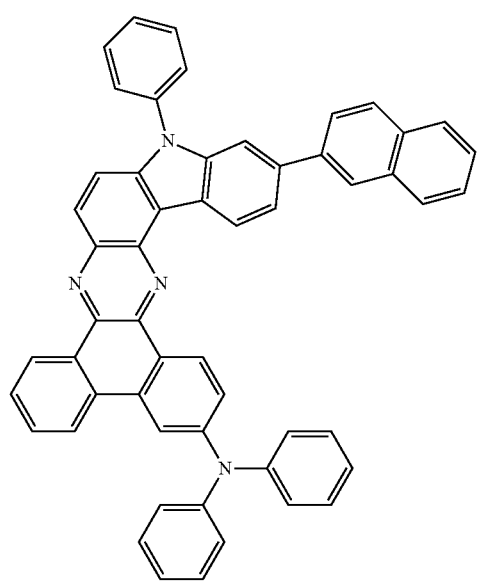
6
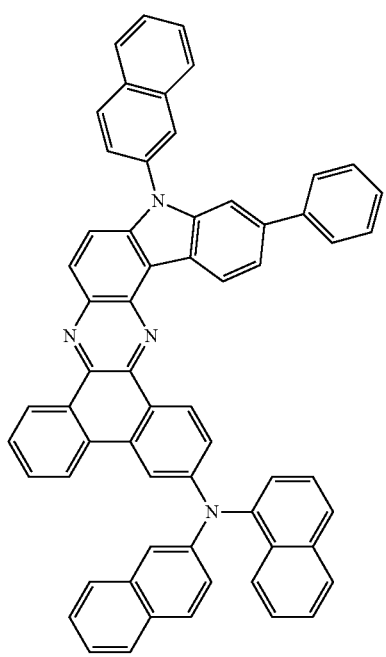

97
-continued
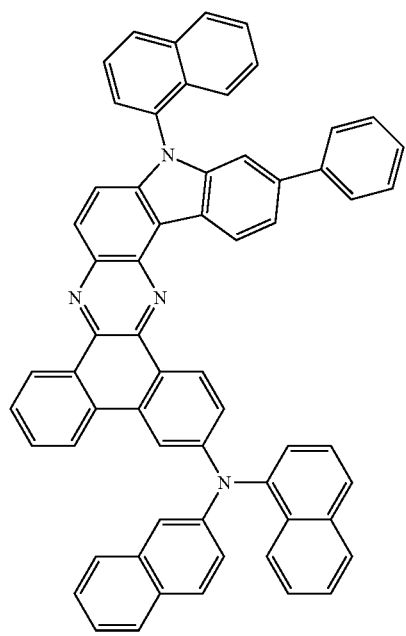
98
-continued
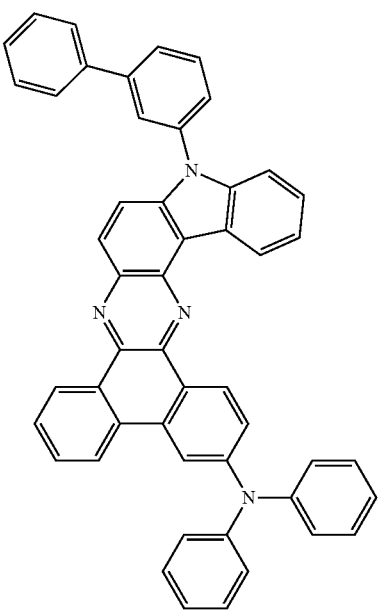
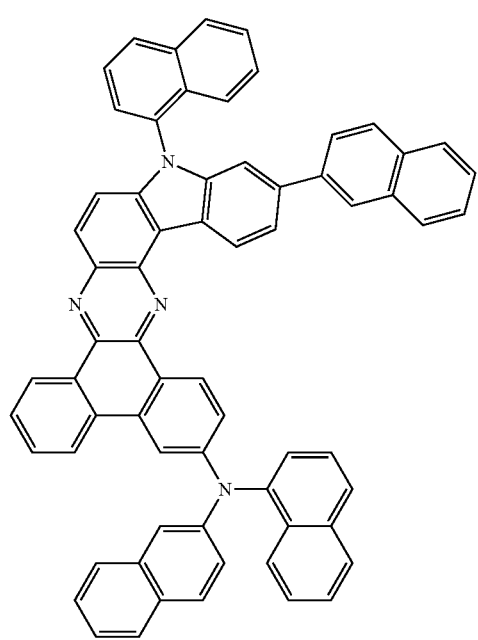
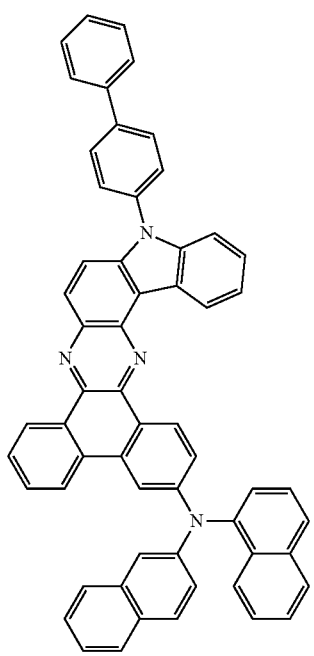

99
-continued
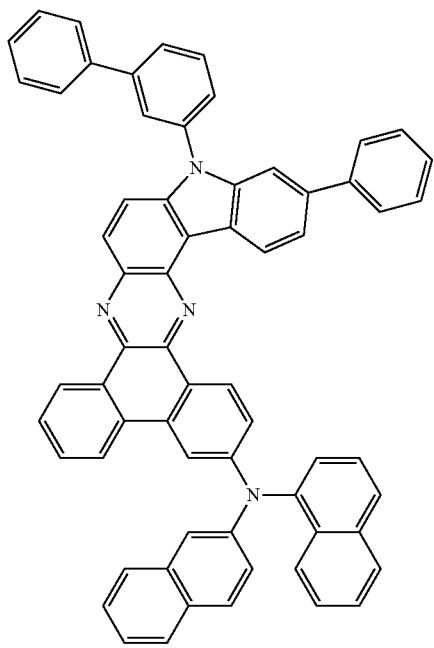
11
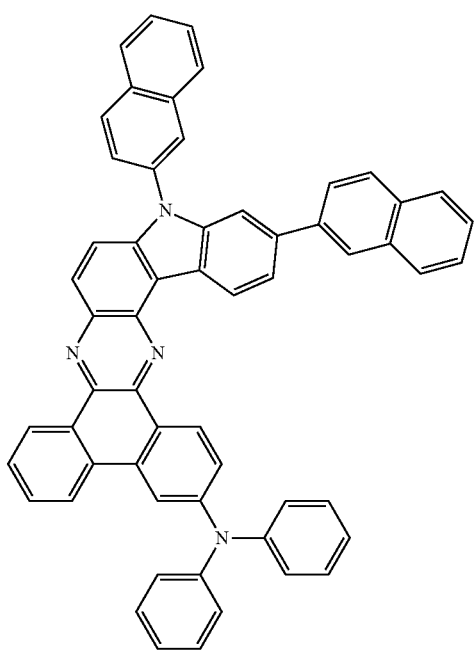
12
100
-continued
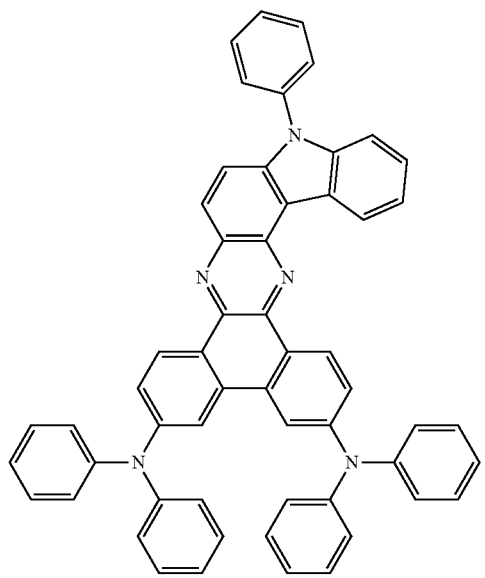
13
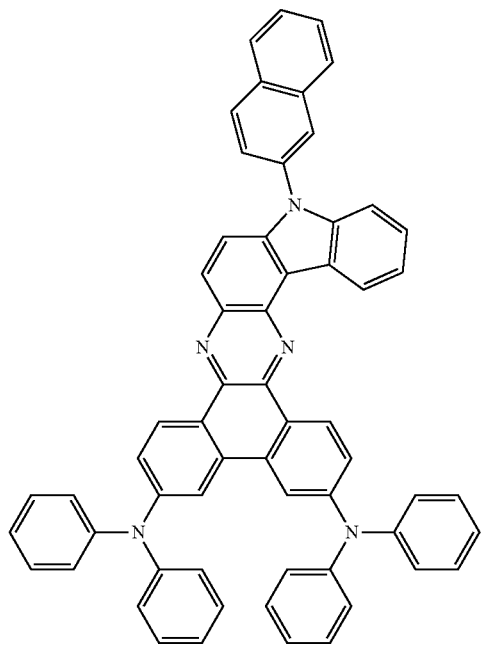
14

101
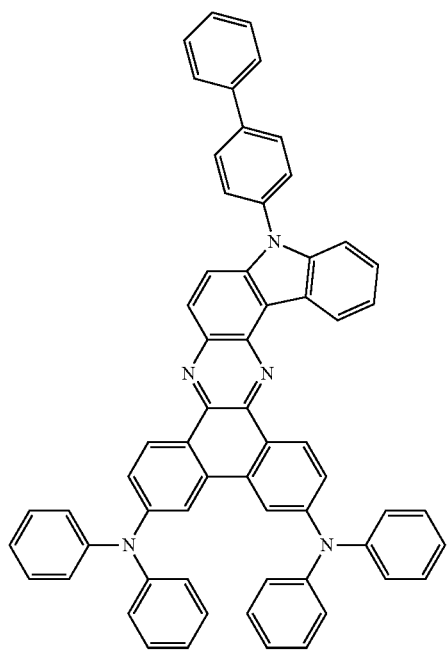
102
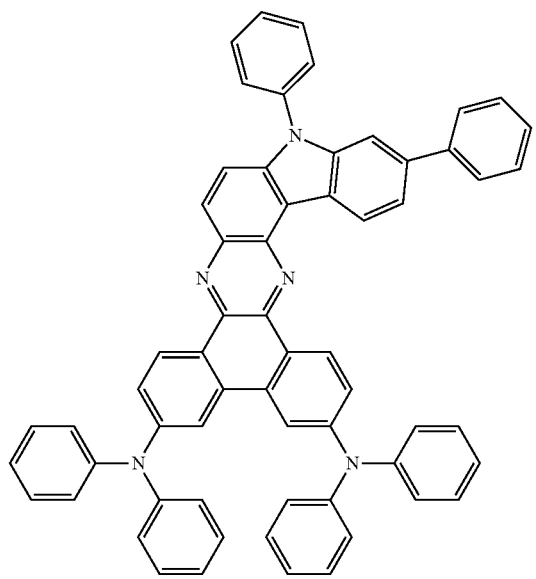
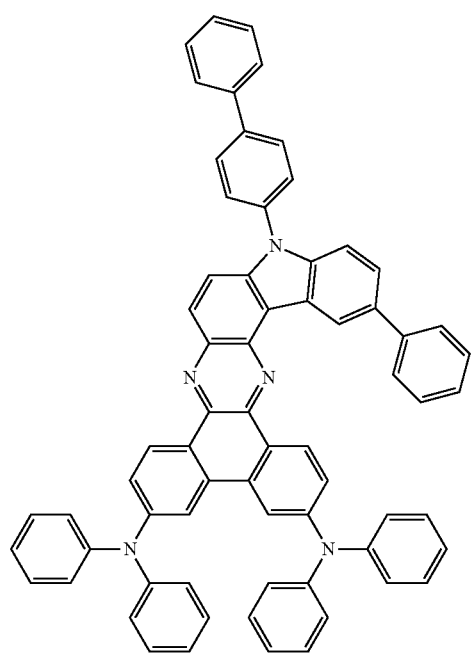
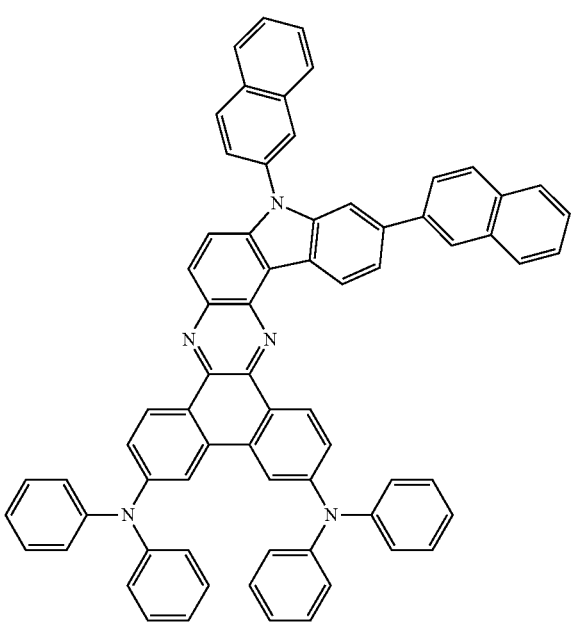

19
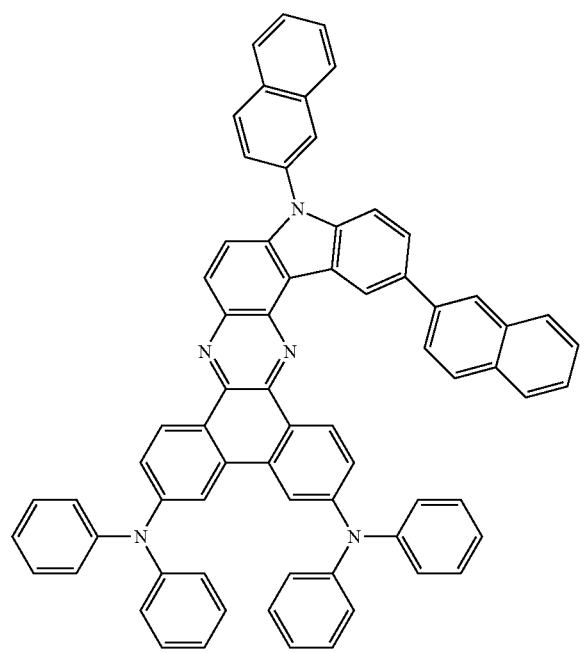
20
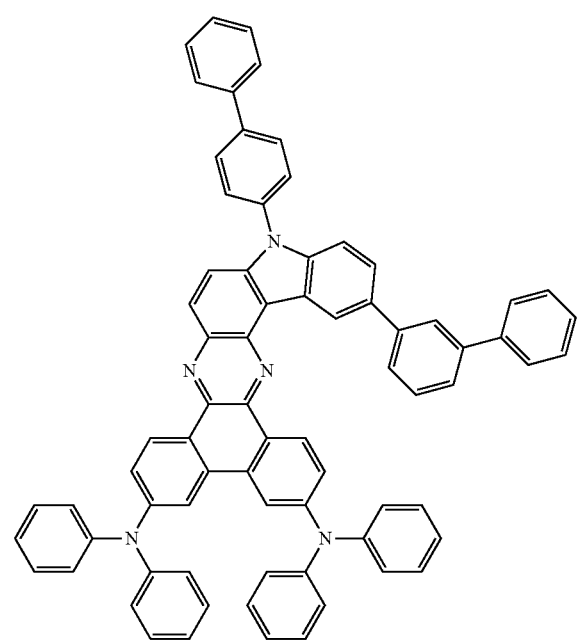
21
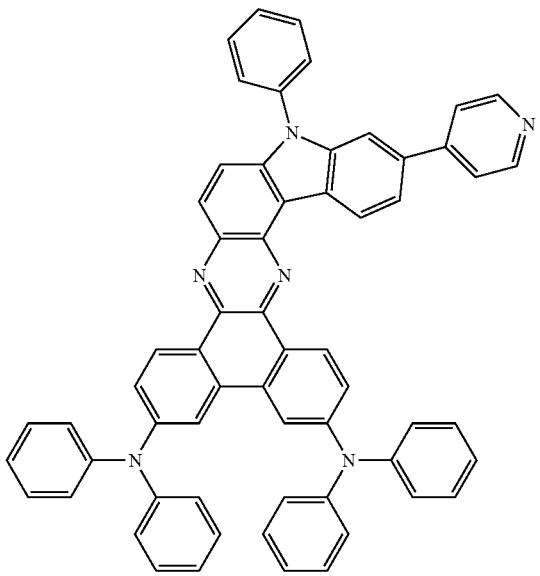
22
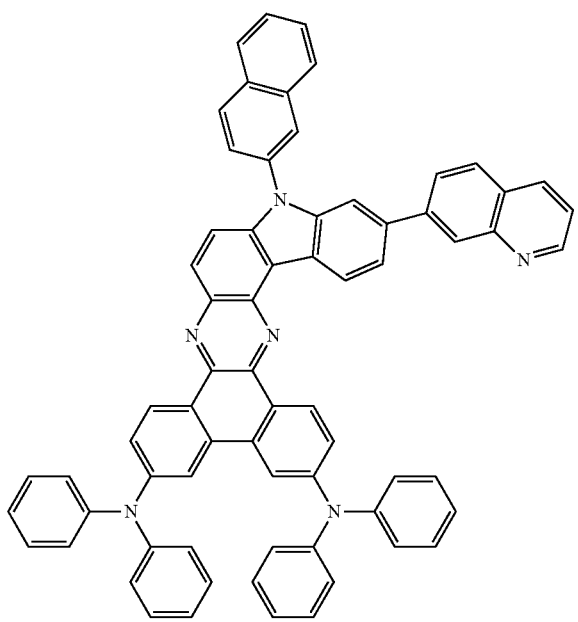

23
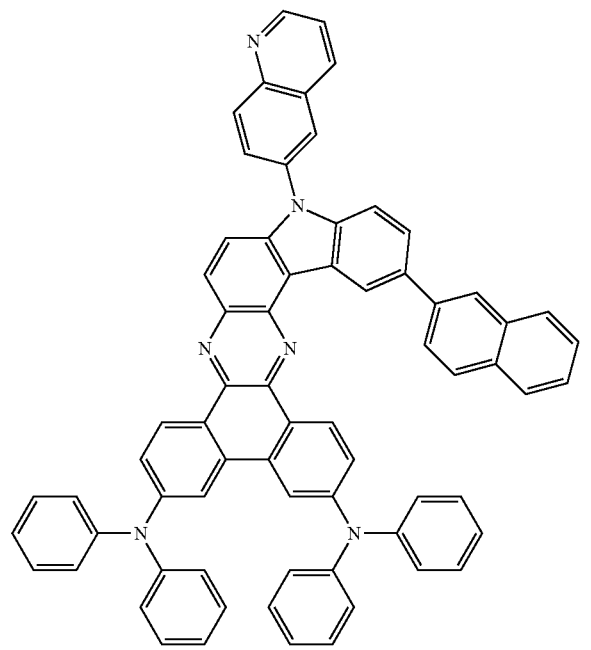
105
24
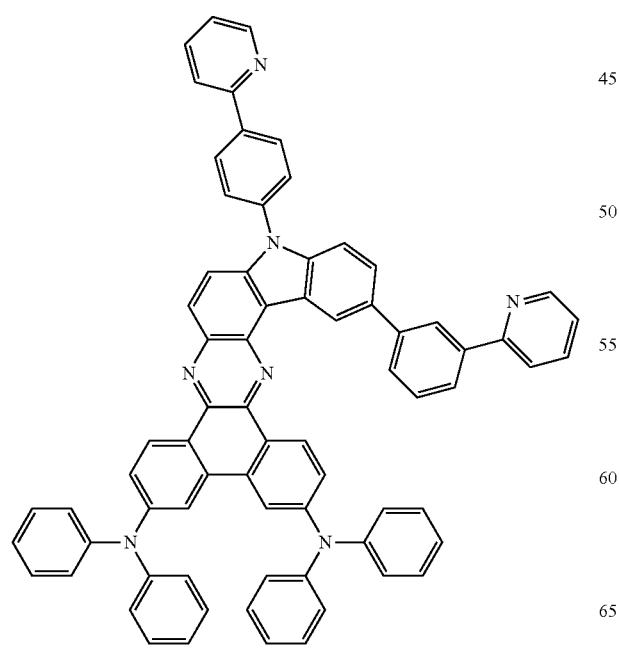
25
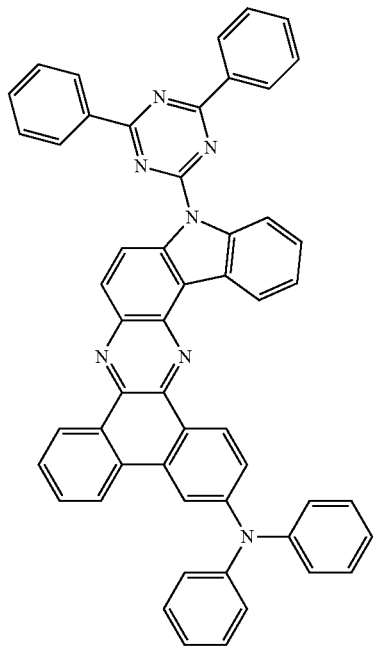
106
26
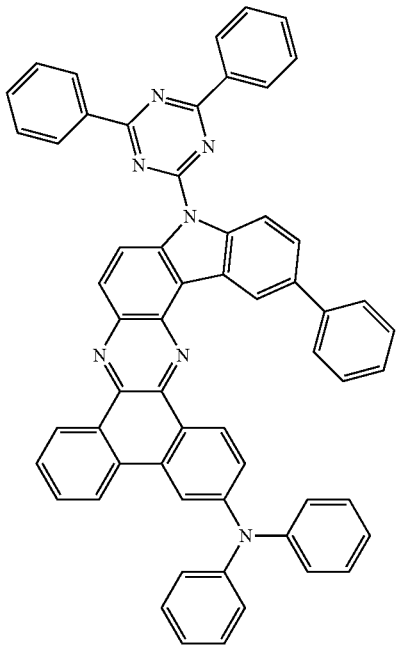

107
-continued
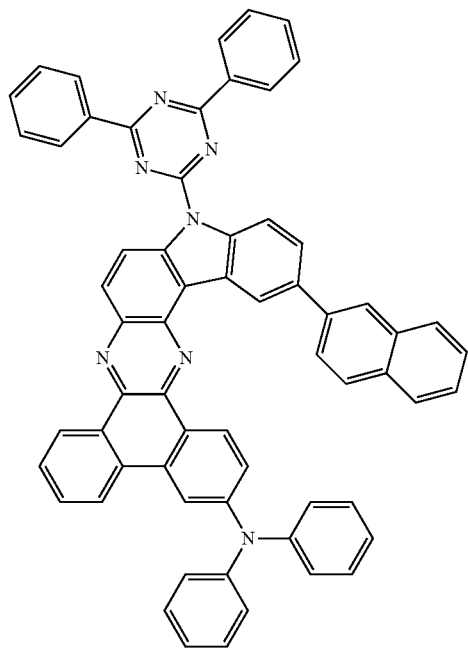
27
28
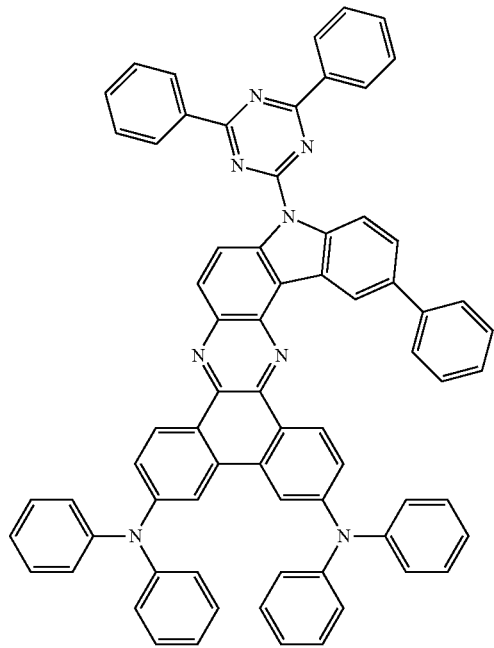
108
-continued
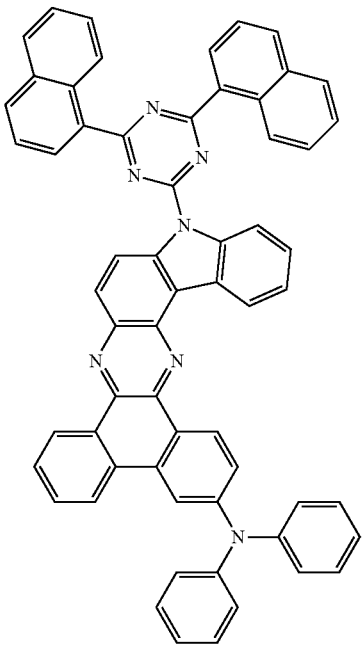
29
30
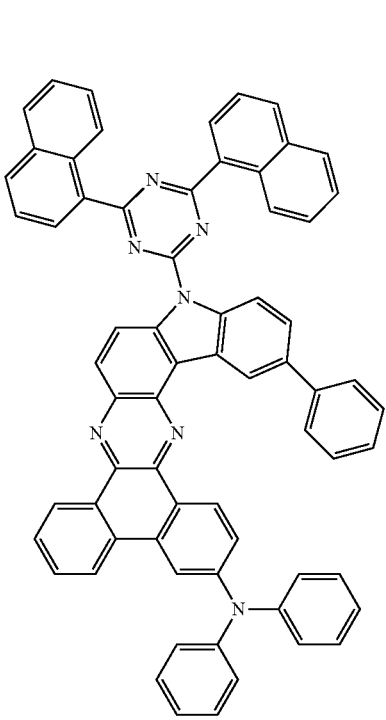

-continued
31
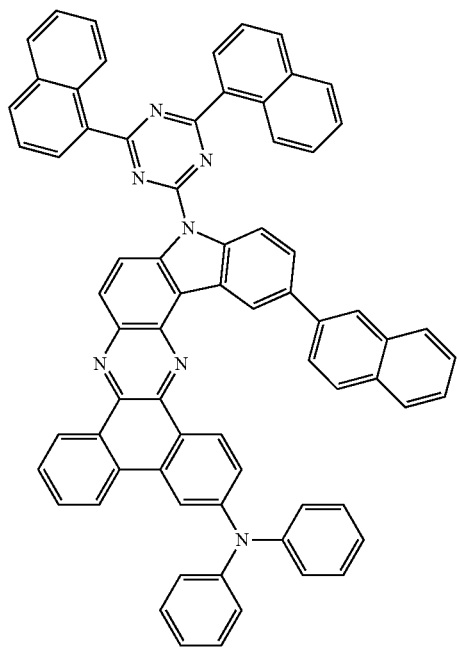
32
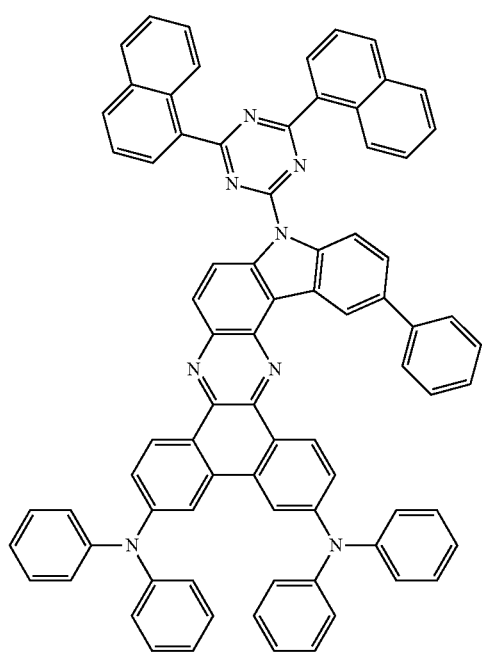
-continued
33
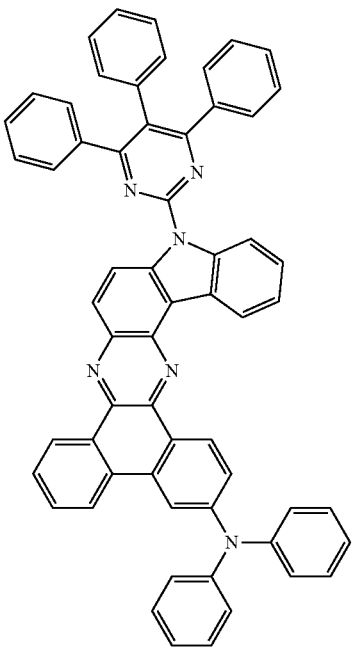
34
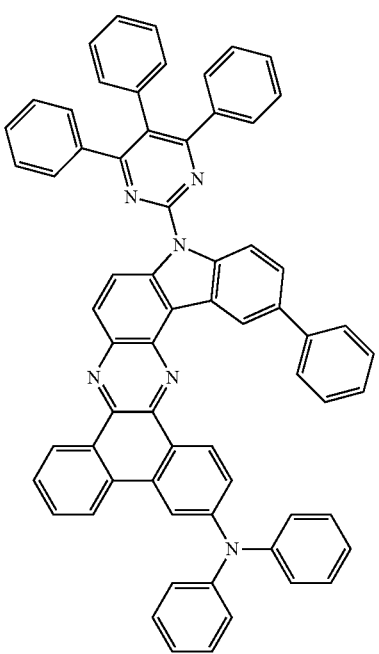

111
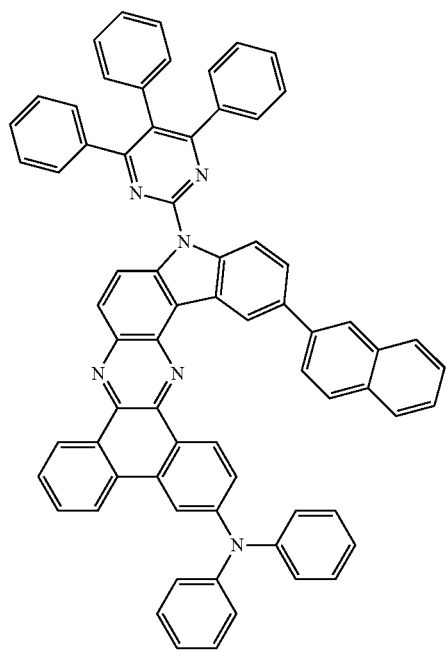
112
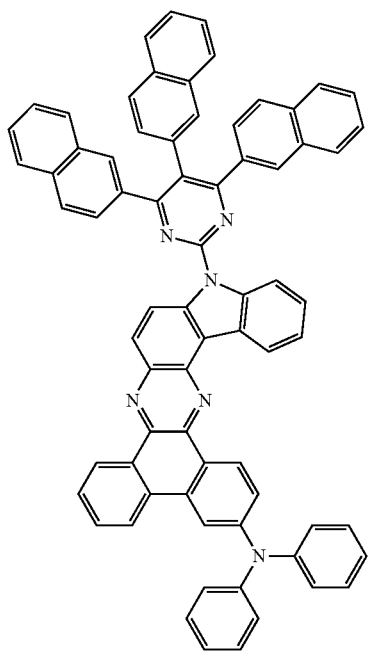
36
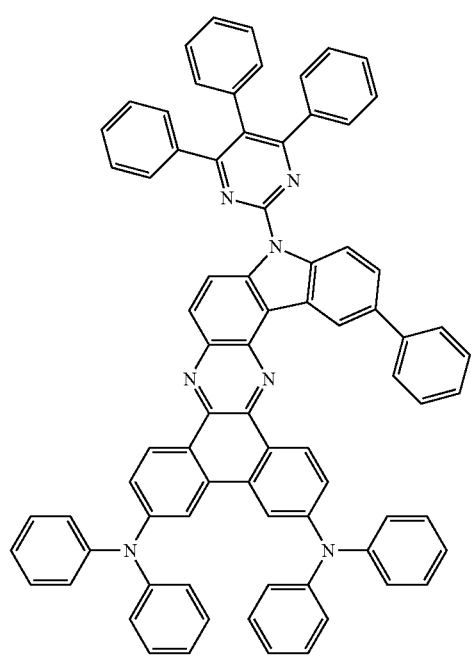
38
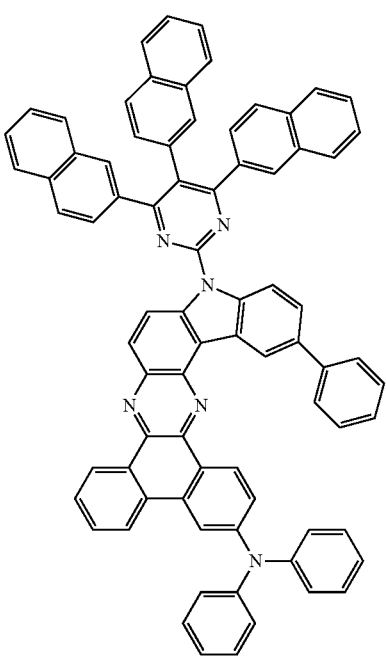

113
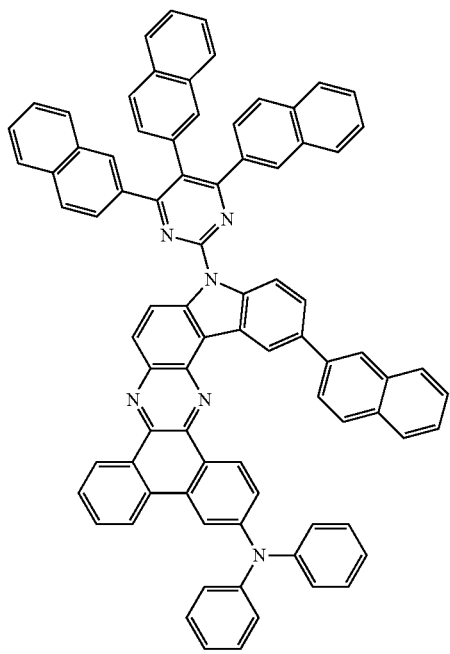
114
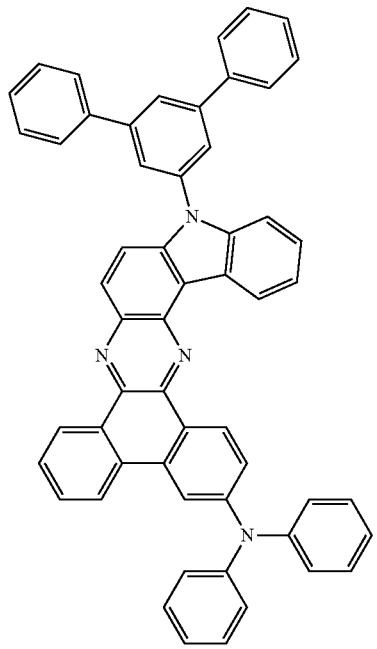
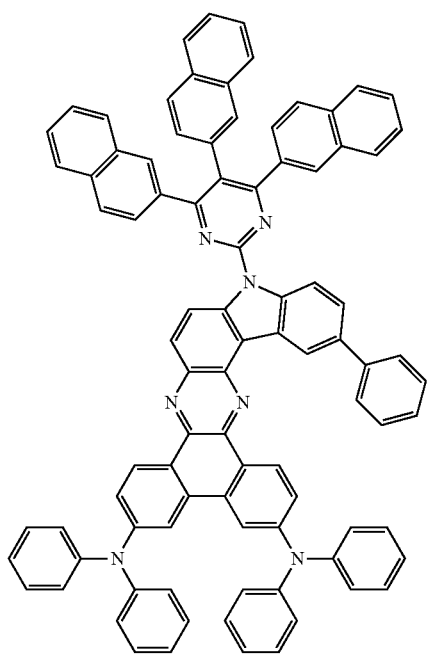
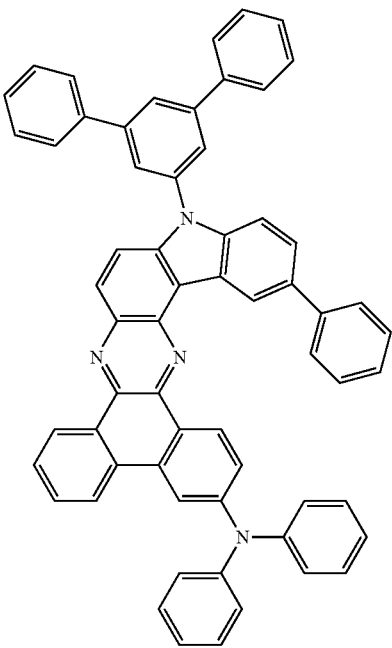

43
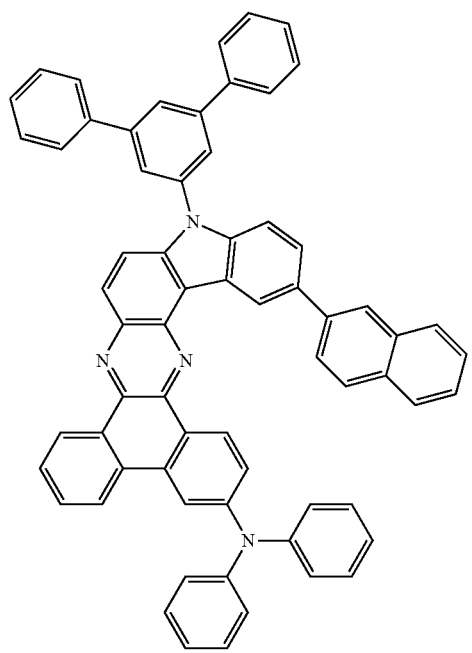
115
45
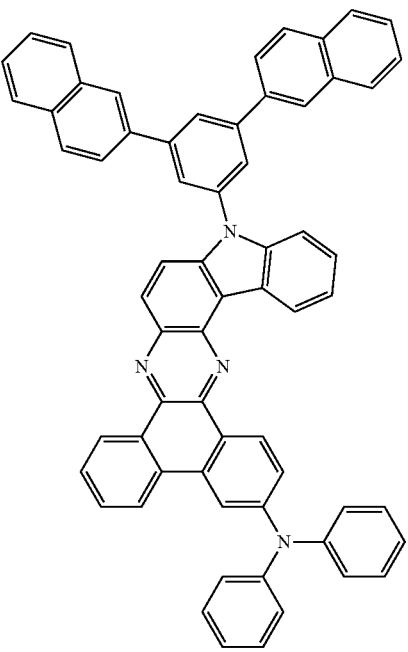
116
44
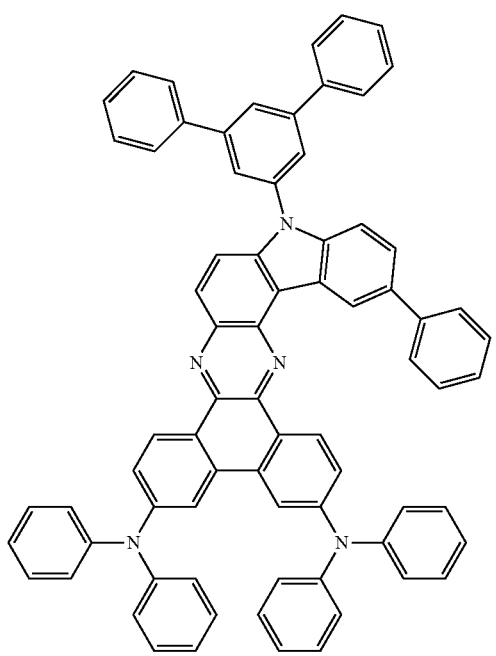
46
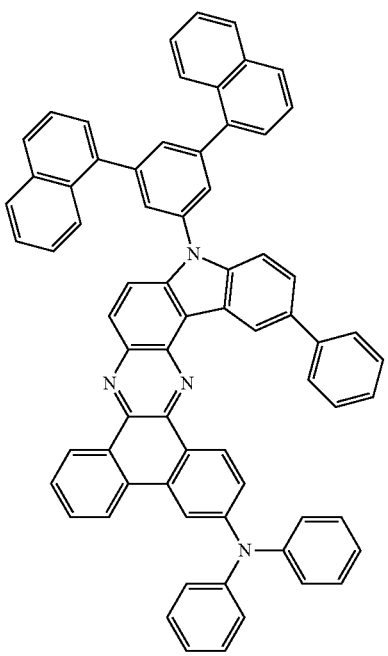

47
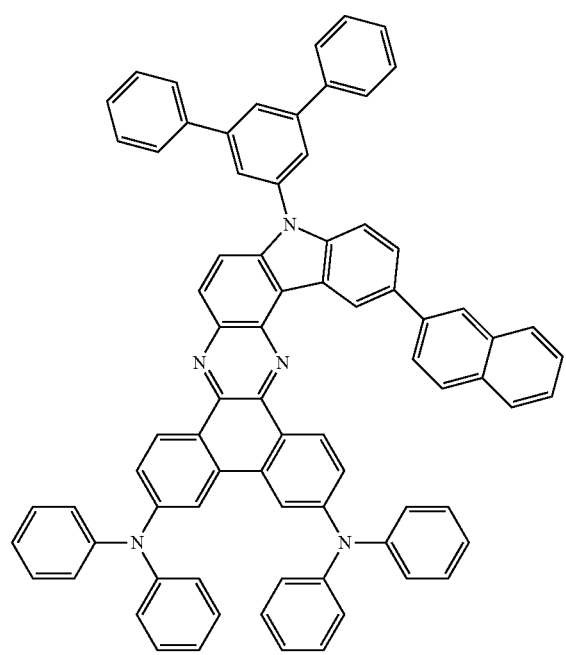
48
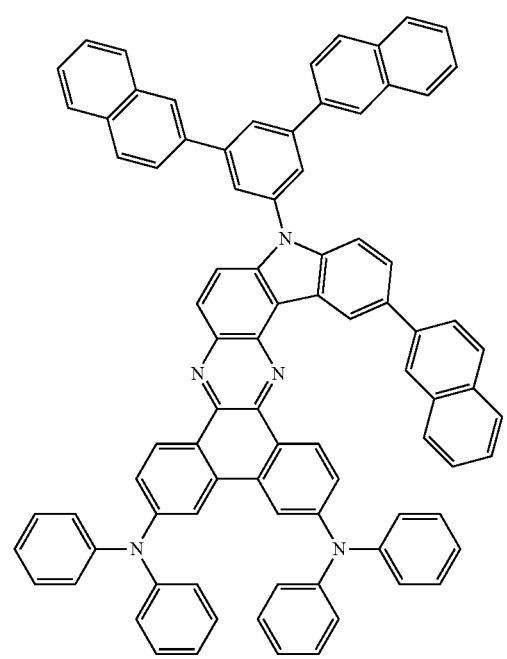
49
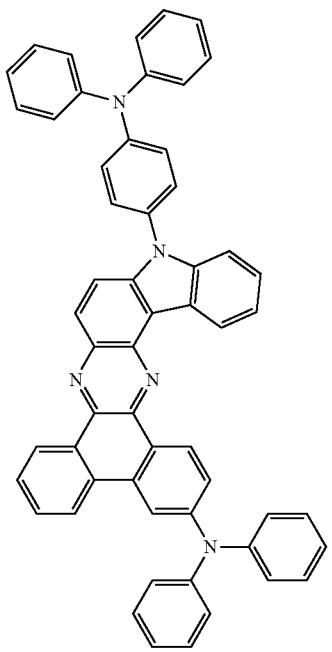
50
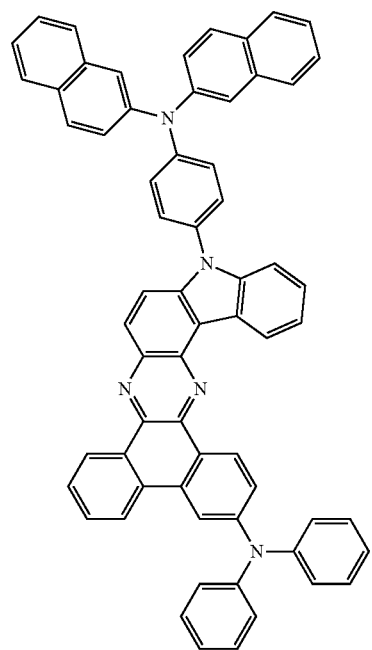

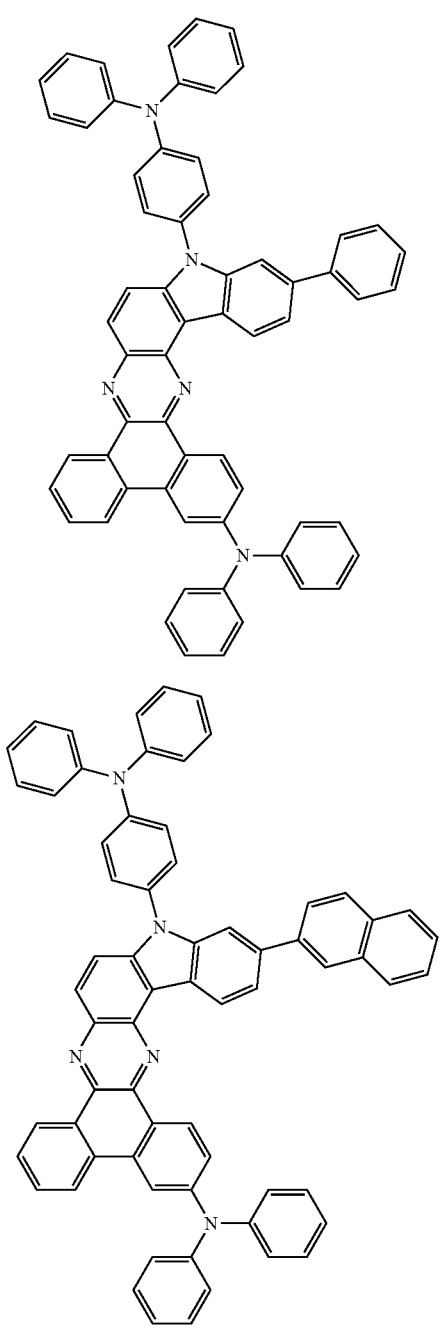

7. An organic light-emitting device comprising:
a first electrode;
a second electrode; and
an organic layer between the first electrode and the second electrode, the organic layer comprising the compound of claim 1.

8. The organic light-emitting device of claim 7, wherein the organic layer comprises at least one of a hole injection layer, a hole transport layer, a functional layer having both hole injection and hole transport capabilities, an emission layer, an electron injection layer, an electron transport layer, and a functional layer having both electron injection and electron transport capabilities.

9. The organic light-emitting device of claim 7, wherein the organic layer comprises at least one of an emission layer, a hole injection layer, a hole transport layer, and a functional layer having both hole injection and hole transport capabilities, and
any one layer of a red color layer, a green color layer, a blue color layer, and a white color layer of the emission layer comprises a phosphorescent compound.

10. The organic light-emitting device of claim 9, wherein at least one of the hole injection layer, the hole transport layer, and the functional layer having both hole injection and hole transport capabilities comprises a charge generating material.

11. The organic light-emitting device of claim 10, wherein the charge generating material is a p-dopant.

12. The organic light-emitting device of claim 11, wherein the p-dopant is a quinone derivative.

13. The organic light-emitting device of claim 11, wherein the p-dopant is a metal oxide.

14. The organic light-emitting device of claim 11, wherein the p-dopant is a cyano group containing compound.

15. The organic light-emitting device of claim 7, wherein the organic layer comprises an electron transport layer comprising the compound of Formula 1 and a metal complex.

16. The organic light-emitting device of claim 15, wherein the metal complex is a lithium complex.

17. The organic light-emitting device of claim 15, wherein the metal complex is a lithium quinolate (LiQ).

18. The organic light-emitting device of claim 15, wherein the metal complex is Compound 203:

Compound 203

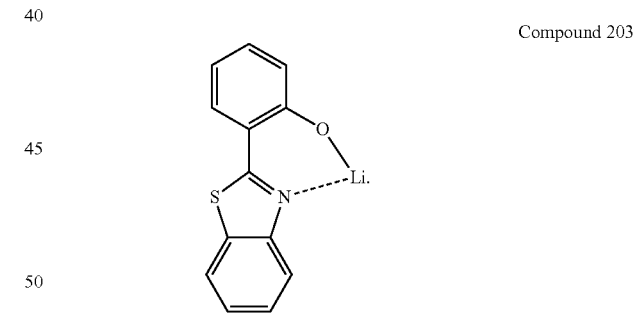

19. The organic light-emitting device of claim 7, the organic layer being formed by a wet method using the compound of Formula 1.

20. A flat display device comprising the organic light-emitting device of claim 7, a first electrode of the organic light-emitting device being electrically connected to a source electrode or a drain electrode of a thin film transistor.

* * * * *